US012666940B2

(12) United States Patent
Chen et al.

(10) Patent No.: US 12,666,940 B2
(45) Date of Patent: Jun. 23, 2026

(54) SEMICONDUCTOR STRUCTURE AND METHOD FOR FORMING THE SAME

(71) Applicant: Taiwan Semiconductor Manufacturing Company, Ltd., Hsin-Chu (TW)

(72) Inventors: Jui-Lin Chen, Taipei City (TW); Chao-Yuan Chang, New Taipei City (TW); Feng-Ming Chang, Hsinchu County (TW); Yung-Ting Chang, New Taipei City (TW); Ping-Wei Wang, Hsinchu (TW); Yi-Feng Ting, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 370 days.

(21) Appl. No.: 18/469,801

(22) Filed: Sep. 19, 2023

(65) Prior Publication Data

US 2024/0395665 A1 Nov. 28, 2024

Related U.S. Application Data

(60) Provisional application No. 63/504,585, filed on May 26, 2023.

(51) Int. Cl.
*H10W 20/20* (2026.01)
*H10D 30/01* (2025.01)
(Continued)

(52) U.S. Cl.
CPC .......... *H10W 20/20* (2026.01); *H10D 30/014* (2025.01); *H10D 30/43* (2025.01);
(Continued)

(58) Field of Classification Search
CPC . H10W 20/20; H10D 30/014; H10D 30/6735; H10D 30/6757; H10D 84/0186
See application file for complete search history.

(56) References Cited

U.S. PATENT DOCUMENTS 8,605,523 B2 12/2013 Tao et al.
8,630,132 B2 1/2014 Cheng et al.
(Continued)

FOREIGN PATENT DOCUMENTS

KR 20220020750 A 2/2022
KR 20230034172 A 3/2023
TW 202207406 A 2/2022

*Primary Examiner* — Steven M Page
(74) *Attorney, Agent, or Firm* — HAYNES AND BOONE, LLP

(57) ABSTRACT

A semiconductor structure is provided. The semiconductor structure includes a functional cell region including an n-type functional transistor and a p-type functional transistor. The semiconductor structure also includes a first power transmission cell region including a first cutting feature and a first contact rail in the first cutting feature. The semiconductor structure also includes a first power rail electrically connected to a source terminal of the p-type functional transistor and the first contact rail of the first power transmission cell region. The semiconductor structure also includes a second power transmission cell region adjacent to the first power transmission cell and including a second cutting feature and second contact rail in the second cutting feature. The semiconductor structure also includes an insulating strip extending from the first cutting feature to the second cutting feature in a first direction.

20 Claims, 69 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/85* | (2025.01) |

(52) U.S. Cl.
CPC ..... *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/85* (2025.01)

(56) References Cited

U.S. PATENT DOCUMENTS

| | | | |
|---|---|---|---|
| 8,760,948 | B2 | 6/2014 | Tao et al. |
| 10,515,688 | B2 | 12/2019 | Liaw |
| 11,031,073 | B2 | 6/2021 | Liaw |
| 11,043,595 | B2 | 6/2021 | Su et al. |
| 11,127,746 | B2 | 9/2021 | Chang et al. |
| 2014/0032871 | A1 | 1/2014 | Hsu et al. |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0233330 | A1 | 8/2014 | Ko et al. |
| 2014/0241077 | A1 | 8/2014 | Katoch et al. |
| 2014/0269114 | A1 | 9/2014 | Yang et al. |
| 2021/0098338 | A1* | 4/2021 | Liaw ................. H10D 84/0193 |

* cited by examiner

50A

140

139
138
108
108
108

110
103
102

NW

Y2    Y2

158
154
152
146
144
139
138
108
108
108
110
103
102

160A

140

NW

Y2

Y2

50A

50A

SEMICONDUCTOR STRUCTURE AND METHOD FOR FORMING THE SAME

PRIORITY CLAIM

This application claims the benefit of U.S. Provisional Application No. 63/504,585, filed on May 26, 2023 and entitled "SEMICONDUCTOR STRUCTURE AND METHOD FOR FORMING THE SAME," which is incorporated herein by reference.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1, 1B-1, 1M-1 and 1M-2 are perspective view illustrating the formation of a semiconductor structure at various the intermediate stages, in accordance with some embodiments of the disclosure.

FIGS. 1A-2, 1A-3, 1A-4 and 1A-5 are cross-sectional views of the semiconductor structure corresponding to line Y1-Y1, line X1-X1, line X2-X2 and line Y2-Y2 of FIG. 1A, in accordance with some embodiments of the disclosure.

FIGS. 1B-2, 1B-3, 1B-4 and 1B-5 are cross-sectional views of the semiconductor structure corresponding to line Y1-Y1, line X1-X1, line X2-X2 and line Y2-Y2 of FIG. 1B, in accordance with some embodiments of the disclosure.

FIGS. 1C-1, 1C-2, 1C-3 and 1C-4 are cross-sectional views of the semiconductor structure corresponding to line Y1-Y1, line X1-X1, line X2-X2 and line Y2-Y2 of FIG. 1C, in accordance with some embodiments of the disclosure.

FIGS. 1D-1, 1D-2, 1D-3 and 1D-4 are cross-sectional views of the semiconductor structure corresponding to line Y1-Y1, line X1-X1, line X2-X2 and line Y2-Y2 of FIG. 1D, in accordance with some embodiments of the disclosure.

FIGS. 1E-1 and 1E-2 are cross-sectional views of the semiconductor structure corresponding to line Y1-Y1 and line X1-X1 of FIG. 1E, in accordance with some embodiments of the disclosure.

FIGS. 1F-1, 1F-2, 1F-3 and 1F-4 are cross-sectional views of the semiconductor structure corresponding to line Y1-Y1, line X1-X1, line X2-X2 and line Y2-Y2 of FIG. 1F, in accordance with some embodiments of the disclosure.

FIGS. 1G-1, 1G-2, 1G-3 and 1G-4 are cross-sectional views of the semiconductor structure corresponding to line Y1-Y1, line X1-X1, line X2-X2 and line Y2-Y2 of FIG. 1G, in accordance with some embodiments of the disclosure.

FIGS. 1H-1 and 1H-2 are cross-sectional views of the semiconductor structure corresponding to line Y1-Y1 and line X1-X1 of FIG. 1G, in accordance with some embodiments of the disclosure.

FIGS. 1I-1, 1I-2, 1I-3 and 1I-4 are cross-sectional views of the semiconductor structure corresponding to line Y1-Y1, line X1-X1, line X2-X2, and Y2-Y2 of FIG. 1G, in accordance with some embodiments of the disclosure.

FIGS. 1J-1, 1J-2, 1J-3 and 1J-4 are cross-sectional views of the semiconductor structure corresponding to line Y1-Y1, line X1-X1, line X2-X2 and line Y2-Y2 of FIG. 1G, in accordance with some embodiments of the disclosure.

FIGS. 1K-1 and 1K-2 are cross-sectional views of the semiconductor structure corresponding to line Y1-Y1 and line X1-X1 of FIG. 1K, in accordance with some embodiments of the disclosure.

FIGS. 1L-1, 1L-2, 1L-3 and 1L-4 are cross-sectional views of the semiconductor structure corresponding to line Y1-Y1, line X1-X1, line X2-X2 and line Y2-Y2 of FIG. 1L, in accordance with some embodiments of the disclosure.

FIGS. 1M-3, 1M-4, 1M-5 and 1M-6 are cross-sectional views of the semiconductor structure corresponding to line Y1-Y1, line X1-X1, line X2-X2 and line Y2-Y2 of FIG. 1M, in accordance with some embodiments of the disclosure.

FIG. 2 is a plan view (layout) of a semiconductor structure, in accordance with some embodiments of the disclosure.

FIG. 2-1 is a cross-sectional view of the semiconductor structure of FIG. 2, in accordance with some embodiments of the disclosure.

FIG. 3 is a plan view (layout) of a semiconductor structure, in accordance with some embodiments of the disclosure.

FIG. 3-1 is a cross-sectional view of the semiconductor structure of FIG. 3, in accordance with some embodiments of the disclosure.

FIG. 4 is a plan view (layout) of a semiconductor structure, in accordance with some embodiments of the disclosure.

FIG. 4-1 is a cross-sectional view of the semiconductor structure of FIG. 4, in accordance with some embodiments of the disclosure.

FIG. 5 is a plan view (layout) of a semiconductor structure, in accordance with some embodiments of the disclosure.

FIG. 6 is a plan view (layout) of a semiconductor structure, in accordance with some embodiments of the disclosure.

FIG. 6-1 is a cross-sectional view of the semiconductor structure of FIG. 6, in accordance with some embodiments of the disclosure.

FIG. 7-1 is a cross-sectional view of the semiconductor structure of FIG. 7, in accordance with some embodiments of the disclosure.

DETAILED DESCRIPTION

Figure 1A:
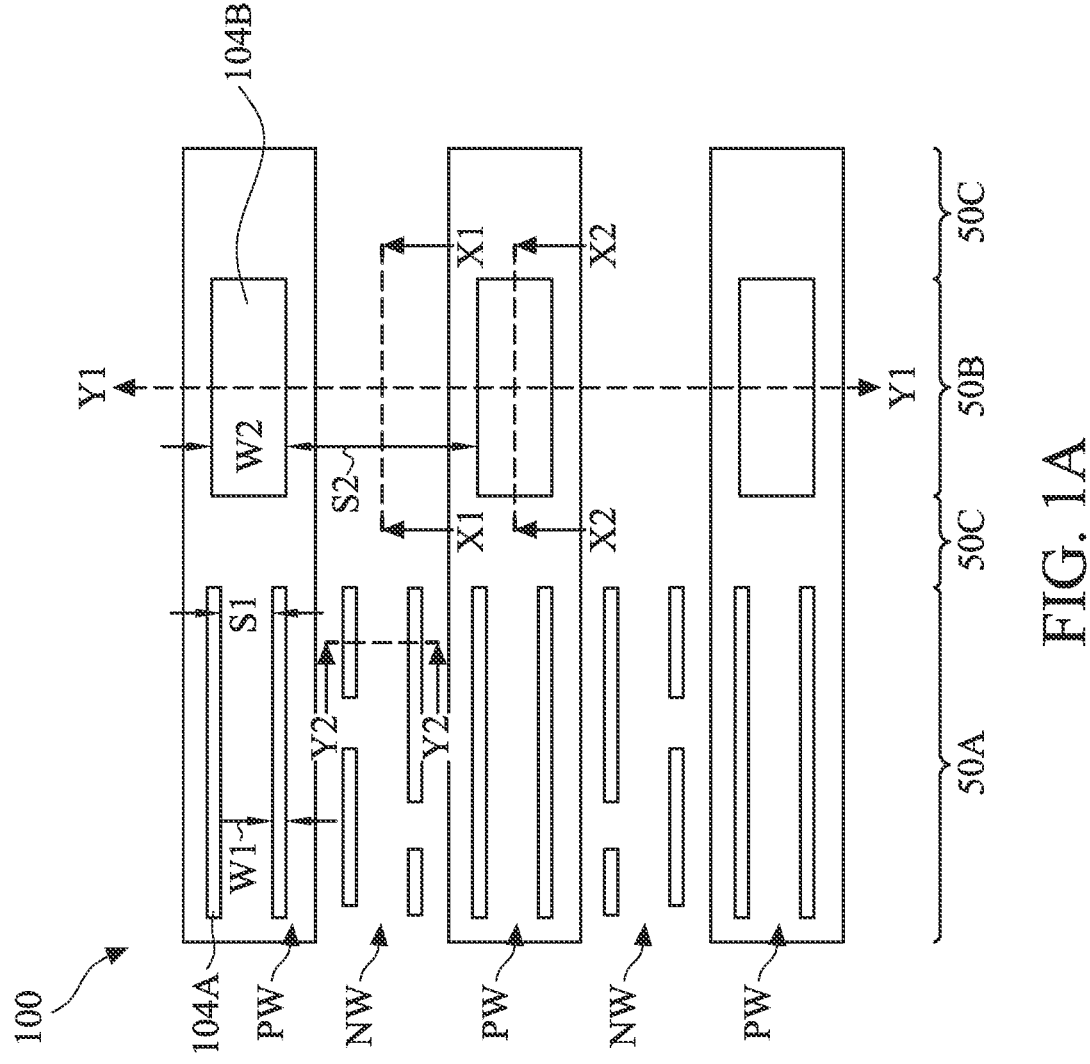
FIGS. 1A, 1B, 1C, 1D, 1E, IF, 1G, 1K, 1L and 1M are plan views (layout) illustrating the formation of a semiconductor structure at various intermediate stages, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned using any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The aspect of the present disclosure is directed to a semiconductor structure with a backside power rail architecture. Backside power rail architecture may reduce the overall resistance of the BEOL (backend of lines) metal layers, and/or the complexity of the metal routing on the frontside of the substrate may be reduced, which may facilitate the continued scaling of semiconductor devices. In the embodiments of the present disclosure, the semiconductor structure may include power transmission cell regions. Each of the power transmission cell regions includes a contact rail electrically connected to a frontside power rail and a via rail electrically connected to a backside power rail, thereby transferring the power from backside metal layer to the frontside metal layer.

In accordance with some embodiments of the present disclosure, the semiconductor structure includes insulating strips between the power transmission cell regions. Dummy gate structures originally extending between the power transmission cell regions are replaced with the insulating strips, thereby reducing the risk of leakage between the power transmission cell regions. Therefore, the reliability and the manufacturing yield of the resulting semiconductor device may improve.

Figures 1, 1A:
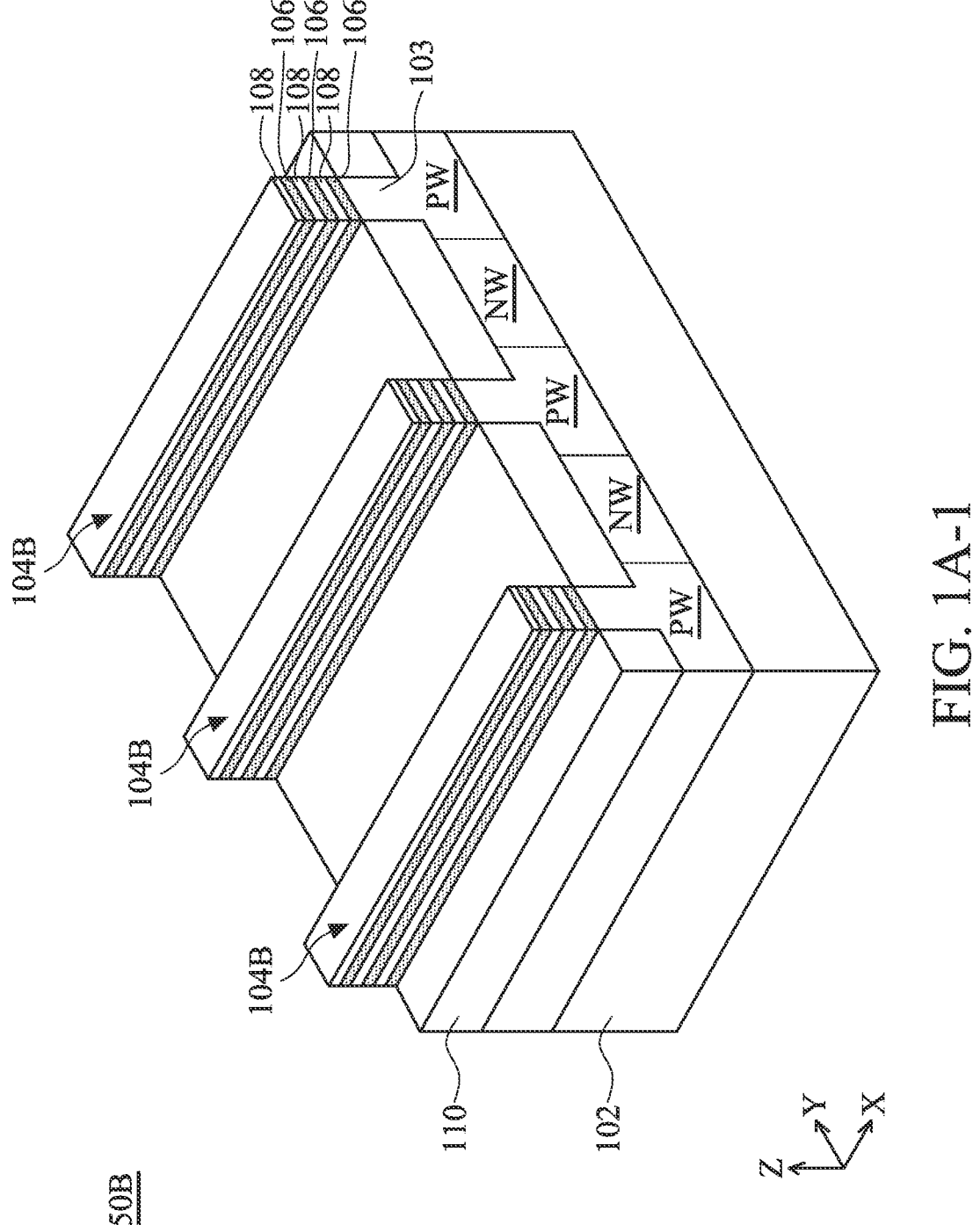

FIGS. 1A through 1M-6 are schematic views illustrating the formation of a semiconductor structure 100 at various intermediate stages, in accordance with some embodiments of the disclosure. FIG. 1A is a plan view (frontside layout) of a semiconductor structure 100 illustrating the formation of active regions 104 (including 104A and 104B) and an isolation structure 110. FIG. 1A-1 is a perspective view of the semiconductor structure 100 in an area 50B. FIGS. 1A-2, 1A-3, 1A-4 and 1A-5 are cross-sectional views corresponding to line Y1-Y1, line X1-X1, line X2-X2 and line Y2-Y2 of FIG. 1A.

Figures 1, 1A, 2, 3:
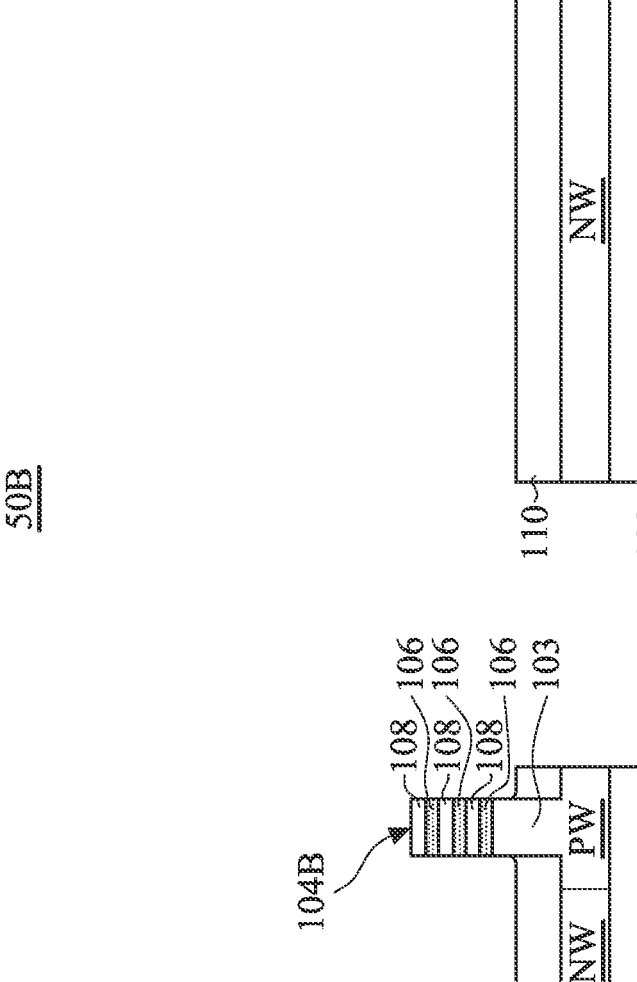
Figures 1, 1A, 2, 3, 4, 5:
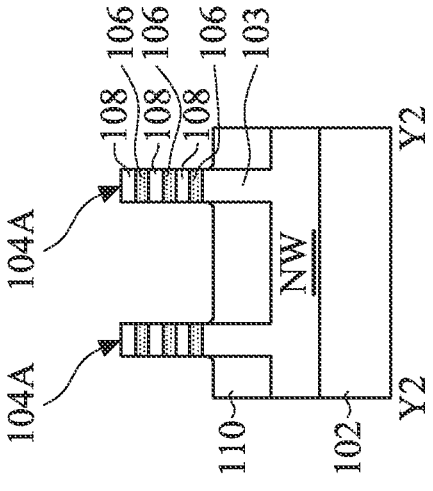
Figures 1, 1A, 2, 3, 4:
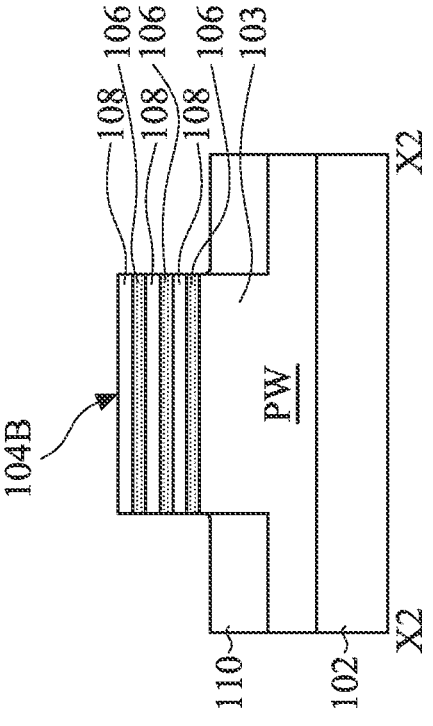

The semiconductor structure 100 includes a substrate 102 and a plurality of active regions 104 (e.g., including 104A and 104B) over the substrate 102, as shown in FIGS. 1A to 1A-5, in accordance with some embodiments. The frontside of the semiconductor structure 100 faces upward, in accordance with some embodiments. For a better understanding of the semiconductor structure 100, the X-Y-Z coordinate reference is provided in the figures of the present disclosure. The X-axis and Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

In some embodiments, the semiconductor structure 100 is used to form high-density devices. Some areas of the substrate 102 are defined as a first area 50A for forming functional cell regions therein and a second area 50B for forming power transmission cell regions therein, in accordance with some embodiments. The functional cell regions in the first area 50A may be memory cell regions (e.g., SRAM cell regions) or logic cell regions (e.g., NOR, AND, OR, Flip-Flop, and/or SCAN cell regions), in accordance with some embodiments. Each of the functional cell regions may include functional circuit which is formed of a plurality of functional transistors interconnected with each other.

The power transmission cell regions in the second area 50B are configured to transfer the power from backside metal layers of the semiconductor structure 100 to frontside metal layers of the semiconductor structure 100, in accordance with some embodiments. Each of the power transmission cell regions includes an electrical connection structure connecting between a frontside metal layer and a backside metal layer, and does not have a functional transistor therein. The formation of the functional cell regions and the power transmission cell regions will be discussed in detail below.

Although one first area 50A for forming functional cell regions is shown on one side (left side) of the second area 50B for forming power transmission cell regions, another first area 50A may be defined on the other side (right side) of the second area 50B. Third areas 50C are defined between the first areas 50A and the second area 50B, in accordance with some embodiments. The third area 50C is used as an isolation zone between the first area 50A and the second area 50B, in accordance with some embodiments.

The active regions 104A are formed in the first area 50A, and the active regions 104B are formed in the second area 50B, in accordance with some embodiments. The active regions 104A and 104B extend in the X direction, in accordance with some embodiments. That is, the active regions 104 have longitudinal axes parallel to the X direction, in accordance with some embodiments. In some embodiments, the active regions 104A and 104B are also referred to as semiconductor fins or semiconductor fin structures. In some embodiments, the width W1 of the active regions 104A is less than the width W2 of the active regions 104B. In some embodiments, the ratio of the width W1 to the width W2 is in a range from about 0.1 to about 0.5. In some embodiments, the edges (sidewalls) of the active regions 104A are substantially aligned with the edges (sidewalls) of the active regions 104B. In some embodiments, the spacing S1 between two adjacent active regions 104A is less than the spacing S2 between two adjacent active regions 104B.

Each of the active regions 104A and 104B are defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same. The X direction may also be referred to as the channel-extending direction. The current of the resulting semiconductor device (i.e., nanostructure transistor) flows in the X direction through the channel. Gate structures or gate stacks will be formed with longitudinal axes parallel to the Y direction and extend over the channel regions of the active regions 104. The Y direction may also be referred to as a gate-extending direction.

N-type dopants (such as phosphorus or arsenic) are implanted into the substrate 102, thereby forming n-type wells NW, in accordance with some embodiments. P-type dopants (such as boron or $BF_2$) are implanted into the substrate 102, thereby forming p-type wells PW, in accordance with some embodiments. The n-type wells NW and the p-type wells PW are alternately arranged in the Y direction, in accordance with some embodiments. Two active regions 104A are located in a well NW or PW in the area 50A, in accordance with some embodiments. One active region 104B is located in a p-type well PW in the area 50B, and there is no active region 104B in the n-type well NW in the area 50B, in accordance with some embodiments.

In some embodiments, the respective concentrations of the dopants in the n-type wells and p-type wells are in a range from about $10^{16}/cm^3$ to about $10^{18}/cm^3$. In some embodiments, the ion implantation processes may be performed several times with different dosages and different energy intensities. In some embodiments, the ion implantation process may include anti-punch through (APT) implant.

The formation of the active regions 104 includes forming an epitaxial stack over the substrate 102 using an epitaxial growth process, in accordance with some embodiments. The epitaxial stack may be formed by depositing a first semiconductor layer 106 on the substrate 102, depositing a second semiconductor layers 108 on the first semiconductor layer 106, repeating the cycle of depositing the semiconductor layers 106 and 108 for several times. The first semiconductor layers 106 and the second semiconductor layers 108 are alternately stacked vertically, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel for the resulting semiconductor device (such as nanostructure transistors), in accordance with some embodiments. Although three first semiconductor layers 106 and three second semiconductor layers 108 are shown, the number is not limited to three, and can be two or four, and is less than ten.

The formation of the active regions 104 further includes forming a patterned mask layer (not shown) over the epitaxial stack, and then etching the epitaxial stack and underlying wells NW and PW using the patterned mask layer, thereby forming trenches and the active regions 104 protruding from between trenches, in accordance with some embodiments. Portions of the wells NW and PW protruding from between the trenches serves as lower fin elements 103 of the active regions 104A and 104B, in accordance with some embodiments. A remainder of the epitaxial stack (including the first semiconductor layers 106 and the second semiconductor layers 108) serves as upper fin elements of the active regions 104A and 104B, in accordance with some embodiments.

An isolation structure 110 is formed to surround the lower fin elements 103 of the active regions 104A and 104B, in accordance with some embodiments. The isolation structure 110 is configured to electrically isolate the active regions 104 from each other and is also referred to as shallow trench isolation (STI) feature, in accordance with some embodiments. The formation of the isolation structure 110 includes forming an insulating material to overfill the trenches, in accordance with some embodiments. In some embodiments, the insulating material is made of silicon oxide ($SiO_2$), silicon nitride (SiN), silicon oxynitride (SiON), silicon carbide (SIC), oxygen-doped silicon carbide (SiC:O), oxygen-doped silicon carbonitride (Si(O)CN), or a combination thereof.

In some embodiments, the insulating material is deposited using CVD (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, or a combination thereof. A planarization process is performed on the insulating material to remove a portion of the insulating material above the active regions 104, in accordance with some embodiments. The planarization may be chemical mechanical polishing (CMP), an etching back process, or a combination thereof. The insulating material is then recessed by an etching process (such as dry plasma etching and/or wet chemical etching) until the upper fin elements of the active regions 104 are exposed, in accordance with some embodiments.

Figure 1B:
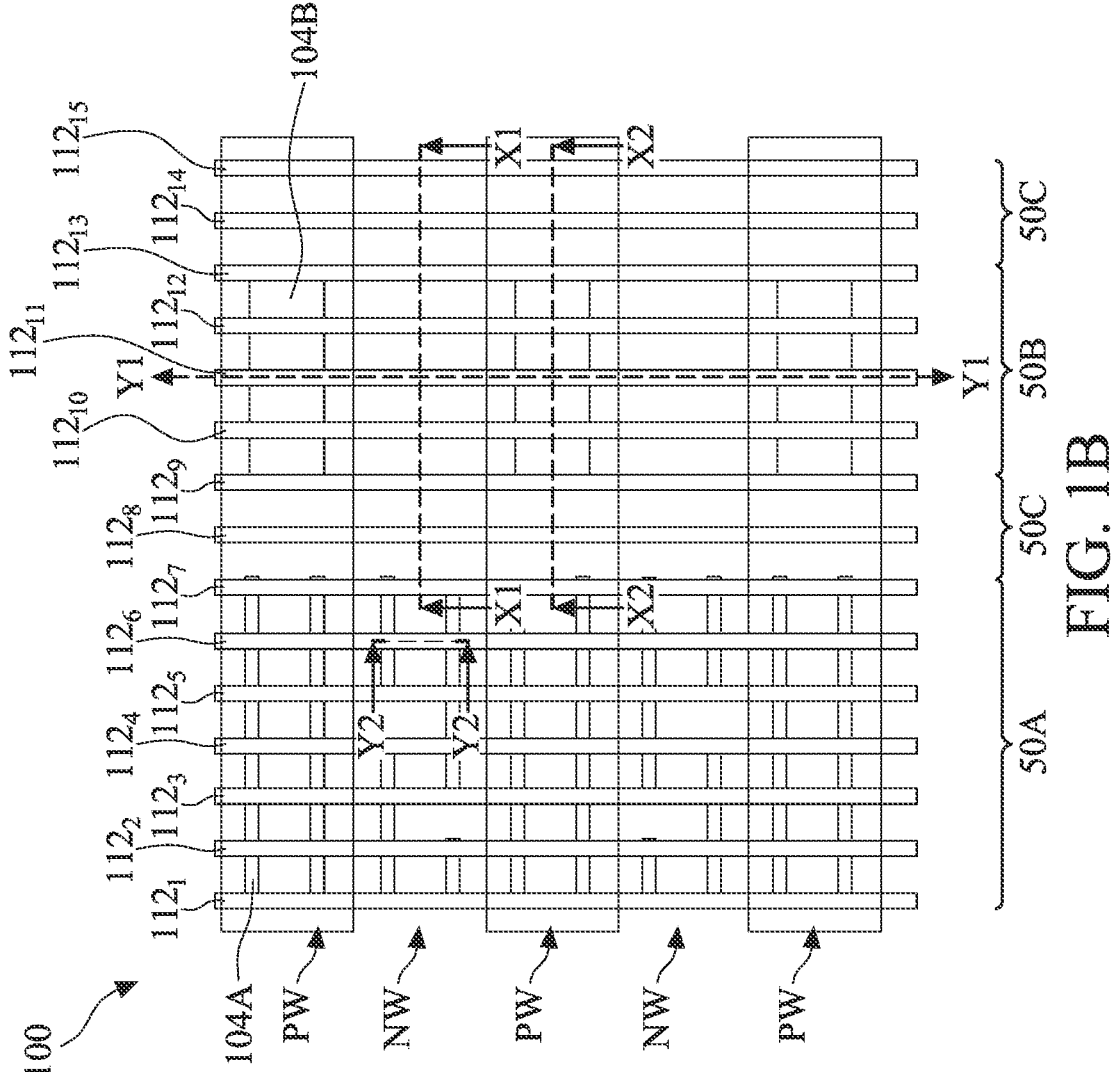
Figures 1, 1B:
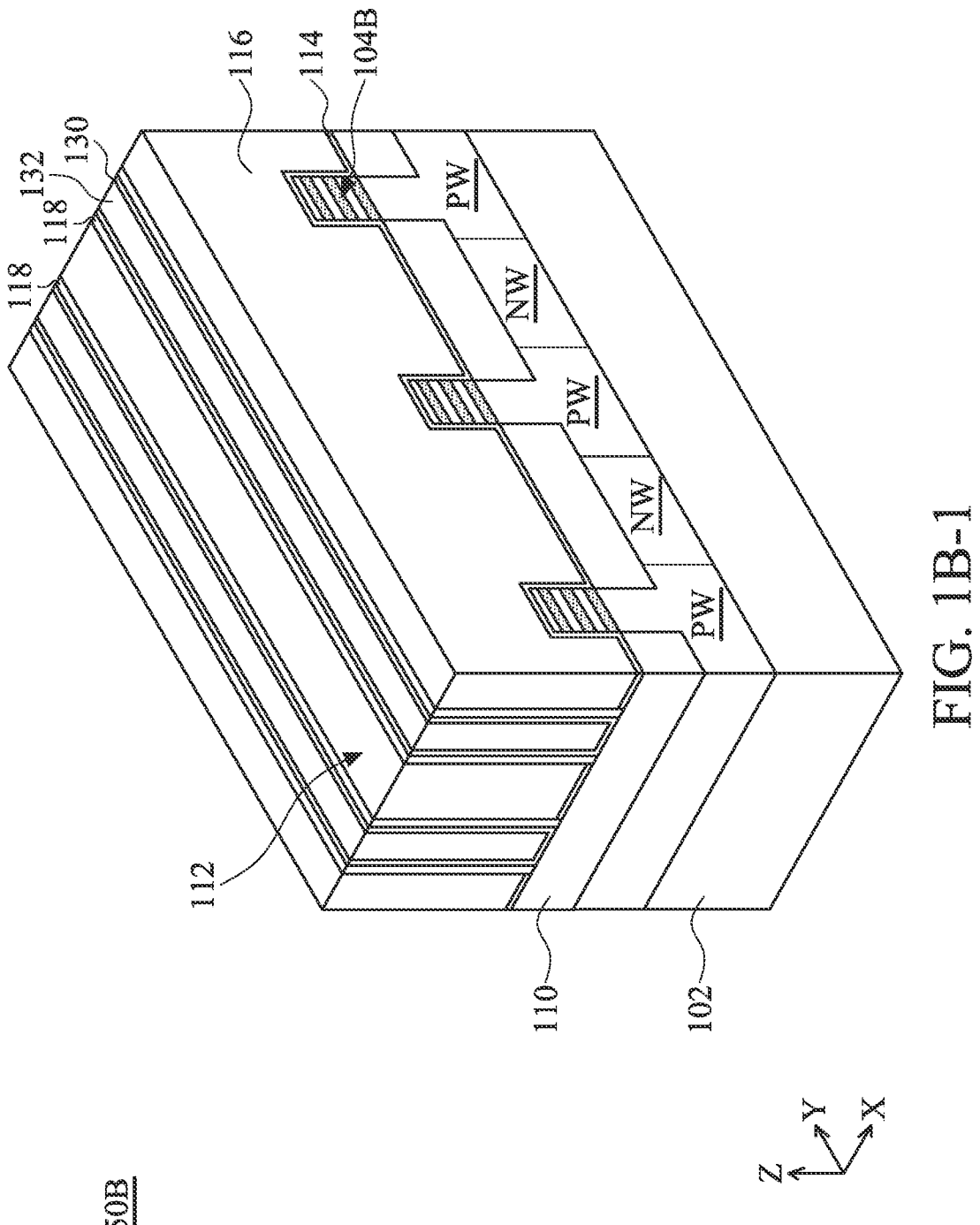
Figures 1, 1B, 2:
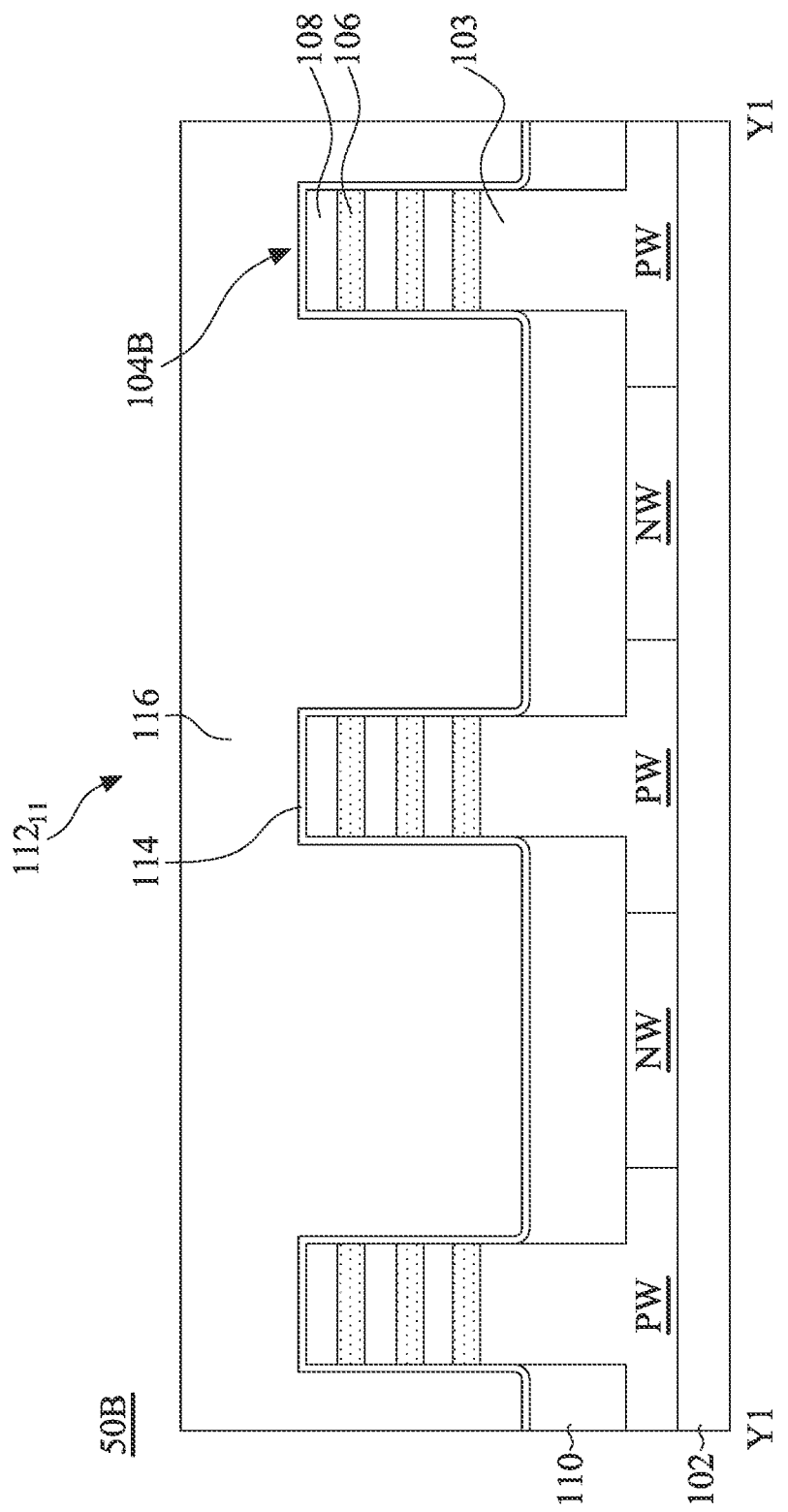
Figures 1, 1B, 2, 3:
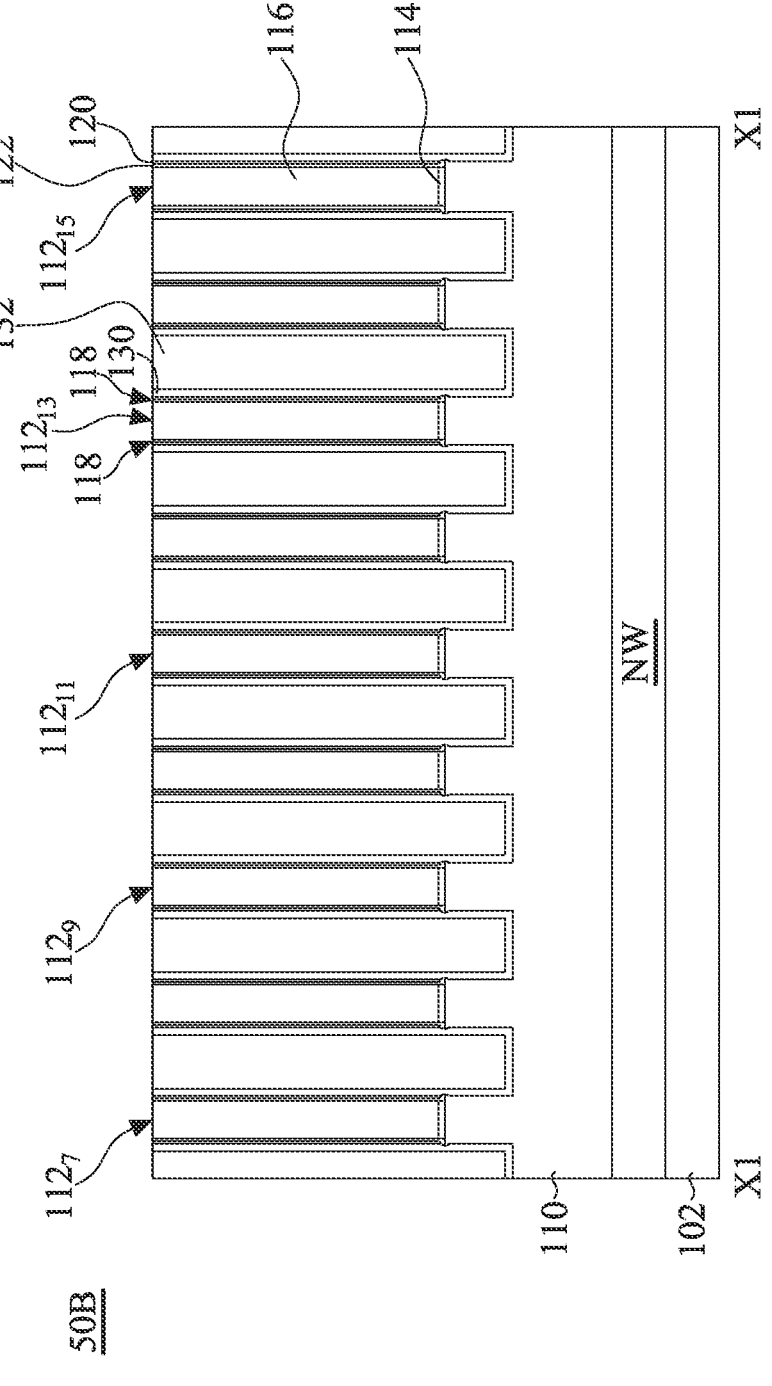
Figures 1, 1B, 2, 3, 4:
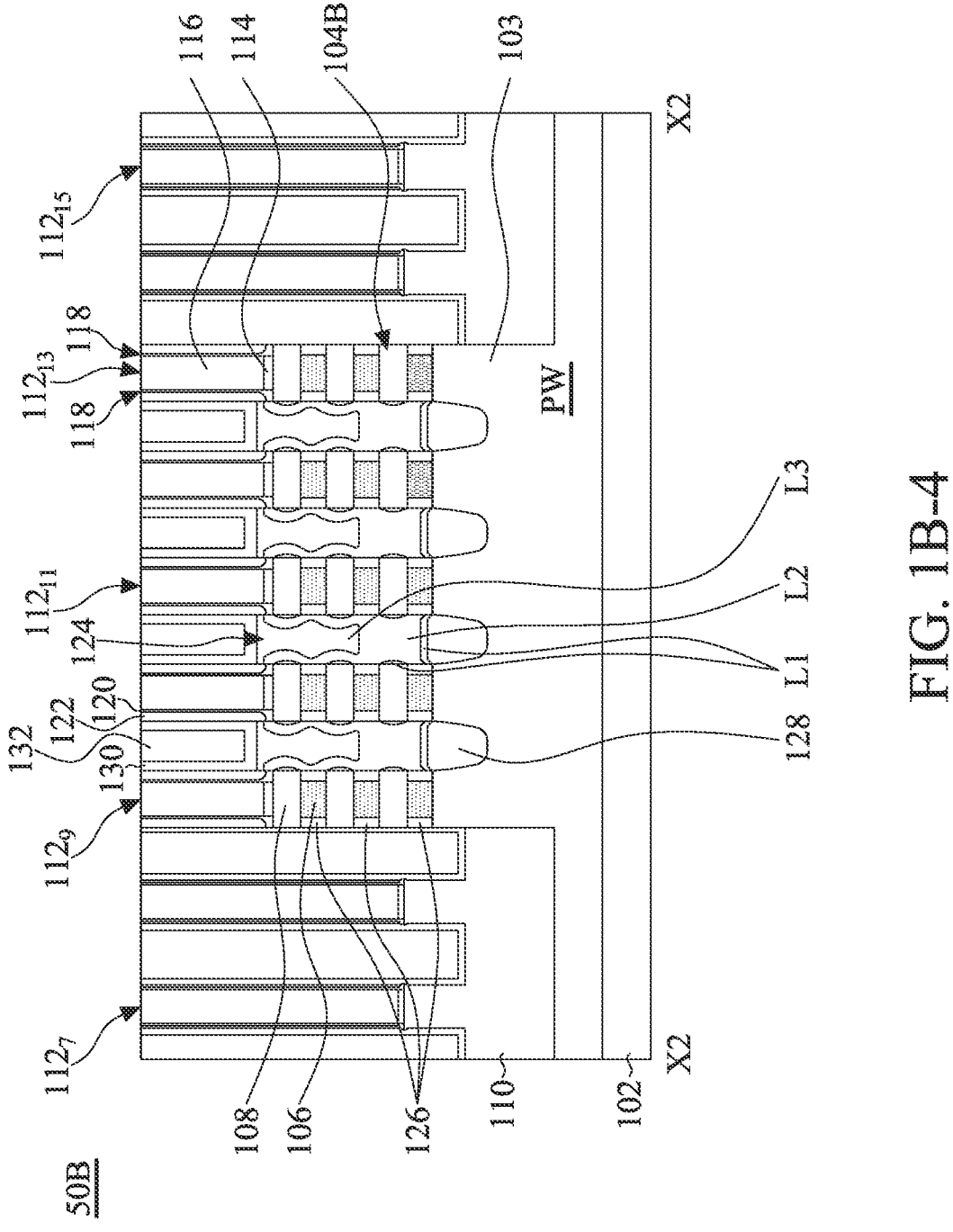
Figures 1, 1B, 2, 3, 4, 5:
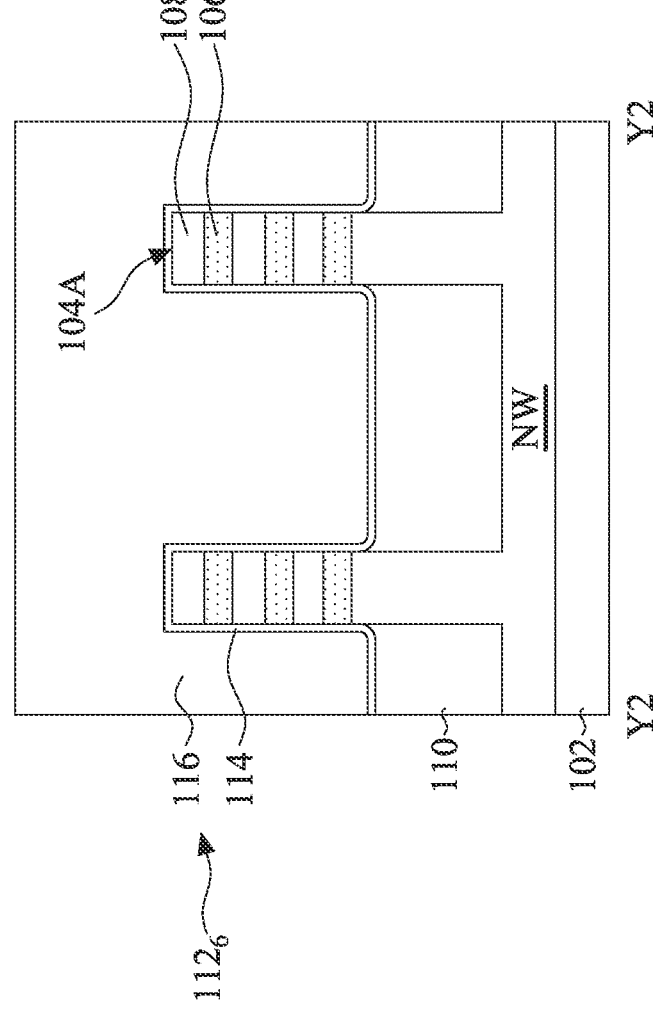

FIG. 1B is a plan view (frontside layout) of a semiconductor structure 100 illustrating the formation of dummy gate structures 112 (including 1121-11215), gate spacer layers 118, source/drain features 124, inner spacer layers 126, a contact etching stop layer (CESL) 130, a first interlayer dielectric (ILD) layer 132. FIG. 1B-1 is a perspective view of the semiconductor structure 100 in the area 50B. FIGS. 1B-2, 1B-3, 1B-4 and 1B-5 are cross-sectional views corresponding to line Y1-Y1, line X1-X1, line X2-X2 and line Y2-Y2 of FIG. 1B. Dummy gate structures 112 (including 1121-11215) are formed over and/or across the active regions 104A and 104B and the isolation structure 110, as shown in FIGS. 1B to 1B-5, in accordance with some embodiments. The dummy gate structures 112 are configured as sacrificial structures and will be replaced with the final gate stacks and the insulating strips, in accordance with some embodiments. In some embodiments, the dummy gate structures 112 extend in the Y direction. That is, the dummy gate structures 112 have longitudinal axes parallel to the Y direction, in accordance with some embodiments.

The dummy gate structures 1122-6 are located within the first area 50A, and the dummy gate structures 11210-12 are located within the second area 50B, in accordance with some embodiments. The dummy gate structures $112_{1, 7, 9, 13 \text{ and } 15}$ are located at the area boundaries, in accordance with some embodiments. Although three dummy gate structures 112 are illustrated in the second area 50B, the number of the dummy gate structures 112 may be 1-5, in accordance with some embodiments. For example, if the number of the dummy gate structures 112 in the second area 50B is too small, the resistance of the electrical connection structures of the power transmission cell regions may be too high. If the number of the dummy gate structures 112 in the second area 50B is too large the efficiency of the use of the substrate surface may reduce.

The dummy gate structures 112 surround the channel regions of the active regions 104A and 104B, in accordance with some embodiments. Each of the dummy gate structures 112 includes a dummy gate dielectric layer 114 and a dummy gate electrode layer 116 over the dummy gate dielectric layer 114, in accordance with some embodiments. In some embodiments, the dummy gate dielectric layer 114 is conformally formed along the upper fin elements of the active regions 104 and the top surface of the isolation structure 110. In some embodiments, the dummy gate dielectric layer 114 is made of one or more dielectric materials, such as silicon oxide (SiO), silicon nitride (SiN), silicon oxynitride (SiON), $HfO_2$, HfZrO, HfSiO, HfTIO, HfAlO. In some embodiments, the dielectric material is deposited using ALD, CVD, thermal oxidation, physical vapor deposition (PVD), another suitable technique, or a combination thereof. In some embodiments, the dummy gate electrode layer 116 is made of semiconductor material such as polysilicon or poly-silicon germanium. In some embodiments, the material for the dummy gate electrode layer 116 is deposited using CVD, ALD, another suitable technique, or a combination thereof.

In some embodiments, the formation of the dummy gate structures 112 includes depositing a dielectric material for the dummy gate dielectric layer 114 over the semiconductor structure 100, depositing a material for the dummy gate electrode layer 116 over the dielectric material, planarizing the material for the dummy gate electrode layer 116, and patterning the material for the dummy gate electrode layer 116 and the dielectric material into the dummy gate structures 112 using photolithography and etching processes.

Gate spacer layers 118 are formed along opposite sidewalls of the dummy gate structures 112, as shown in FIGS. 1B-3 and 1B-4, in accordance with some embodiments. The gate spacer layers 118 extend in the Y direction and across the active regions 104 and the isolation structure 110, in accordance with some embodiments. The gate spacer layers 118 are used to offset the subsequently formed source/drain features and separate the source/drain features from the gate structure, in accordance with some embodiments. In some embodiments, the gate spacer layer 118 includes a first dielectric material 120 and a second dielectric material 122 over the first dielectric material 120. In some embodiments, the first dielectric material 120 may be the same as or different than the second dielectric material 122.

In some embodiments, the dielectric material 120 and 122 may be silicon oxide ($SiO_2$), silicon nitride (SiN), silicon carbide (SiC), silicon oxynitride (SiON), silicon carbon nitride (SiCN), silicon oxycarbonitride (SiOCN), oxygen-doped silicon carbonitride (Si(O)CN), and/or a combination thereof. In some embodiments, the formation of the gate spacer layers 118 includes globally and conformally depositing the dielectric material 120 and 122, followed by an anisotropic etching process. In some embodiments, the etching process is performed without an additional photolithography process.

Source/drain features 124 are formed in and/or over the source/drain regions of the active regions 104B, as shown in FIG. 1B-4, in accordance with some embodiments. Although not shown, the source/drain features 124 are also formed in and/or over the source/drain regions of the active regions 104A. The formation of the source/drain features 124 includes recessing the source/drain regions of the active region 104A and 104B using the dummy gate structures 112 and the gate spacer layers 118 as an etch mask to form source/drain recesses on opposite sides of the dummy gate structures 112, in accordance with some embodiments. In the recessing process, the isolation structure 110 is also recessed, as shown in FIGS. 1B-3 and 1B-4, in accordance with some embodiments. The recessing process may be an anisotropic etching process such as dry plasma etching, an isotropic etching process such as dry chemical etching, remote plasma etching or wet chemical etching, or a combination thereof.

An etching process is performed to laterally recess, from the source/drain recesses, the first semiconductor layers 106 of the active regions 104A and 104B, thereby forming notches, and then inner spacer layers 126 are formed in the notches, as shown in FIG. 1B-4, in accordance with some embodiments. The inner spacer layers 126 abut the recessed side surfaces of the first semiconductor layers 106, and are located between adjacent second semiconductor layers 108 and between the lowermost second semiconductor layer 108 and the lower fin element 103, in accordance with some embodiments. The inner spacer layers 126 may avoid the source/drain features 124 and the gate stack from being in direct contact and are configured to reduce the parasitic capacitance between the gate stack and the source/drain features (i.e., Cgs and Cgd), in accordance with some embodiments.

In some embodiments, the inner spacer layers 126 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), oxygen-doped silicon carbonitride (Si(O)CN), and/or a combination thereof. In some embodiments, the inner spacer layers 126 are formed by depositing a dielectric material to fill the notches, and then etching away the dielectric material outside the notches. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

Sacrificial layers 128 are grown in the source/drain recesses on the lower fin elements 103, as shown in FIG. 1B-4, in accordance with some embodiments. In some embodiments, the sacrificial layers 128 are made of an epitaxial semiconductor material such as silicon, silicon germanium or germanium, formed by MBE, MOCVD, or VPE, another suitable technique, or a combination thereof.

Afterward, the source/drain features 124 are grown in the source/drain recesses on the surfaces of the second semiconductor layers 108 and the sacrificial layers 128, as shown in FIG. 1B-4, in accordance with some embodiments. In some embodiments, the source/drain features 124 are made of any suitable semiconductor material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 124 are in-situ doped during the epitaxial growth process.

In some embodiments, the source/drain features 124 in the n-type wells NW have a different electrically conductive type than the source/drain features 124 in the p-type wells PW. In some embodiments, in the p-type wells PW, the source/drain features 124 are made of semiconductor material such as SiP, SiAs, SiCP, SiC, Si, GaAs, another suitable semiconductor material, or a combination thereof. In some embodiments, these source/drain features 124 are doped with the n-type dopant during the epitaxial growth process. For example, the n-type dopant may be phosphorous (P) or arsenic (As). For example, these source/drain features 124 may be the epitaxially grown Si doped with phosphorous to form silicon:phosphor (Si:P) source/drain features and/or arsenic to form silicon: arsenic (Si:As) source/drain feature.

In some embodiments, the concentrations of the dopant (e.g., P) in the n-type source/drain features 124 are in a range from about $2\times10^{19}$ cm$^{-3}$ to about $3\times10^{21}$ cm$^{-3}$.

In some embodiments, in the n-type wells NW, the source/drain features 124 are made of semiconductor material such as SiGe, Si, GaAs, another suitable semiconductor material, or a combination thereof. In some embodiments, these source/drain features 124 are doped with the p-type dopant during the epitaxial growth process. For example, the p-type dopant may be boron (B) or $BF_2$. For example, these source/drain features 124 may be the epitaxially grown SiGe doped with boron (B) to form silicon germanium: boron (SiGe: B) source/drain feature. In some embodiments, the concentrations of the dopant (e.g., B) in the p-type source/drain features 124 are in a range from about $1\times10^{19}$ cm$^{-3}$ to about $6\times10^{20}$ cm$^{-3}$.

In some embodiments, the source/drain features 124 are in-situ doped during the epitaxial processes. In some embodiments, the source/drain features 124 may be multi-layered structures including sequentially formed epitaxial layers L1, L2 and L3. In some embodiments, the concentration of the dopant in the epitaxial layer L2 is higher than the concentration of the dopant in the epitaxial layer L1, e.g., by 1-2 orders. In some embodiments, the concentration of the dopant in the epitaxial layer L3 is higher than the concentration of the dopant in the epitaxial layer L2, e.g., by 1-2 orders.

A contact etching stop layer 130 is formed over the semiconductor structure 100 and covers the source/drain features 124, as shown in FIGS. 1B-3 and 1B-4, in accordance with some embodiments. In some embodiments, the contact etching stop layer 130 is made of dielectric material, such as silicon nitride (SiN), silicon oxide ($SiO_2$), silicon oxynitride (SiON), silicon carbide (SiC), oxygen-doped silicon carbide (SiC:O), oxygen-doped silicon carbonitride (Si(O)CN), or a combination thereof. In some embodiments, a dielectric material for the contact etching stop layer 130 is deposited over the semiconductor structure 100 using CVD (such as LPCVD, PECVD, HDP-CVD, or HARP), ALD, another suitable method, or a combination thereof.

A first interlayer dielectric layer 132 is formed over the contact etching stop layer 130, as shown in FIGS. 1B-3 and 1B-4, in accordance with some embodiments. The first interlayer dielectric layer 132 overfills the space between dummy gate structures 112, in accordance with some embodiments. In some embodiments, the first interlayer dielectric layer 132 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the dielectric material for the first interlayer dielectric layer 132 is deposited using CVD (such as HDP-CVD, PECVD, HARP or FCVD), another suitable technique, or a combination thereof. The dielectric materials of the contact etching stop layer 130 and the first interlayer dielectric layer 132 are removed from the top surface of the dummy gate electrode layer 116, for example using CMP, in accordance with some embodiments.

Figure 1C:
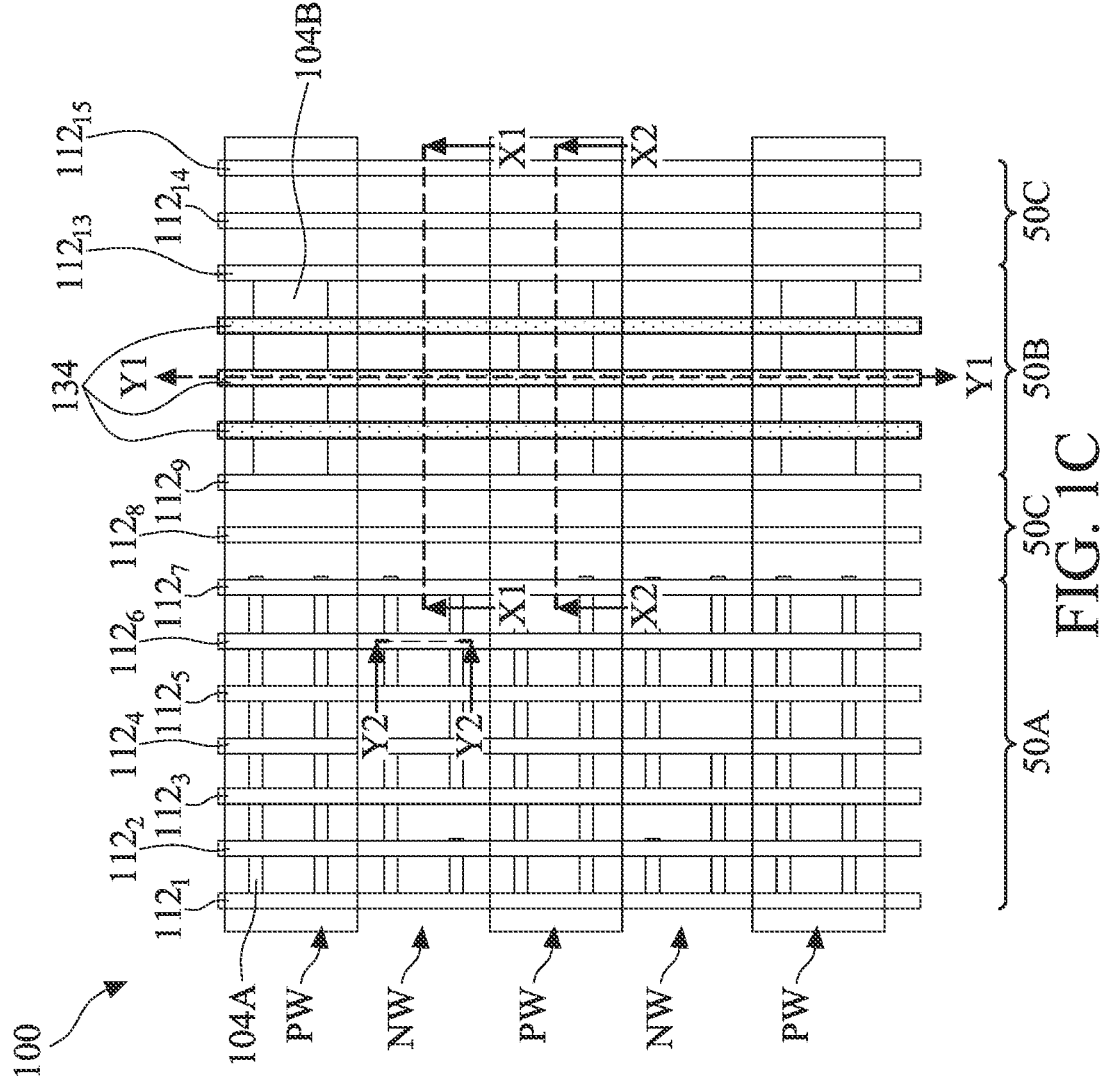
Figures 1, 1C:
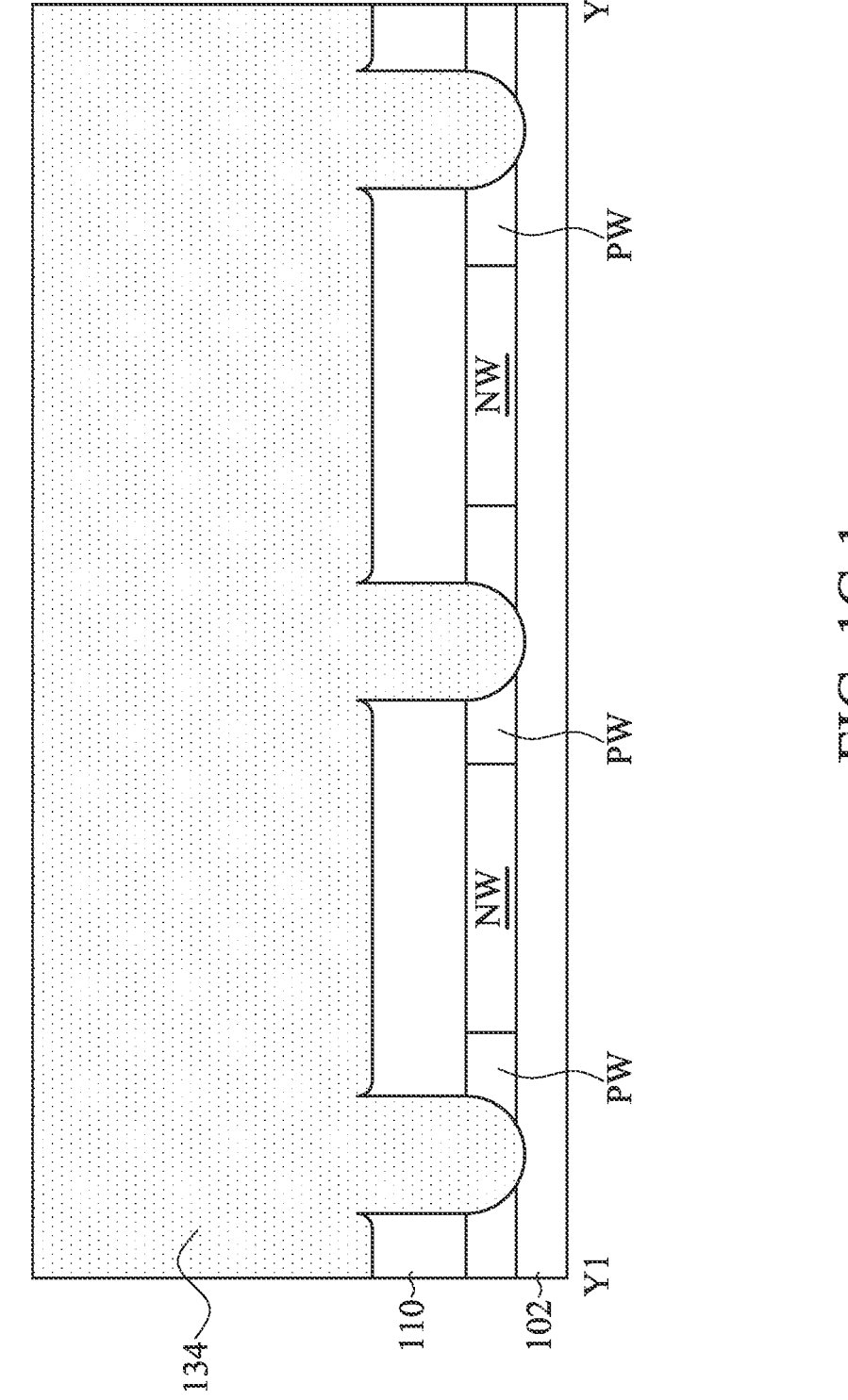
Figures 1, 1C, 2:
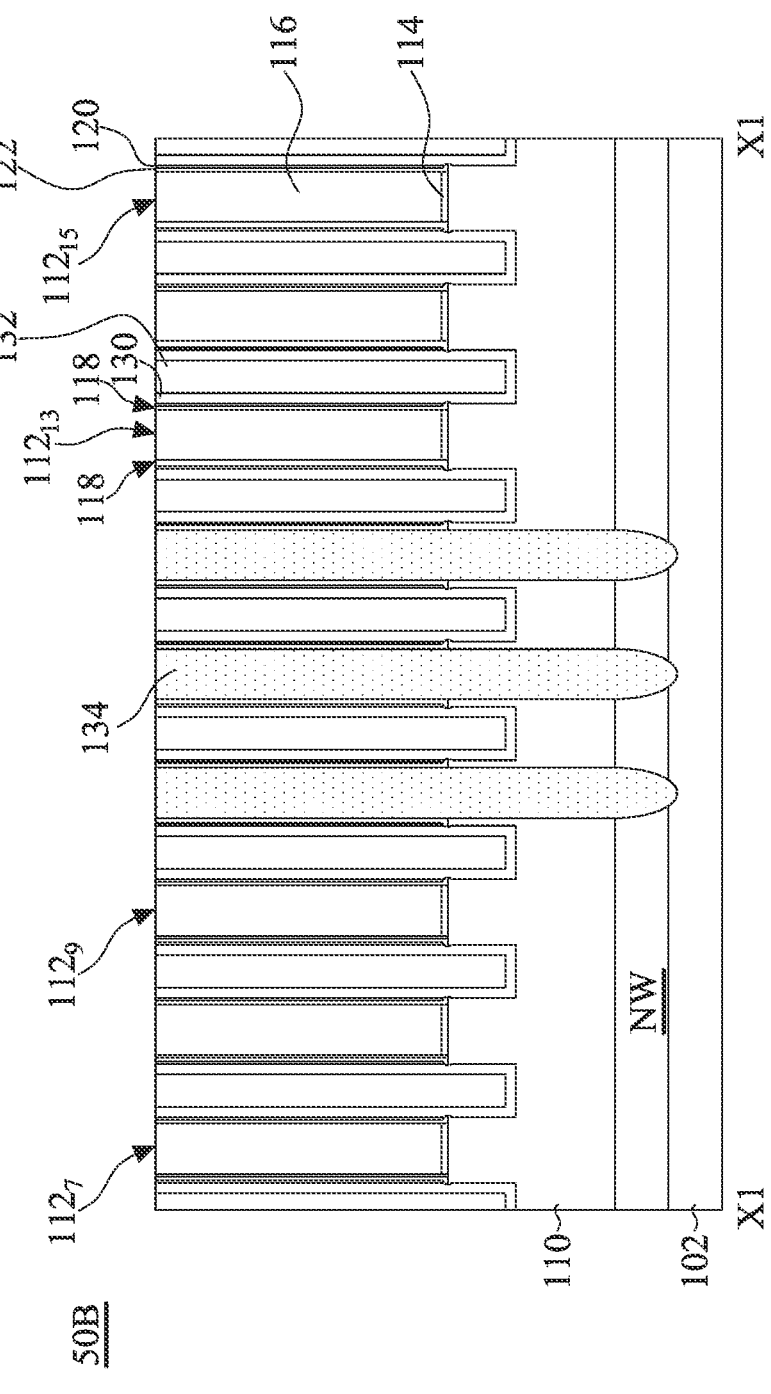
Figures 1, 1C, 2, 3:
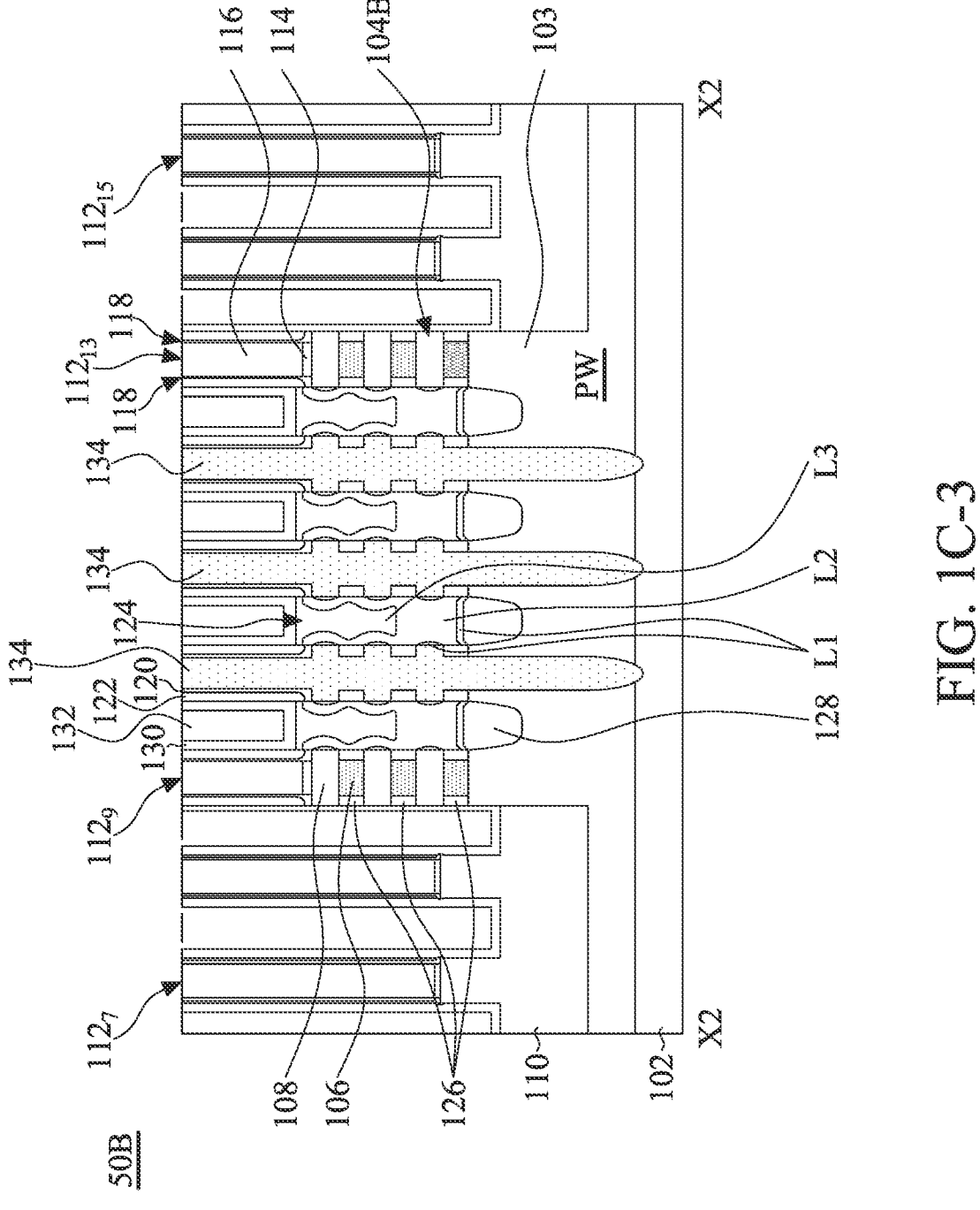
Figures 1, 1C, 2, 3, 4:
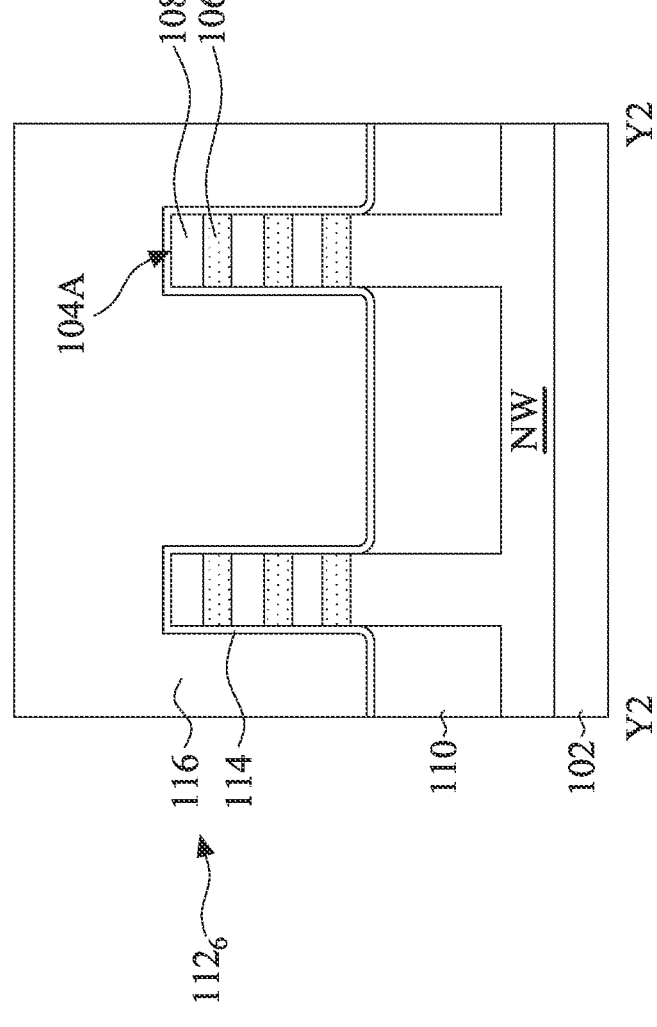

FIG. 1C is a plan view (frontside layout) of a semiconductor structure 100 illustrating the formation of insulating strips 134. FIGS. 1C-1, 1C-2, 1C-3 and 1C-4 are cross-sectional views corresponding to line Y1-Y1, line X1-X1, line X2-X2 and line Y2-Y2 of FIG. 1C. Insulating strips 134 are formed in the second area 50B through the dummy gate structures 11210, 11211 and 11212 and the underlying active regions 104B, as shown in FIGS. 1C to 1C-3, in accordance with some embodiments. The insulating strips 134 include extending portions which penetrate through the lower fin elements 103, the wells NW and PW, and further into the substrate 102, in accordance with some embodiments. In some embodiments, the bottoms of the insulating strips 134 may be lower than the bottom surface of the isolation structure 110.

In some embodiments, the dummy gate structures 11210, 11211 and 11212 within the second area 50B are completely replaced with the insulating strips 134. In some other embodiments, only portions of the dummy gate structures 11210, 11211 and 11212 between the power transmission cells are replaced with the insulating strips 134. In some embodiments, each of the active regions 104B is cut through by the insulating strips 134 into several segments that are electrically isolated from one another. In some embodiments, the insulating strips 134 extend in the Y direction. That is, the insulating strips 134 have longitudinal axes parallel to the Y direction, in accordance with some embodiments. The insulating strips 134 may be also referred to as cut poly gate on oxide definition edge (CPODE) patterns. In some embodiments, the insulating strips 134 are configured to prevent leakage between the neighboring power transmission cell regions, which will be discussed in detail later.

The insulating strips 134 are made of a dielectric material such as silicon oxide ($SiO_2$), silicon oxynitride (SiON), silicon nitride (SiN), silicon carbon nitride (SiCN), silicon oxycarbonitride (SiOCN), oxygen-doped silicon carbonitride (Si(O)CN), or a combination thereof. In some embodiments, the insulating strips 134 include dielectric material with k-value greater than 7.9, such as LaO, AlO, AlON, ZrO, HfO, ZnO, ZrN, ZrAlO, TiO, TaO, YO, TaCN, or a combination thereof.

The formation of the insulating strips 134 includes patterning the dummy gate structures 11210, 11211 and 11212 and the active regions 104B using photolithography and etching processes to form cutting trenches (where the insulating strips 134 are to be formed), depositing a dielectric material for the insulating strips 134 to overfill the cutting trenches, in accordance with some embodiments. The etching process may be an anisotropic etching process such as dry plasma etching, an isotropic etching process such as dry chemical etching, remote plasma etching or wet chemical etching, or a combination thereof. In some embodiments, the deposition process is ALD, CVD (such as LPCVD, PECVD, HDP-CVD, or HARP), another suitable technique, or a combination thereof. A planarization process is then performed on dielectric material until the dummy gate structures 112 and the first interlayer dielectric layer 132 are exposed, in accordance with some embodiments. The planarization may be CMP, etching back process, or a combination thereof.

Figure 1D:
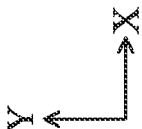
Figures 1, 1D:
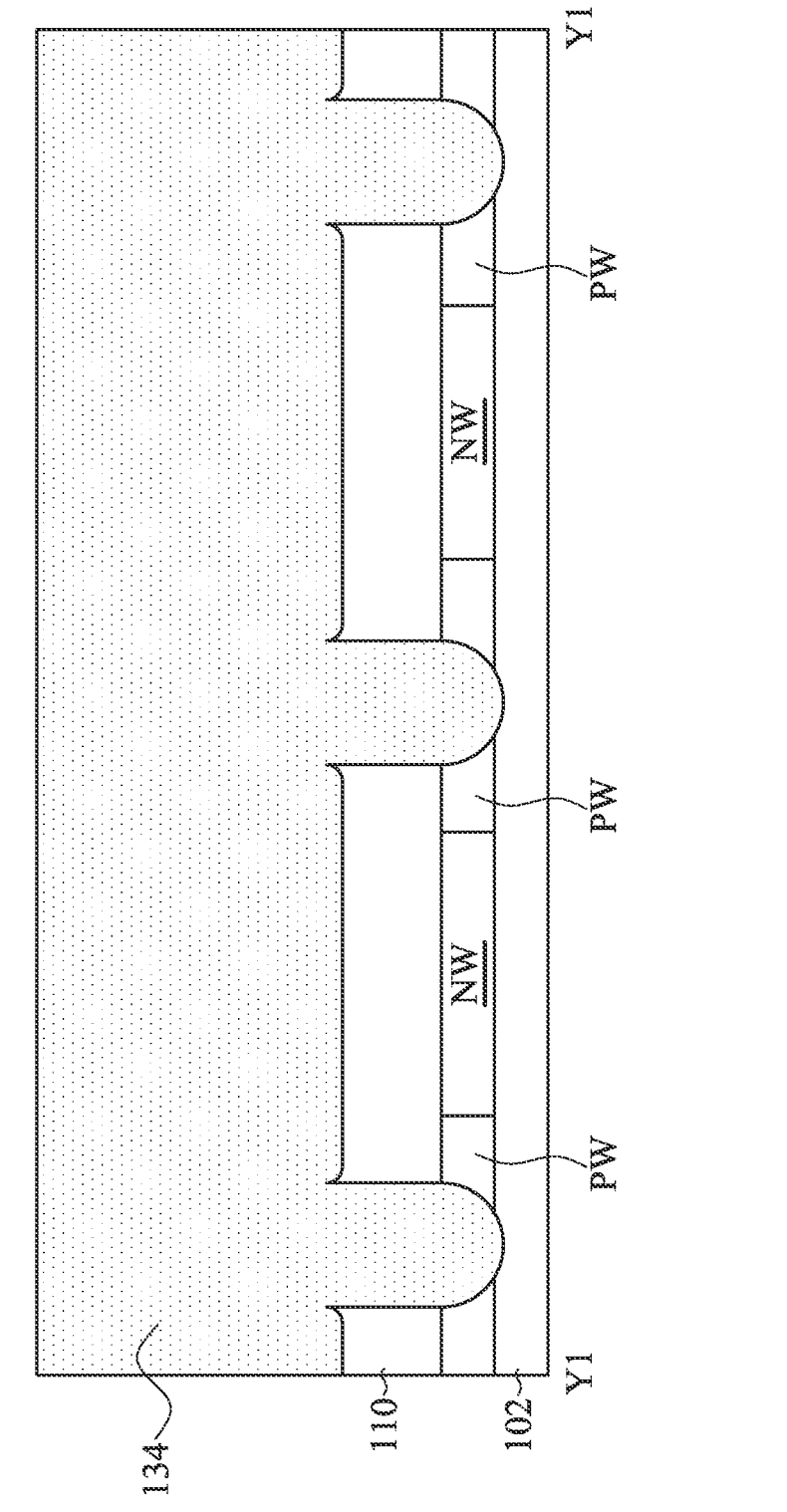
Figures 1, 1D, 2:
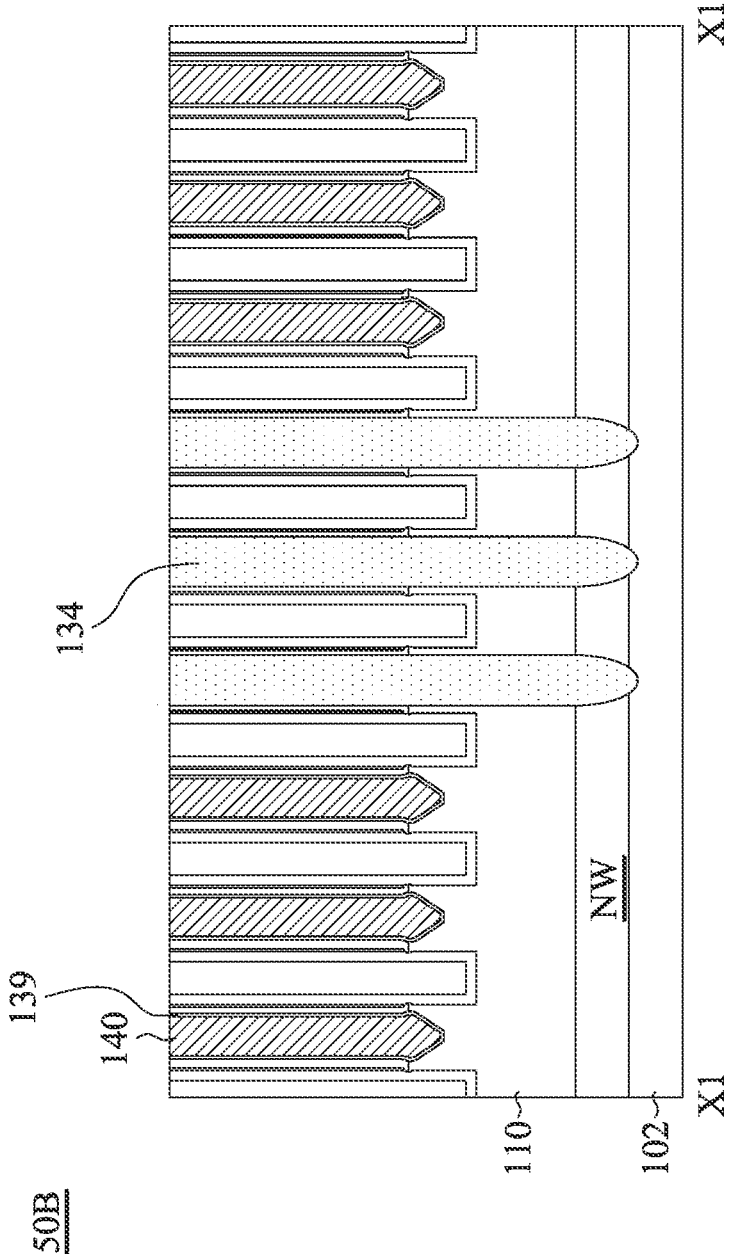
Figures 1, 1D, 2, 3:
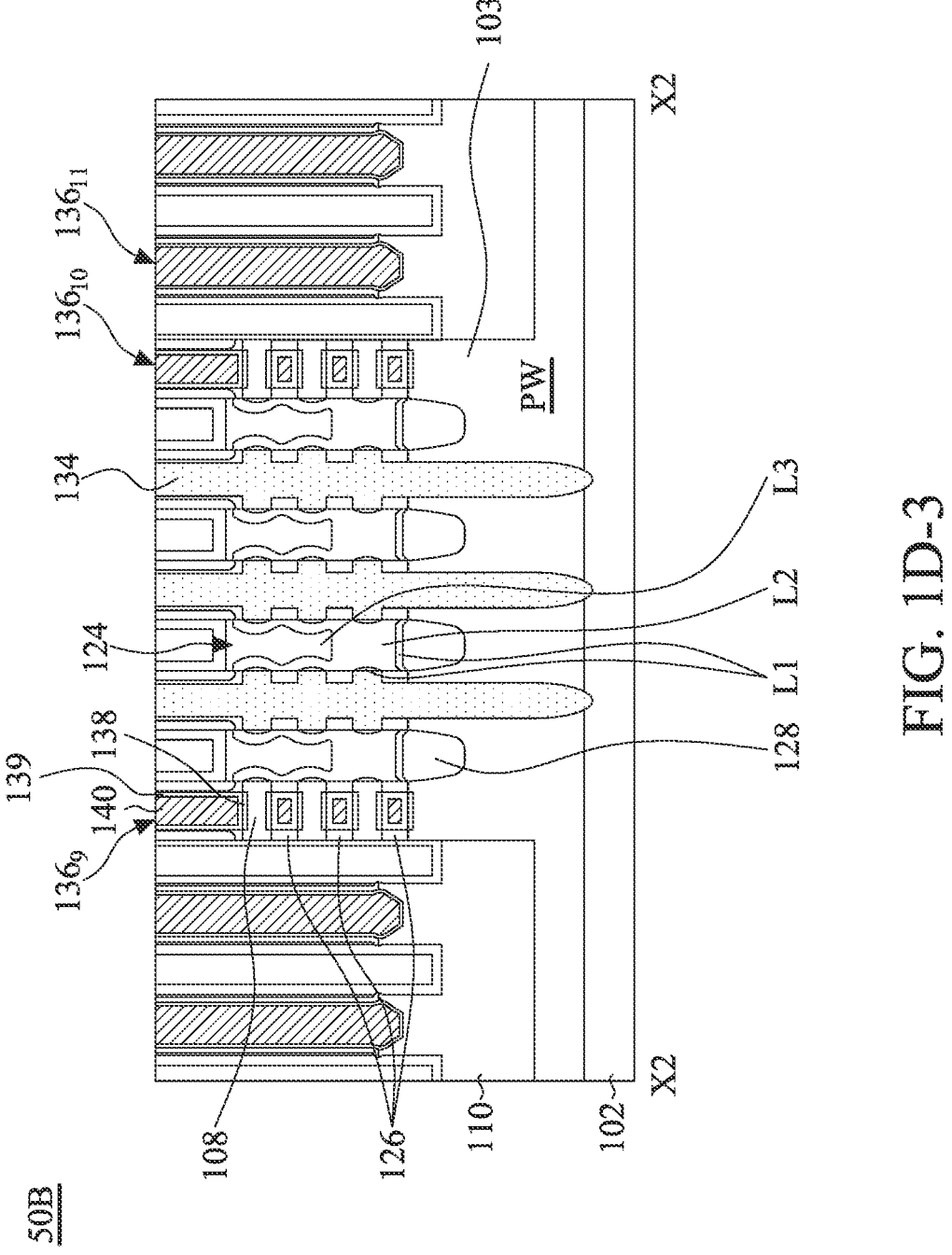
Figures 1, 1D, 2, 3, 4:
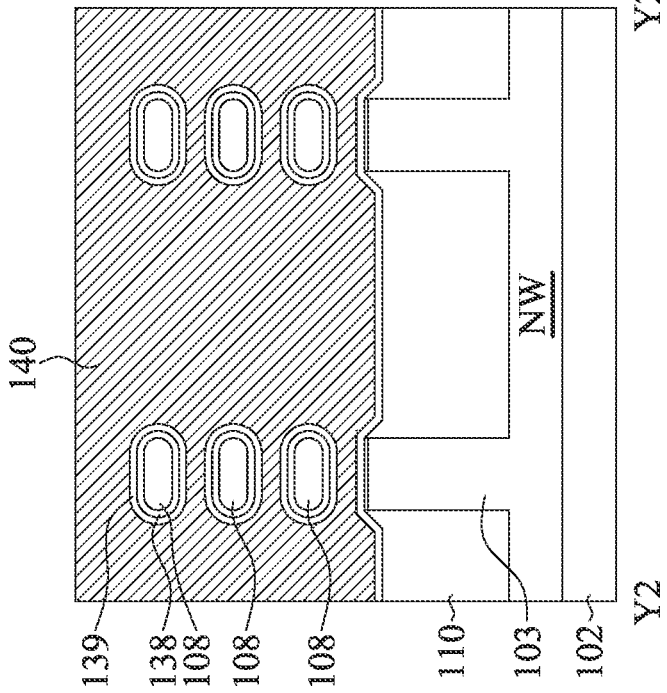

FIG. 1D is a plan view (frontside layout) of a semiconductor structure 100 illustrating the formation of final gate stacks 136 (including 1361 to 13612). FIGS. 1D-1, 1D-2, 1D-3 and 1D-4 are cross-sectional views corresponding to line Y1-Y1, line X1-X1, line X2-X2 and line Y2-Y2 of FIG. 1D. One or more etching processes are performed to remove the dummy gate structures 1121-9 and 11213-15 to form gate trenches, and remove the first semiconductor layers 106 of the active regions 104A and 104B to form gate gaps, in accordance with some embodiments.

In some embodiments, the gate trenches expose the channel regions of the active regions 104A and 104B. In some embodiments, the gate trenches further expose the sidewalls of the gate spacer layers 118 facing the channel region. In some embodiments, the gate gaps expose the inner sidewalls of the inner spacer layers 126 facing the channel regions. In the one or more etching processes, the top surface of the isolation structure 110 is also recessed, as shown in FIGS. 1D-2 and 1D-3. The one or more etching processes may include an anisotropic etching process such as dry plasma etching, an isotropic etching process such as dry chemical etching, remote plasma etching or wet chemical etching, or a combination thereof.

After the one or more etching processes, the four main surfaces of the second semiconductor layers 108 are exposed, in accordance with some embodiments. The exposed second semiconductor layers 108 form several sets of nanostructures 108, in accordance with some embodiments. Each set includes three nanostructures 108 vertically stacked and spaced apart from one other, in accordance with some embodiments. As the term is used herein, "nanostructures" refers to the semiconductor layers with cylindrical shape, bar shaped and/or sheet shape. The nanostructures 108 function as channels of the resulting semiconductor devices (e.g., nanostructure transistors such as GAA transistors), in accordance with some embodiments.

Final gate stacks 136 (including $136_1$ to $136_{12}$) are formed in the gate trenches and gaps, thereby wrapping around the nanostructures 108, as shown in FIGS. 1D, 1D-2, 1D-3 and 1D-4, in accordance with some embodiments. In some embodiments, the final gate stacks 136 extend in the Y direction. That is, the final gate stacks 136 have longitudinal axes parallel to the Y direction, in accordance with some embodiments. The final gate stacks 136 engage the channel regions so that current can flow between the source/drain regions during operation.

The final gate stacks $136_{2-6}$, located in the first area 50A, serve as functional gate which may electrically connected to subsequently formed signal lines, in accordance with some embodiments. The final gate stacks $136_{1,\ 7,\ 9,\ 11\ and\ 12}$, located at the cell boundary and the final gate stacks $136_{8\ and\ 11}$, located in the third areas 50C serve as isolation gates, in accordance with some embodiments. In some embodiments, the isolation gates may be electrically connected to the subsequently formed power rails.

In some embodiments, each of the final gate stacks 136 includes an interfacial layer 138, a gate dielectric layer 139 and a metal gate electrode layer 140, in accordance with some embodiments. The interfacial layer 138 is formed on the exposed surfaces of the nanostructures 108 and the lower fin elements 103, in accordance with some embodiments. The interfacial layer 138 wraps around the nanostructures 108, in accordance with some embodiments. In some embodiments, the interfacial layer 138 is made of a chemically formed silicon oxide or nitrogen-doped silicon oxide. In some embodiments, the interfacial layer 138 is formed using an oxidation process. Semiconductor material from the nanostructures 108 and the lower fin elements 103 is oxidized to form the interfacial layer 138, in accordance with some embodiments.

A gate dielectric layer 139 is formed conformally along the interfacial layer 138 to wrap around the nanostructures 108, in accordance with some embodiments. The gate dielectric layer 139 is also conformally formed along the sidewalls of the gate spacer layers 118 facing the channel region, the sidewalls of the inner spacer layers 126 and top surface of the isolation structure 110, in accordance with some embodiments. The gate dielectric layer 139 may be a high-k dielectric layer. In some embodiments, the high-k dielectric layer is dielectric material with high dielectric constant (k value), for example, greater than 7.9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, $Al_2O_3$, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr) $TiO_3$ (BST), a combination thereof, or another suitable material. The high-k dielectric layer may be deposited using ALD, PVD, CVD, and/or another suitable technique.

The metal gate electrode layer 140 is formed over the gate dielectric layer 139 and overfills the remainder of the gate trenches and the gaps, in accordance with some embodiments. The metal gate electrode layer 140 may be a multi-layer structure with various combinations of a diffusion barrier layer, work function layers with a selected work function to enhance the device performance (e.g., threshold voltage) for n-channel FETs and p-channel FETs, and a metal fill layer to reduce the total resistance of gate stacks, and/or another suitable layer. The metal gate electrode layer 140 may be formed using ALD, PVD, CVD, e-beam evaporation, or another suitable technique. In some embodiments, the metal gate electrode layer 140 may be formed separately for n-channel FETs and p-channel FETs, which may use different work function materials.

A planarization process such as CMP is then performed on the semiconductor structure 100 to remove the gate dielectric layer 139 and the metal gate electrode layer 140 from the top surface of the first interlayer dielectric layer 132, in accordance with some embodiments. In some embodiments, the interfacial layer 138, the gate dielectric layer 139 and the metal gate electrode layer 140 combine to form the final gate stacks 136.

Portions of the final gate stacks 136 surrounding the nanostructures 108 combines with the neighboring source/drain features 124 to form nanostructure transistors, e.g., n-channel nanostructure transistors in the p-type wells PW and p-channel nanostructure transistors in the n-type wells NW. In some embodiments, functional cell regions (only CA1 and CA2 are shown for brevity) are formed and arranged in the first area 50A. In some embodiments, each of the functional cell regions in the first area 50A includes a plurality of n-channel functional transistors and a plurality of p-channel functional transistors. In an embodiment, the functional cell regions (e.g., CA1 and CA2) are SRAM cell regions.

Figure 1E:
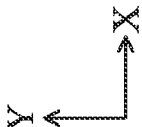
Figures 1, 1E:
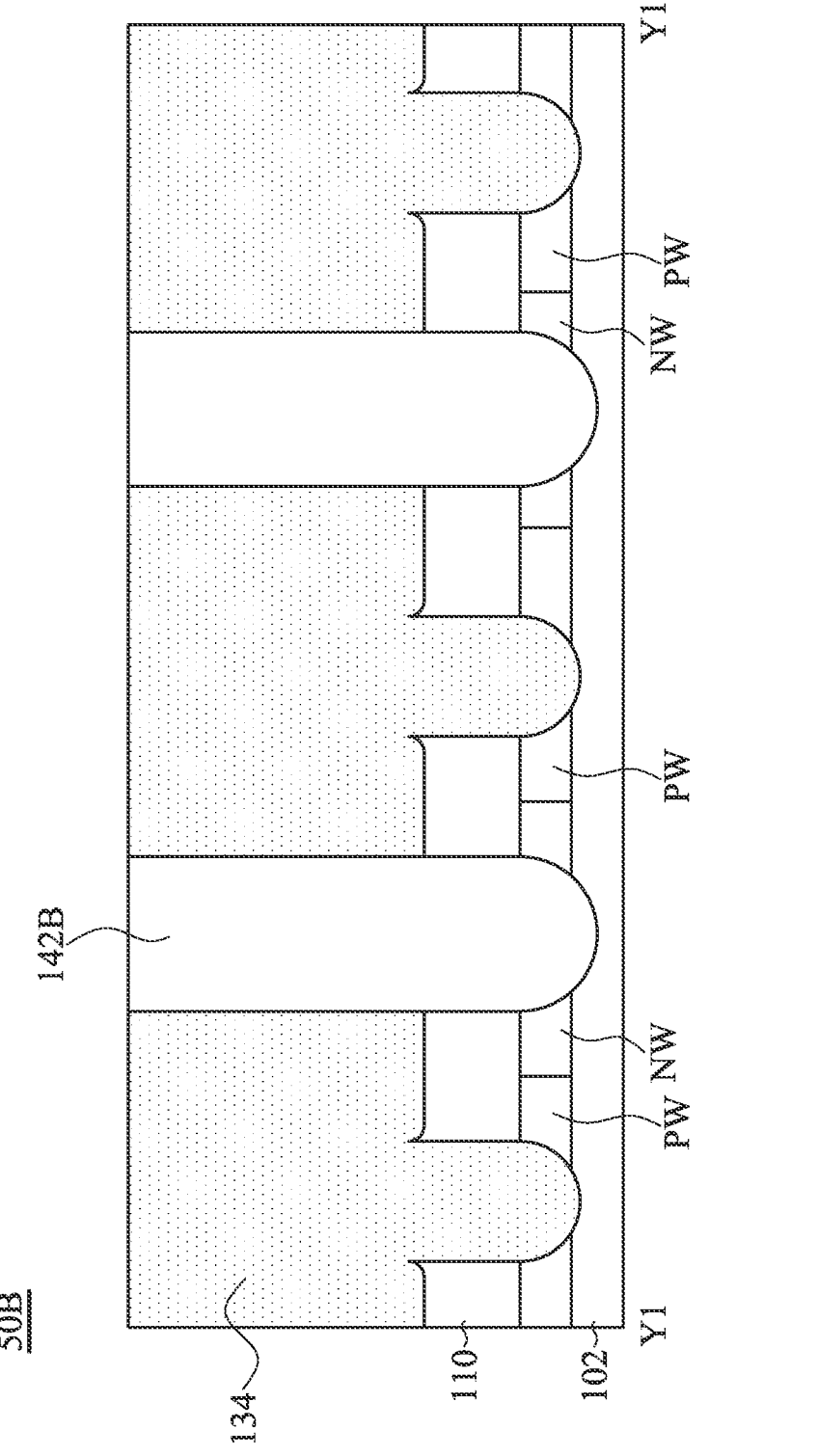
Figures 1, 1E, 2:
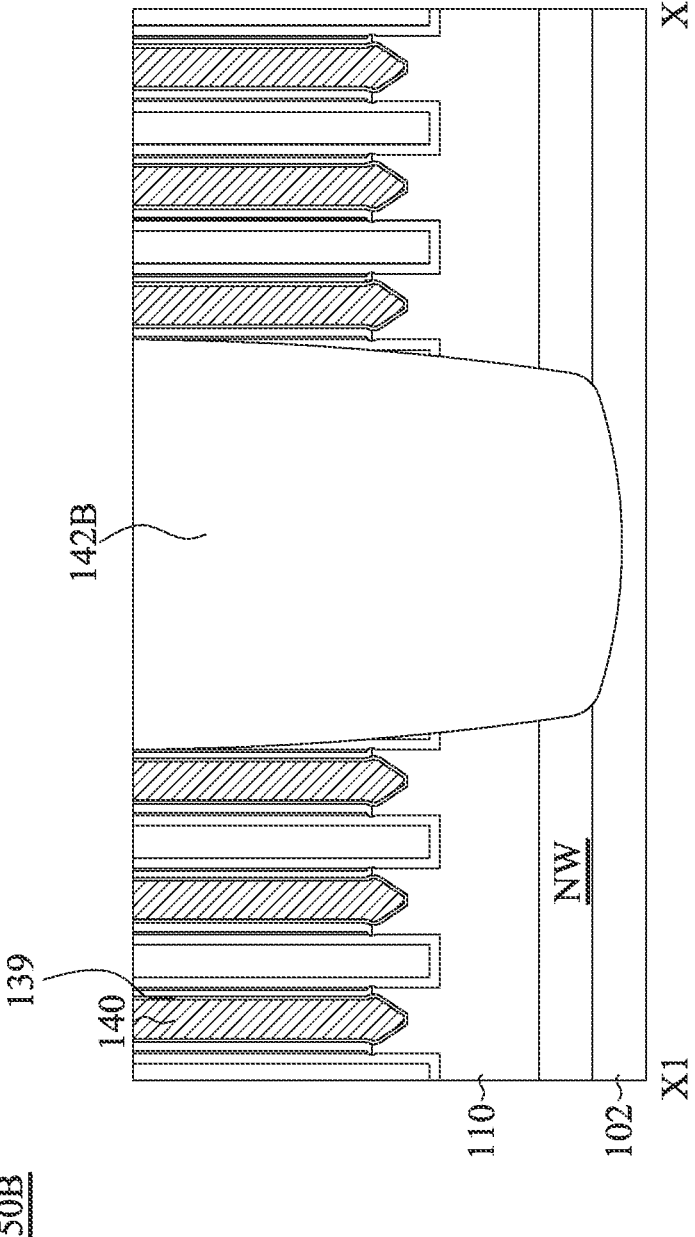

FIG. 1E is a plan view (frontside layout) of a semiconductor structure 100 illustrating the formation of cutting features (including 142A and 142B). FIGS. 1E-1 and 1E-2 are cross-sectional views corresponding to line Y1-Y1 and line X1-X1 of FIG. 1E. Cutting features 142 (including 142A and 142B) are formed in and/or through the final gate stacks 136, the insulating strips 134, the gate spacer layers 118, the contact etching stop layer 130, the first interlayer dielectric layer 132, the isolation structure 110 and the wells NW and PW, and further into the substrate 102, as shown in FIGS. 1E to 1E-2, in accordance with some embodiments. In some embodiments, the cutting features 142 extend in the X direction. That is, the cutting features 142 have longitudinal axes parallel to the X direction, in accordance with some embodiments. The final gate stacks 136 and the insulating strips 134 are cut through by the cutting features 142 into several segments, in accordance with some embodiments. The cutting features 142 may be also referred to as cut metal gate (CMG) pattern.

The cutting features 142A are located in the first area 50A, and the cutting features 142B are located in the second area 50B, in accordance with some embodiments. The cutting features 142A are configured to electrically isolate the segments of the final gate stacks 136 from each other, in accordance with some embodiments. In some embodiments, the cutting features 142B are formed within the n-type wells NW. The cutting features 142B are configured as isolation regions in which electrical connection structures are formed, in accordance with some embodiments. In some embodiments, the width W3 of the cutting features 142A is less than the width W4 of the cutting features 142B. In some embodiments, the ratio of the width W3 to the width W4 is in a range from about 0.1 to about 0.5.

The cutting features 142 are made of a dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the cutting features 142 include dielectric material with dielectric constant value greater than 7.9, such as LaO, AlO, AlON, ZrO, HfO, ZnO, ZrN, ZrAlO, TiO, TaO, YO, TaCN, or a combination thereof. In some embodiments, the deposition process is ALD, CVD (such as LPCVD, PECVD, HDP-CVD, or HARP), another suitable technique, or a combination thereof. The formation of the cutting features 142 includes patterning the final gate stacks 136, the insulating strips 134, the gate spacer layers 118, the contact etching stop layer 130, the first interlayer dielectric layer 132, the isolation structure 110 and the substrate 102 to form gate-cut trenches (where the cutting features 142 are to be formed) using photolithography and etching processes, in accordance with some embodiments. The etching process may be an anisotropic etching process such as dry plasma etching, an isotropic etching process such as dry chemical etching, remote plasma etching or wet chemical etching, or a combination thereof.

The formation of the cutting features 142 further includes depositing a dielectric material for the cutting features 142 to overfill the gate-cut trenches, in accordance with some embodiments. Afterward, a planarization process is then performed on the dielectric material for the cutting features 142 until the final gate stacks 136, the insulating strips 134 and the first interlayer dielectric layer 132 are exposed, in accordance with some embodiments. The planarization may be CMP, etching back process, or a combination thereof.

Figure 1F:
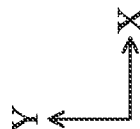
Figures 1, 1F:
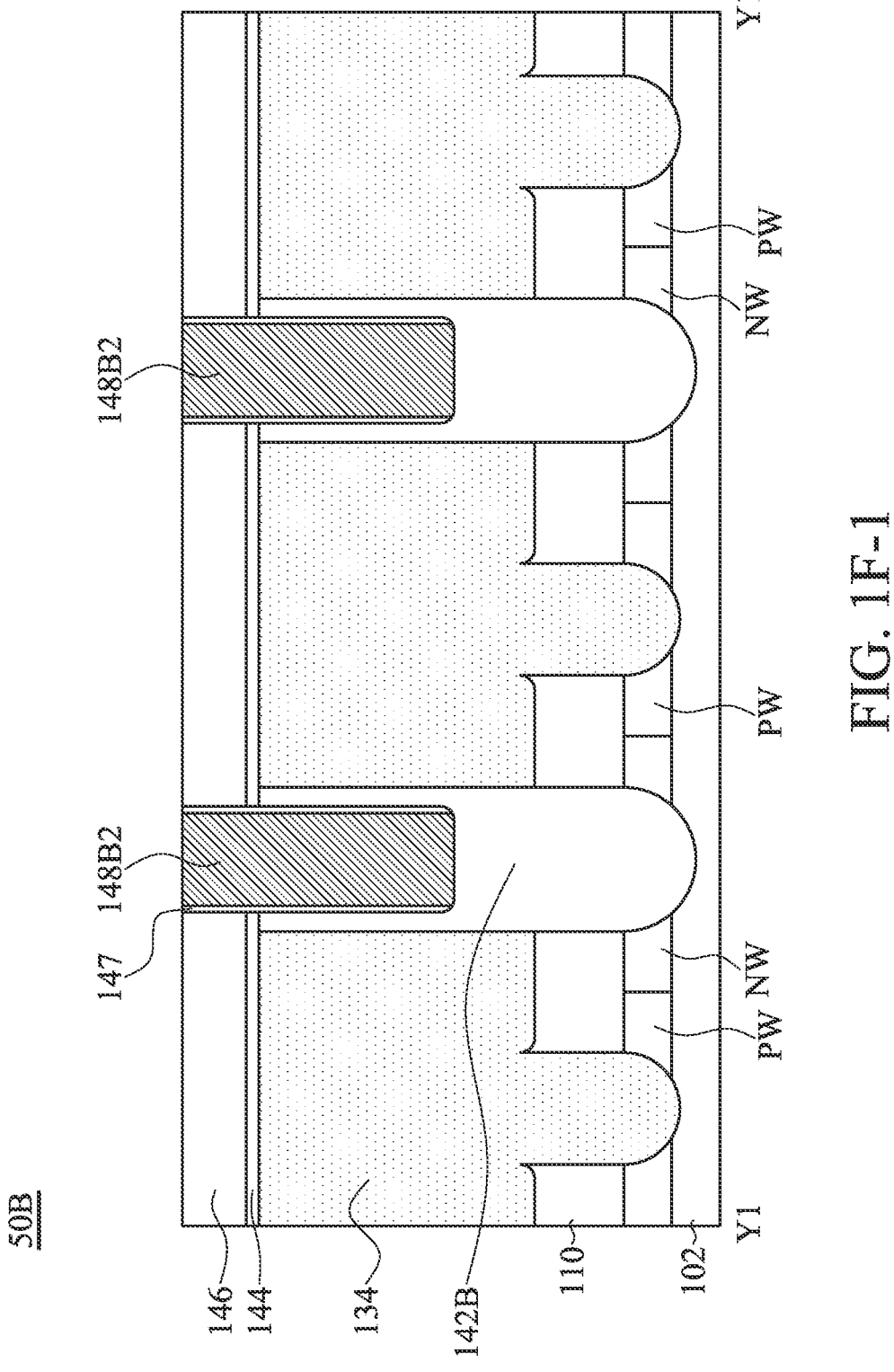
Figures 1, 1F, 2:
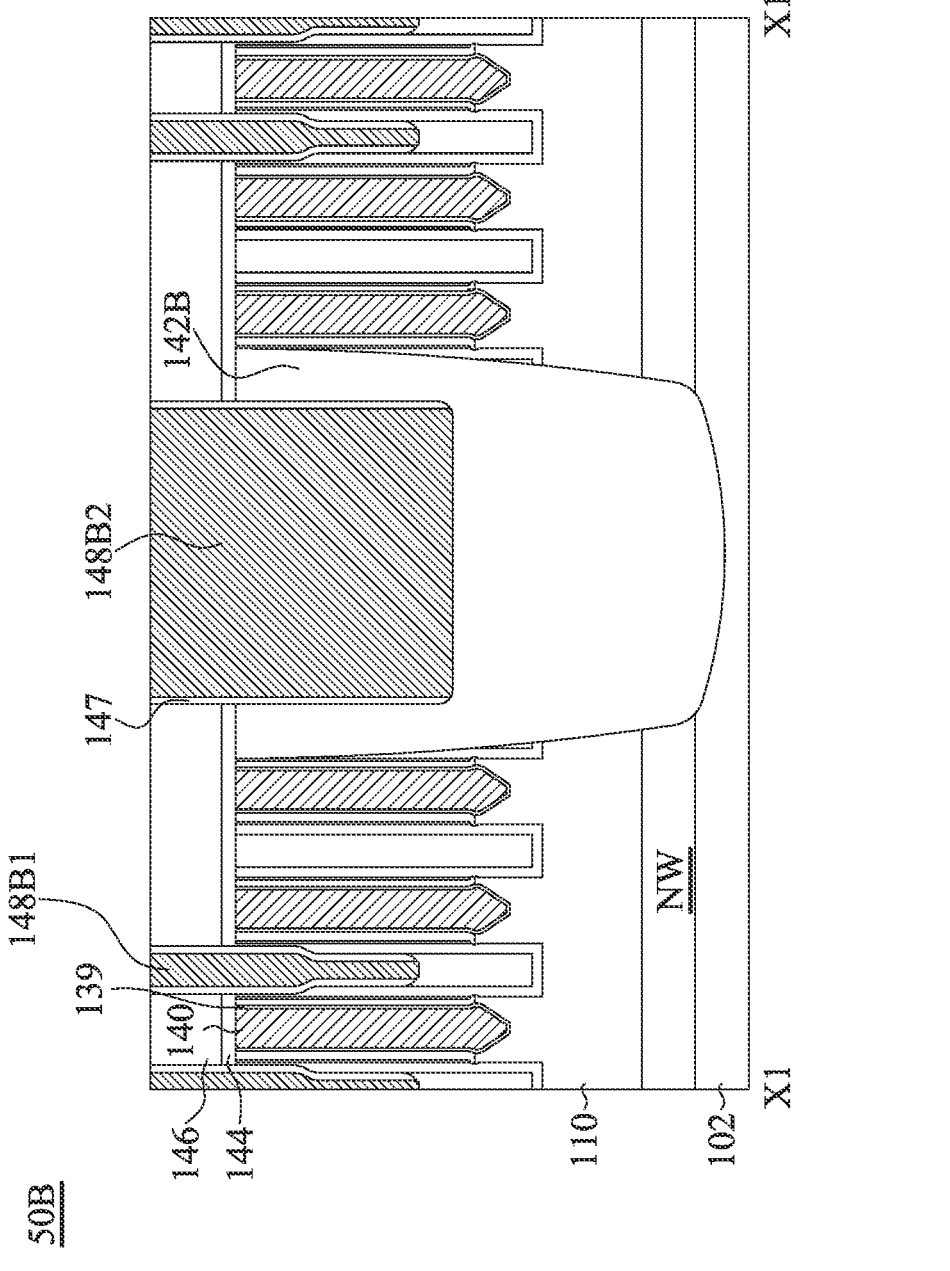
Figures 1, 1F, 2, 3:
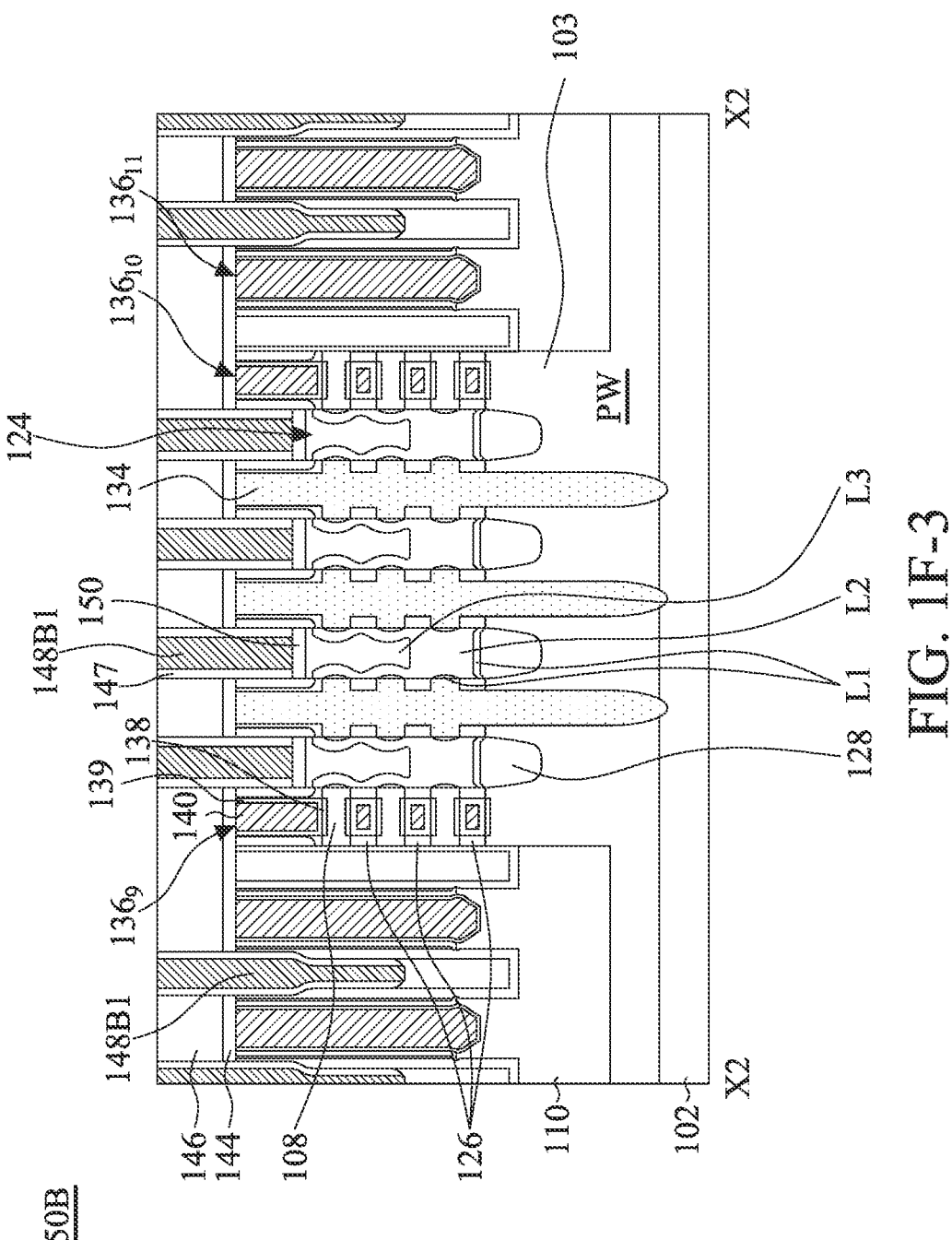
Figures 1, 1F, 2, 3, 4:
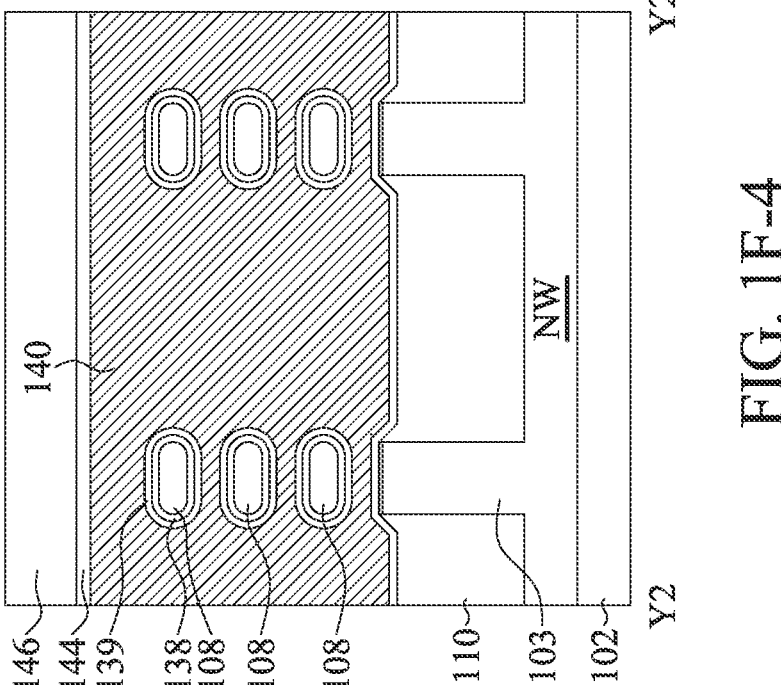

FIG. 1F is a plan view (frontside layout) of a semiconductor structure 100 illustrating the formation of an etching stop layer 144, a second interlayer dielectric layer 146 and frontside contact plugs 148 (including 148A and 148B1) and contact rails 148B2. FIGS. 1F-1, 1F-2, 1F-3 and 1F-4 are cross-sectional views corresponding to line Y1-Y1, line X1-X1, line X2-X2 and line Y2-Y2 of FIG. 1F. An etching stop layer 144 and a second interlayer dielectric layer 146 are sequentially formed over the semiconductor structure 100, as shown in FIGS. 1F to 1F-4, in accordance with some embodiments. In some embodiments, the etching stop layer 144 is made of dielectric material, such as silicon nitride (SiN), silicon oxide ($SiO_2$), silicon oxynitride (SiON), silicon carbide (SiC), oxygen-doped silicon carbide (SiC:O), oxygen-doped silicon carbonitride (Si(O)CN), or a combination thereof. In some embodiments, the second interlayer dielectric layer 146 is made of dielectric material, such as USG, BPSG, FSG, PSG, BSG, and/or another suitable dielectric material. In some embodiments, the etching stop layer 144 and the second interlayer dielectric layer 146 are deposited using CVD (such as HDP-CVD, PECVD, HARP or FCVD), another suitable technique, or a combination thereof.

Contact plugs 148 (including 148A and 148B1) and contact rails 148B2 are formed, as shown in FIGS. 1F to 1F-3, in accordance with some embodiments. The contact plugs 148A and 148B1 are formed through the second interlayer dielectric layer 146, the etching stop layer 144, the first interlayer dielectric layer 132 and the contact etching stop layer 130, in accordance with some embodiments. Some of the contact plugs 148A and 148B1 overlapping the active regions 104A and 104B land on and are electrically connected to the source/drain features 124, as shown in FIGS. 1F and 1F-3, in accordance with some embodiments. In some embodiments, the contact plugs 148A and 148B1 extend in the Y direction. That is, the contact plugs 148A and 148B1 have longitudinal axes parallel to the Y direction, in accordance with some embodiments.

In some embodiments, the contact plugs 148A are formed in the first area 50A, and the contact plugs 148B1 are formed in the second area 50B and the third areas 50C. In some embodiments, the contact plugs 148B1 are dummy patterns, which are used to improve the stability of the patterning process forming the contact plugs and contact rails. In some other embodiments, there may be no contact plugs 148B1 in the second area 50B and the third areas 50C.

The contact rails 148B2 are formed through the second interlayer dielectric layer 146, the etching stop layer 144 and the cutting features 142B, in accordance with some embodiments. The contact rails 148B2 are located in the second area 50B, and entirely confined within the area of the cutting features 142B in the plan view, in accordance with some embodiments. In some embodiments, the contact rails 148B2 extend in the X direction. That is, the contact rails 148B2 have longitudinal axes parallel to the X direction, in accordance with some embodiments. In some embodiments, the contact rail 148B2 serves as an upper portion of the electrical connection structure of the power transmission cell region.

In some embodiments, the formation of the contact plugs 148A and 148B1 and contact rails 148B2 includes patterning the semiconductor structure 100 to form contact trenches (where the contact plugs 148A and 148B1 and contact rails 148B2 are to be formed) using photolithography and etching processes until the source/drain features 124 are exposed. The etch process may include dry etching such as reactive ion etch (RIE), neutral beam etch (NBE), inductive coupled plasma (ICP) etch, capacitively coupled plasma (CCP) etch, another suitable method, or a combination thereof.

Silicide layers 150 are formed on the exposed surfaces of the source/drain features 124. In some embodiments, the silicide layers 150 are made of WSi, NiSi, TiSi and/or CoSi. In some embodiments, the formation of the silicide layers 150 includes depositing a metal material followed by one or more annealing processes. The semiconductive material (e.g., Si) from the source/drain features 124 reacts with the metal material to form the silicide layers 150, in accordance with some embodiments. Unreacted metal material is then removed, e.g., using wet etching.

Contact liners 147 are formed along the sidewalls of the contact trenches using a deposition process and an etching back process, in accordance with some embodiments. In some embodiments, the contact liners 147 are made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, SIN, HfSi, or SiO); or undoped silicon (Si).

Afterward, one or more conductive materials for the contact plugs 148A and 148B1 and contact rails 148B2 are deposited to overfill the contact trenches, in accordance with some embodiments. In some embodiments, one or more conductive materials are deposited using CVD, PVD, e-beam evaporation, ALD, electroplating (ECP), electroless deposition (ELD), another suitable method, or a combination thereof to overfill the contact openings. The one or more conductive materials over the upper surface of the second interlayer dielectric layer 146 are planarized using, for example, CMP.

The contact plugs 148A and 148B1 and the contact rails 148B2 may have a multilayer structure. For example, a barrier/adhesive layer (not shown) may optionally be deposited along the sidewalls and the bottom surfaces of the contact trenches. The barrier/adhesive layer may be made of tantalum (Ta), tantalum nitride (TaN), titanium (Ti), titanium nitride (TiN), cobalt tungsten (CoW), another suitable material, or a combination thereof. A metal bulk layer is then deposited on the barrier/adhesive layer (if formed) to fill the remainder of the contact trenches. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

Figure 1G:
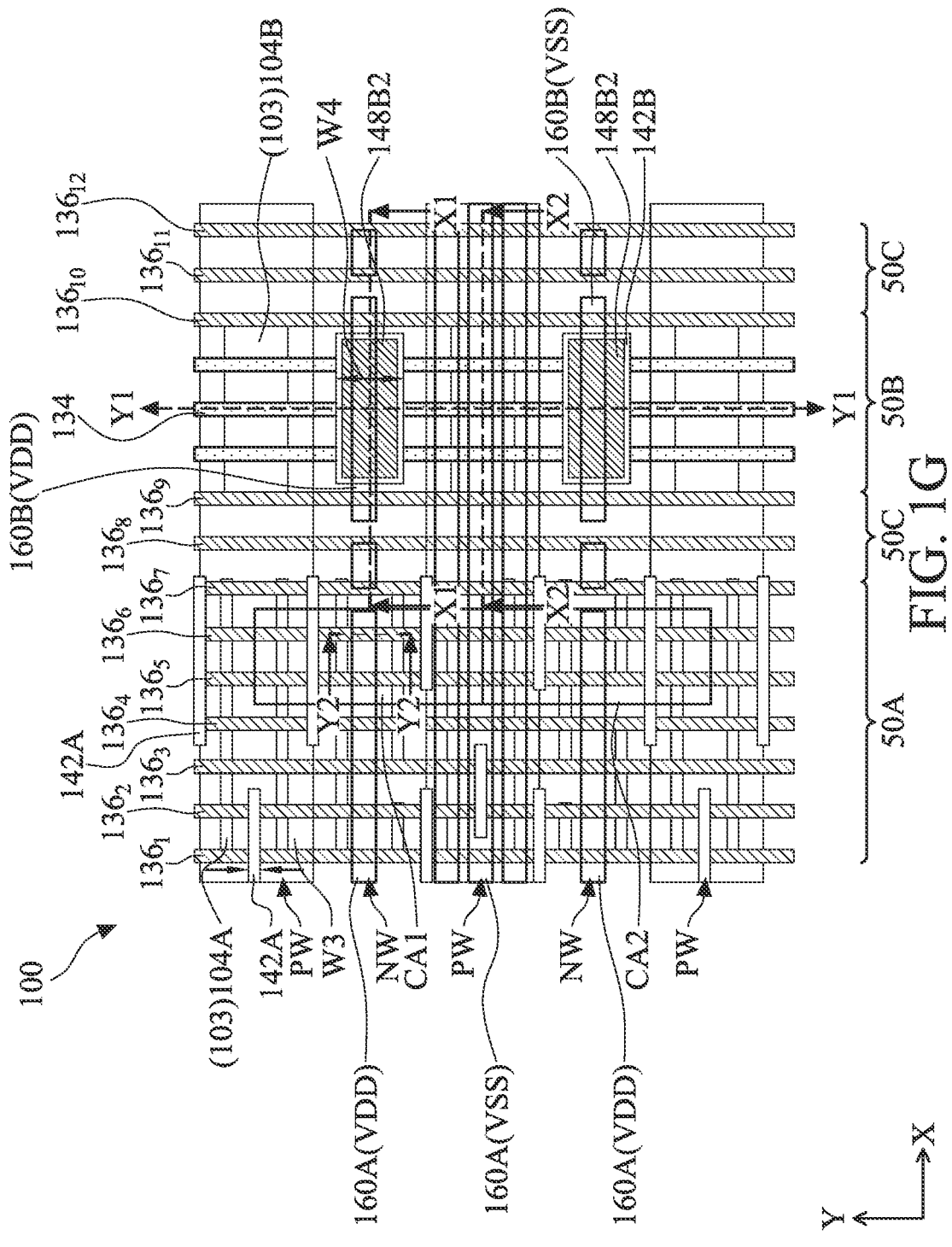
Figures 1, 1G:
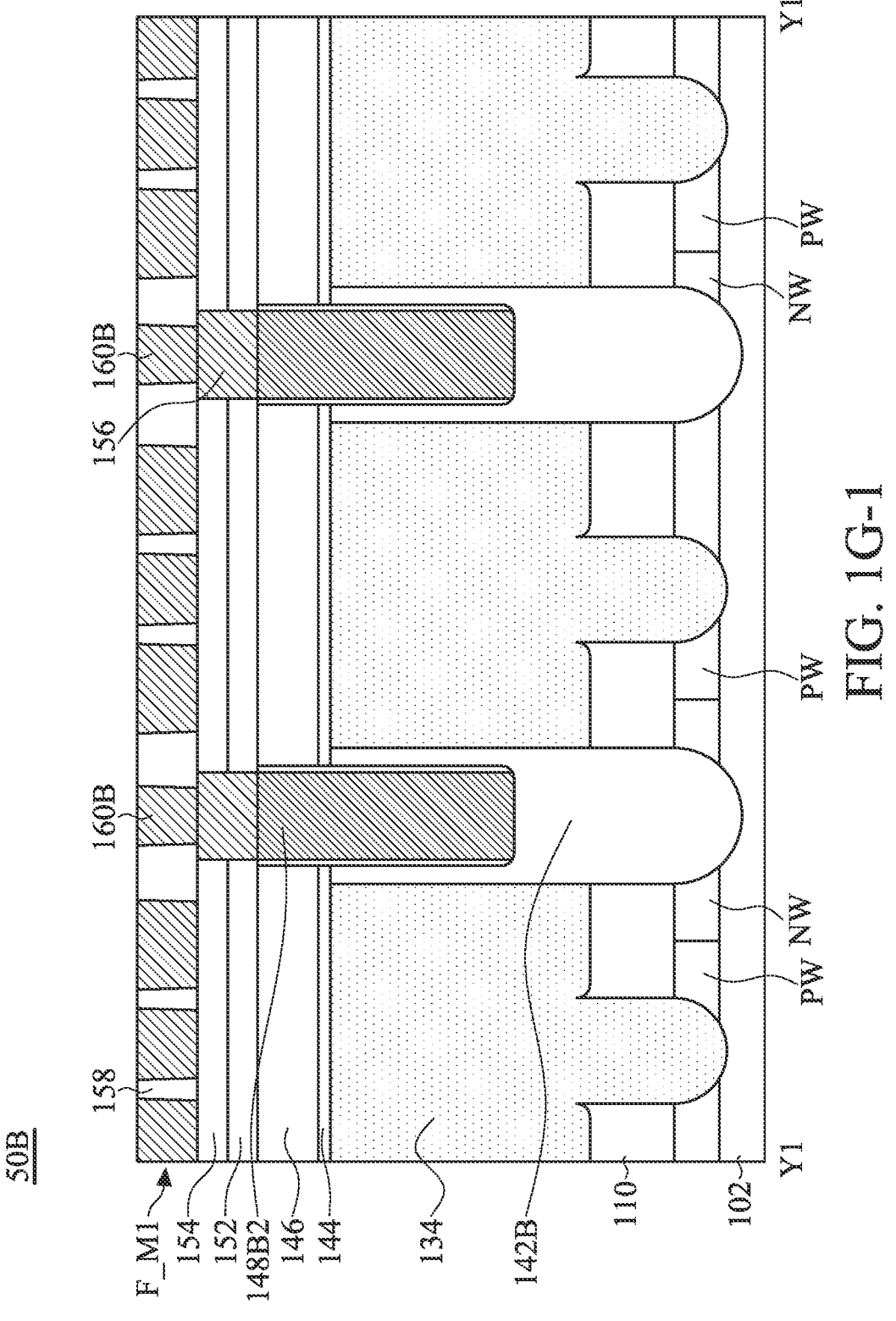
Figures 1, 1G, 2:
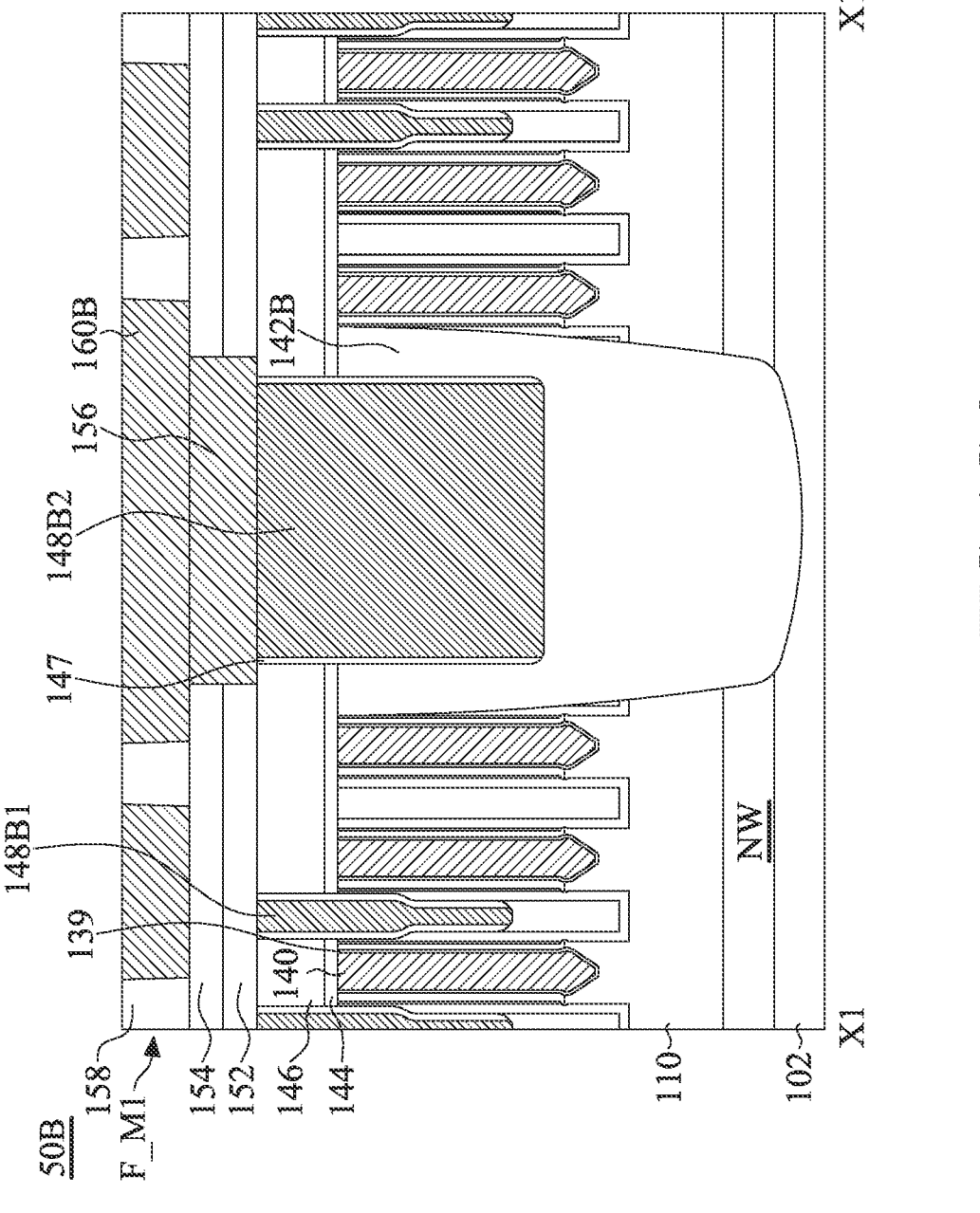
Figures 1, 1G, 2, 3:
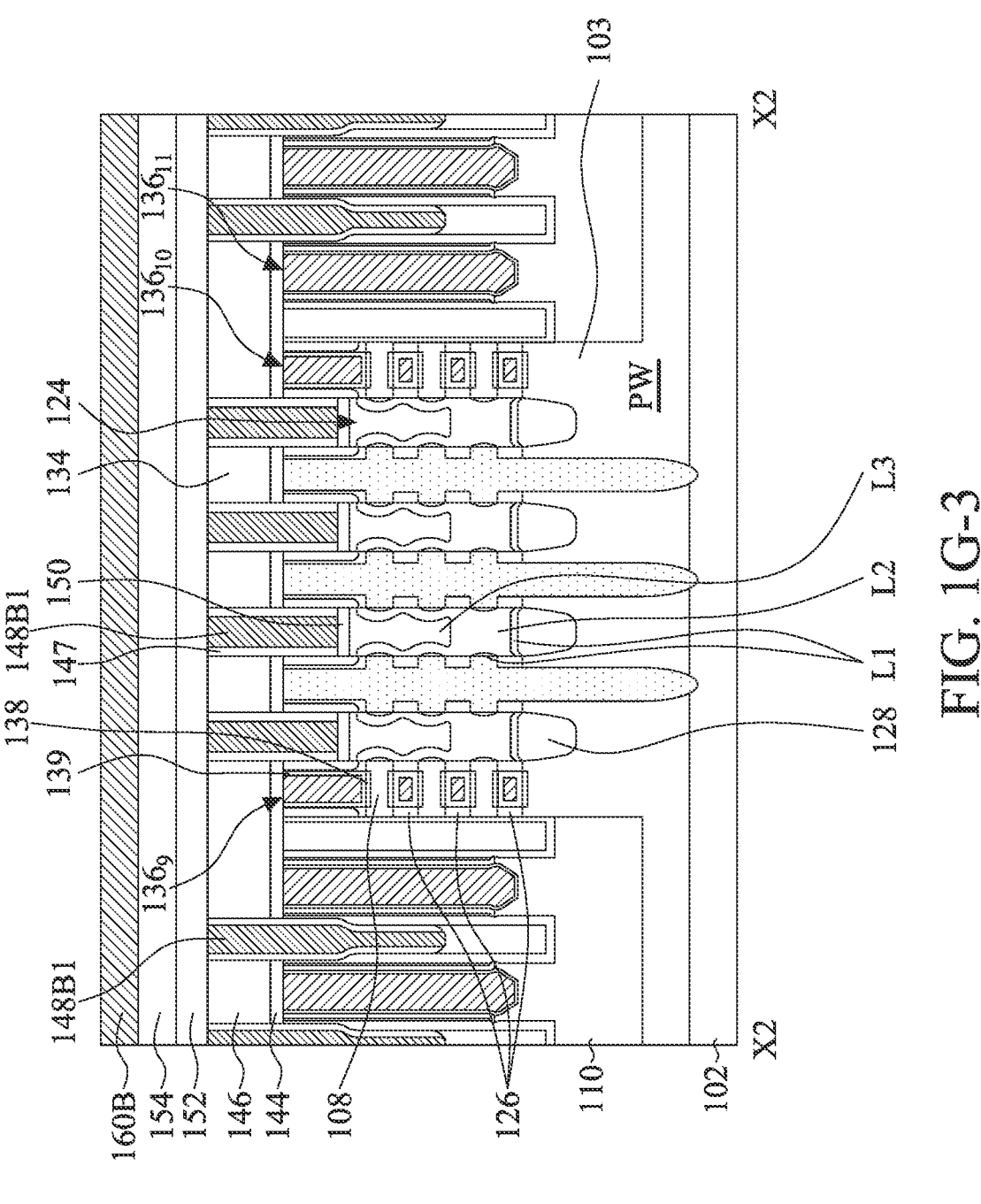
Figures 1, 1G, 2, 3, 4:
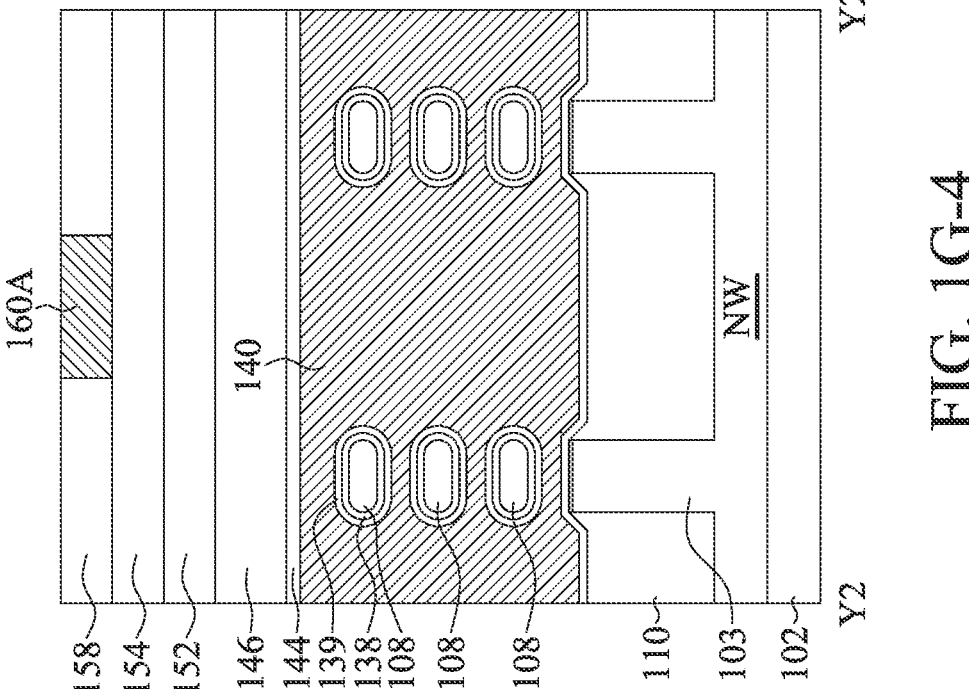

FIG. 1G is a plan view (frontside layout) of a semiconductor structure 100 illustrating the formation of etching stop layer 152, a third interlayer dielectric layer 154, vias 156, a first intermetal dielectric layer 158 and a frontside first metal layer F_M1. FIGS. 1G-1, 1G-2, 1G-3 and 1G-4 are cross-sectional views corresponding to line Y1-Y1, line X1-X1, line X2-X2 and line Y2-Y2 of FIG. 1G. An etching stop layer 152 and a third interlayer dielectric layer 154 are sequentially formed over the semiconductor structure 100, as shown in FIGS. 1G-1 to 1G-4, in accordance with some embodiments.

In some embodiments, the etching stop layer 152 is made of dielectric material, such as silicon nitride (SiN), silicon oxide ($SiO_2$), silicon oxynitride (SiON), silicon carbide (SiC), oxygen-doped silicon carbide (SiC:O), oxygen-doped silicon carbonitride (Si(O)CN), or a combination thereof. In some embodiments, the third interlayer dielectric layer 154 is made of dielectric material, such as USG, BPSG, FSG, PSG, BSG, and/or another suitable dielectric material. In some embodiments, the etching stop layer 152 and the third interlayer dielectric layer 154 are deposited using CVD (such as HDP-CVD, PECVD, HARP or FCVD), another suitable technique, or a combination thereof.

Vias 156 are formed in and/or through the etching stop layer 152 and the third interlayer dielectric layer 154 and land on the contact rails 148B2, as shown in FIGS. 1G-1 and 1G-2, in accordance with some embodiments. Although not shown, the vias 156 may also land on the contact plugs 148A and the final gate stacks 136₂₋₆ in the first area 50A. The vias 156, electrically connected to source/drain terminals of the nanostructure transistors through the contact plugs 148A, may be also referred to as source/drain vias (VS or VD), in accordance with some embodiments. The vias 156, electrically connected to the gate terminals of the nanostructure transistors, may be also referred to as gate vias (VG).

In some embodiments, the vias 156 landing on the contact rail 148B2 may extend in the X direction to increase the contact area with the contact rails 148B2, thereby reducing the contact resistance, as shown in FIG. 1G-2. In some embodiments, the extension lines of the edges of the vias 156 landing on the contact rail 148B2 extend between the edges of the contact rail 148B2 and the edges of the cutting features 142B.

In some embodiments, the formation of the vias 156 includes patterning the interlayer dielectric layer 154 and the etching stop layer 152 to form via openings (where the vias 156 are to be formed) using photolithography and etching processes. The etching process may include dry etching such as RIE, NBE, ICP etch, CCP etch, another suitable method, or a combination thereof. Afterward, one or more conductive materials are deposited using CVD, PVD, e-beam evaporation, ALD, ECP, ELD, another suitable method, or a combination thereof to overfill the via openings, in accordance with some embodiments. The one or more conductive materials over the upper surface of the third interlayer dielectric layer 154 are planarized using, for example, CMP.

The vias 156 may have a multilayer structure. For example, a barrier/adhesive layer (not shown) may optionally be deposited along the sidewalls and the bottom surfaces of the via openings. The barrier layer may be made of Ta, TaN, Ti, TiN, CoW, another suitable material, or a combination thereof. A metal bulk layer is then deposited on the barrier/adhesive layer (if formed) to fill the remainder of the via openings. In some embodiments, the metal bulk layer is made of one or more conductive materials, such as Co, Ni, W, Ti, Ta, Cu, Rh, Ir, Pt, Al, Ru, Mo, or a combination thereof.

An intermetal dielectric layer 158 is formed over the semiconductor structure 100, as shown in FIGS. 1G-1, 1G-2 and 1G-4, in accordance with some embodiments. In some embodiments, the intermetal dielectric layer 158 is made of one or more dielectric materials, such as silicon oxide (SiO), silicon nitride (SiN), silicon oxynitride (SiON), silicon carbide (SiC), aluminum oxide ($Al_2O_3$), dielectric material(s) with low dielectric constant (low-k) such as SiCOH, SiOCN, and/or SiOC, or a combination thereof. In some embodiments, the intermetal dielectric layer 158 is made of an extreme low-k (ELK) dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SILK, or porous silicon oxide ($SiO_2$). In some embodiments, the intermetal dielectric layer 158 is formed using CVD (such as LPCVD, HARP, and FCVD), ALD, spin-on coating, another suitable method, or a combination thereof. A post-curing process (e.g., UV curing) may be performed on the as-deposited ELK dielectric material for the intermetal dielectric layer 158 to form a porous structure.

A frontside first metal layer F_M1 is formed in and/or through the intermetal dielectric layer 158, as shown in FIGS. 1G to 1G-4, in accordance with some embodiments. The frontside first metal layer F_M1 includes several lines (tracks) e.g., power supply lines 160A and 160B and signal lines, in accordance with some embodiments. The lines of the frontside first metal layer F_M1 extend in the X direction, in accordance with some embodiments. That is, the lines have longitudinal axes parallel to the X direction, in accordance with some embodiments. FIG. 1G only illustrates some metal lines of the frontside metal layer F_M1 for brevity and clarity.

The power supply lines 160A and 160B include Vdd power rails providing positive voltage and Vss power rails which may be an electrical ground, in accordance with some embodiments. The signal lines are configured for signal transmission, in accordance with some embodiments. The Vdd power supply lines 160A are located in the first area 50A, and the Vdd and Vss power supply lines 160B are located in the second area 50B, in accordance with some embodiments. The Vss power supply lines 160A extends in the first area 50A and the second area 50B, in accordance with some embodiments.

The Vdd and Vss power supply lines 160A shown in FIG. 1G supply power to the power transmission cell regions CA1 and CA2, in accordance with some embodiments. In the first area 50A, the Vss power rail is electrically connected to the Vss node (e.g., source terminals) of the n-channel nanostructure transistors (in the p-type well PW) through the vias 156 and the contact plugs 148A, and the Vdd power rails are electrically connected to the Vdd node (e.g., source terminals) of the p-channel nanostructure transistors (in the n-type wells NW) through the vias 156 and the contact plugs 148A, in accordance with some embodiments. In the second area 50B, the Vss power rail and the Vdd power rail are each electrically connected to the one contact rail 148B2 through the via 156.

The signal lines may be electrically connected to the final gate stacks 136 through the vias 156, and electrically connected to the non-Vdd/Vss nodes (e.g., drain terminals) of the n-channel transistors and the p-channel transistors through vias 156 and the contact plugs 148A, in accordance with some embodiments.

In some embodiments, the formation of the frontside first metal layer F_M1 includes patterning the intermetal dielectric layer 158 using photolithography and etching processes to form trenches. The etching process may include dry etching such as RIE, NBE, ICP etch, CCP etch, another suitable method, or a combination thereof. One or more conductive materials for the frontside first metal layer F_M1 are then deposited using CVD, PVD, e-beam evaporation, ALD, ECP, ELD, another suitable method to overfill the trenches. Afterward, a planarization process such as CMP and/or an etching back process is performed to remove an excess portion of the conductive materials from the upper surface of the intermetal dielectric layer 158.

The frontside first metal layer F_M1 may have a multilayer structure. For example, a barrier/adhesive layer (not shown) may optionally be deposited along the sidewalls and the bottom surfaces of the trenches. The barrier layer may be made of Ta, TaN, Ti, TiN, CoW, another suitable material, or a combination thereof. A metal bulk layer is then deposited on the barrier/adhesive layer (if formed) to fill the remainder of the trenches. In some embodiments, the metal bulk layer is made of one or more conductive materials, such as Co, Ni, W, Ti, Ta, Cu, Rh, Ir, Pt, Al, Ru, Mo, another suitable metal material, or a combination thereof.

Figures 1, 1H:
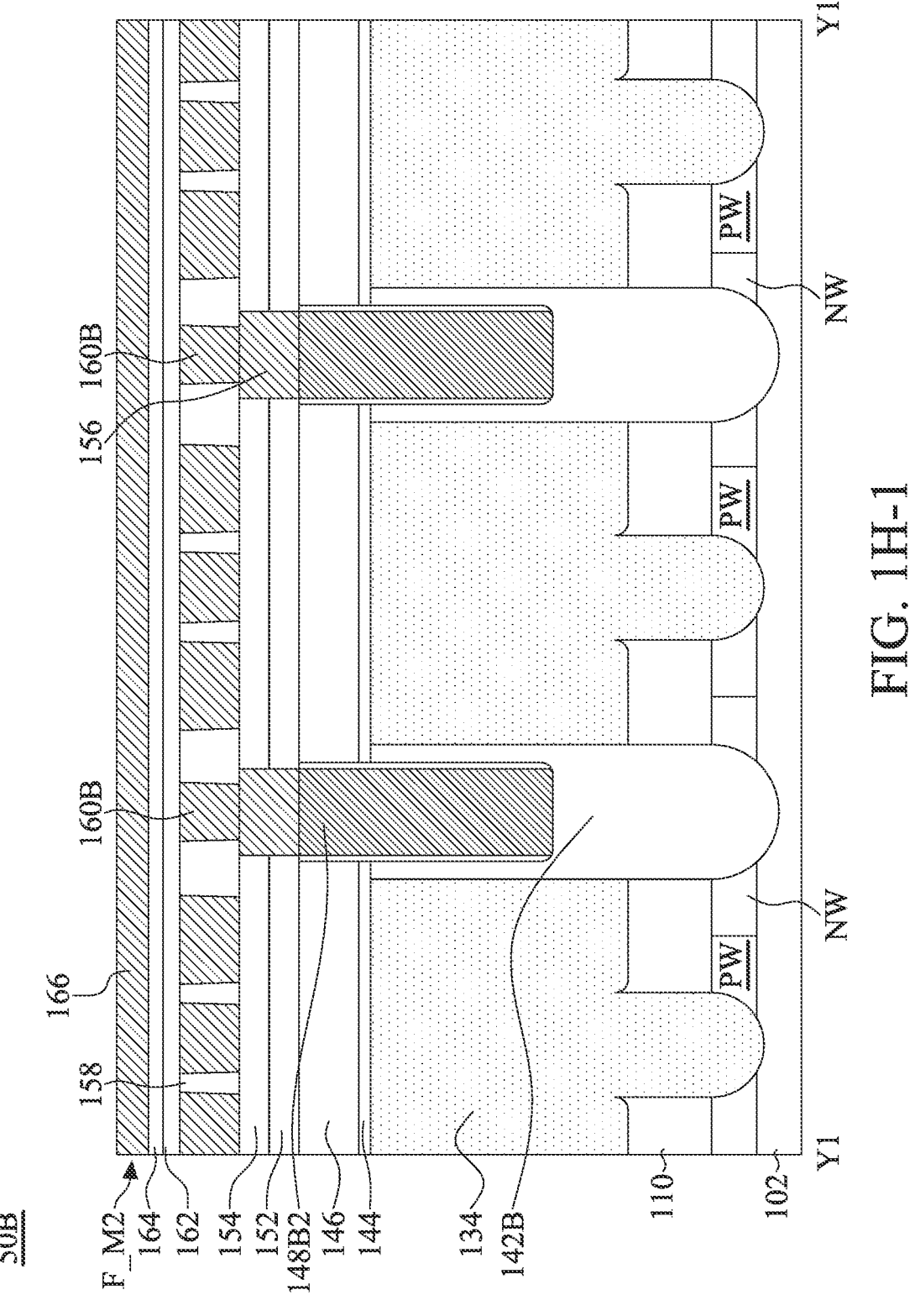
Figures 1, 1H, 2:
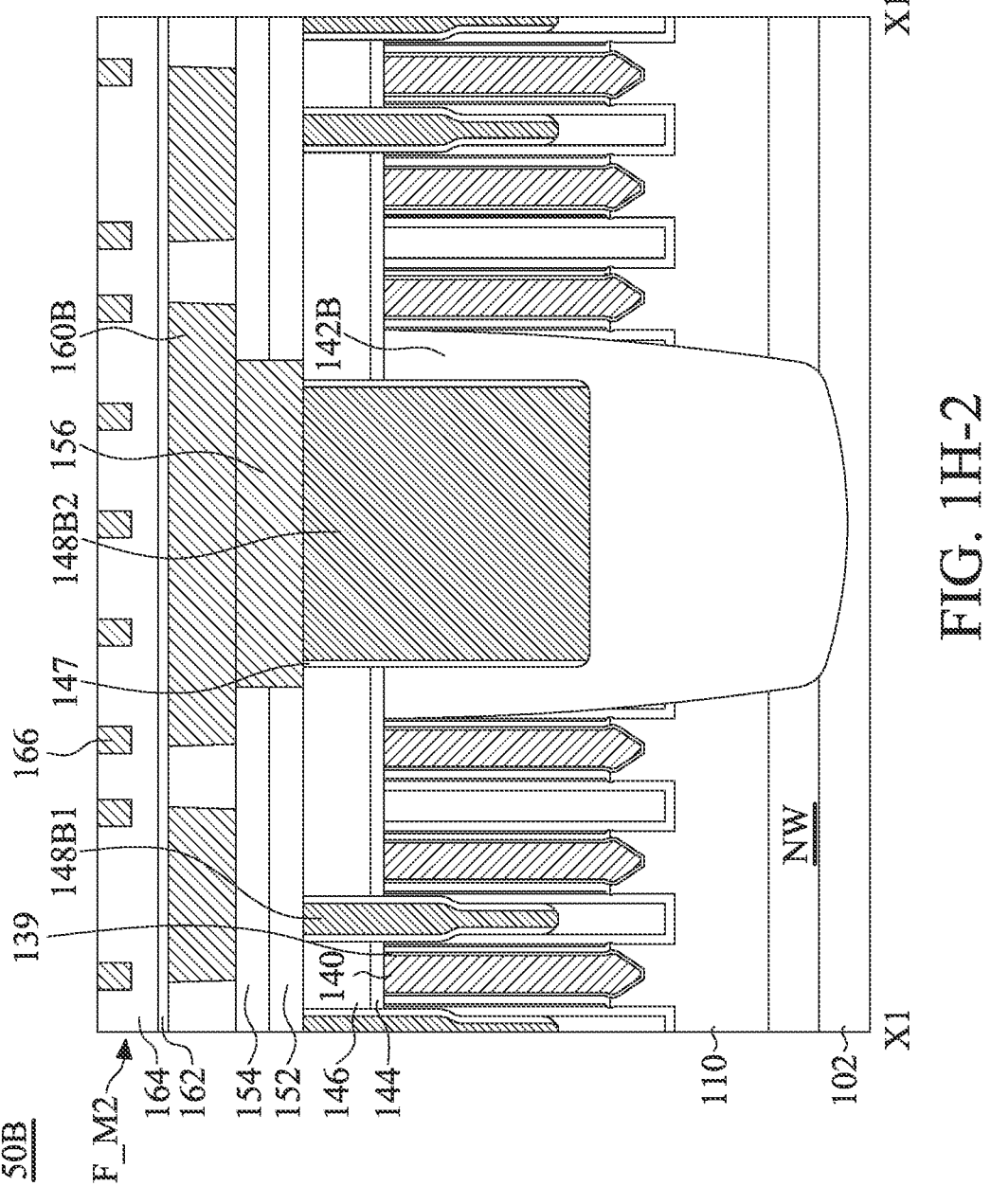

FIGS. 1H-1 and 1H-2 are cross-sectional views of a semiconductor structure 100 illustrating the formation of an etching stop layer 162, an intermetal dielectric layer 164 and a frontside second metal layer F_M2. FIGS. 1H-1 and 1H-2 correspond to line Y1-Y1, line X1-X1 of FIG. 1G. In some embodiments, an etching stop layer 162 and an intermetal dielectric layer 164 are sequentially formed over the semiconductor structure 100, as shown in FIGS. 1H-1 and 1H-2. In some embodiments, the materials and the formations of the etching stop layer 162 and the intermetal dielectric layer 164 may be similar to or substantially the same as the etching stop layer 152 and the intermetal dielectric layer 158.

A frontside second metal layer F_M2 is formed in and/or through the intermetal dielectric layer 164, as shown in FIGS. 1H-1 and 1H-2, in accordance with some embodiments. The frontside second metal layer F_M2 includes several lines (tracks) 166 electrically connected to the frontside first metal layer F_M1, in accordance with some embodiments. Although not shown, vias are formed between and electrically connected between the frontside first metal layer F_M1 and the frontside second metal layer F_M2. In some embodiments, the material and the formation of the frontside second metal layer F_M2 may be similar to or substantially the same as the frontside first metal layer F_M1.

The lines 166 of the frontside second metal layer F_M2 extend in the Y direction, in accordance with some embodiments. That is, the lines 166 have longitudinal axes parallel to the Y direction, in accordance with some embodiments. Referring back to FIGS. 1G, the Vss power rail 160B in the second area 50B is electrically connected to the Vss power rails 160A in the first area 50A and the second area 50B through the frontside second metal layer F_M2, in accordance with some embodiments. The Vdd power rail 160B in the second area 50B is electrically connected to the Vdd power rails 160A in the first area 50A through the frontside second metal layer F_M2, in accordance with some embodiments.

The semiconductor structure 100 may undergo further frontside BEOL processes to form various interconnection conductive features (not shown) over the semiconductor structure 100, such as a frontside third metal layer (F_M3) to a frontside tenth metal layer (F_M10) and vias between neighboring two metal layers. The semiconductor structure 100 may be flipped upside down, as shown FIGS. 1I-1 to 1I-4, in accordance with some embodiments. FIGS. 1I-1, 1I-2, 1I-3 and 1I-4 correspond to line Y1-Y1, line X1-X1, line X2-X2 and line Y2-Y2 of FIG. 1G. In some embodiments, a carrier substrate (not shown) may be formed over and seal the frontside of the semiconductor structure 100 to protect the frontside components of the semiconductor structure 100 during subsequent backside processes. After flipping the semiconductor structure 100, the backside surface of the substrate 102 (the backside of the semiconductor structure 100) faces upward, in accordance with some embodiments.

FIGS. 1J-1, 1J-2, 1J-3 and 1J-4 are cross-sectional views illustrating a removal process. FIGS. 1J-1, 1J-2, 1J-3 and 1J-4 correspond to line Y1-Y1, line X1-X1, line X2-X2 and line Y2-Y2 of FIG. 1G. The substrate 102, the lower fin elements 103, the isolation structure 110, the insulating strips 134 and the cutting features 142A and 142B are planarized from the backside of the semiconductor structure 100 using such as CMP, grinding process, an etching process, or a combination thereof until the sacrificial layers 128 are exposed, as shown in FIGS. 1J-1 to 1J-4, in accordance with some embodiments.

Figures 1, 1L:
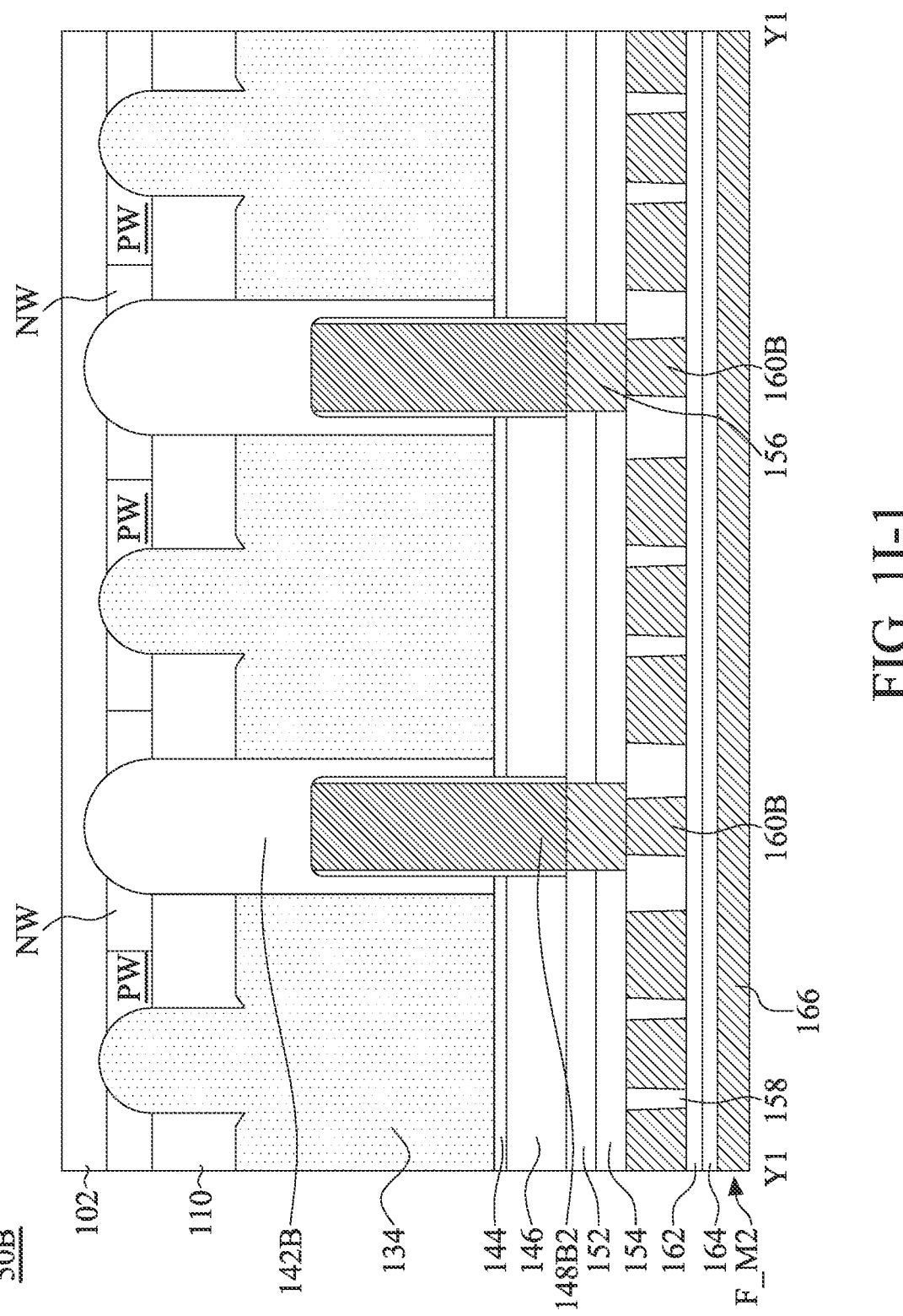
Figures 1, 1I, 2:
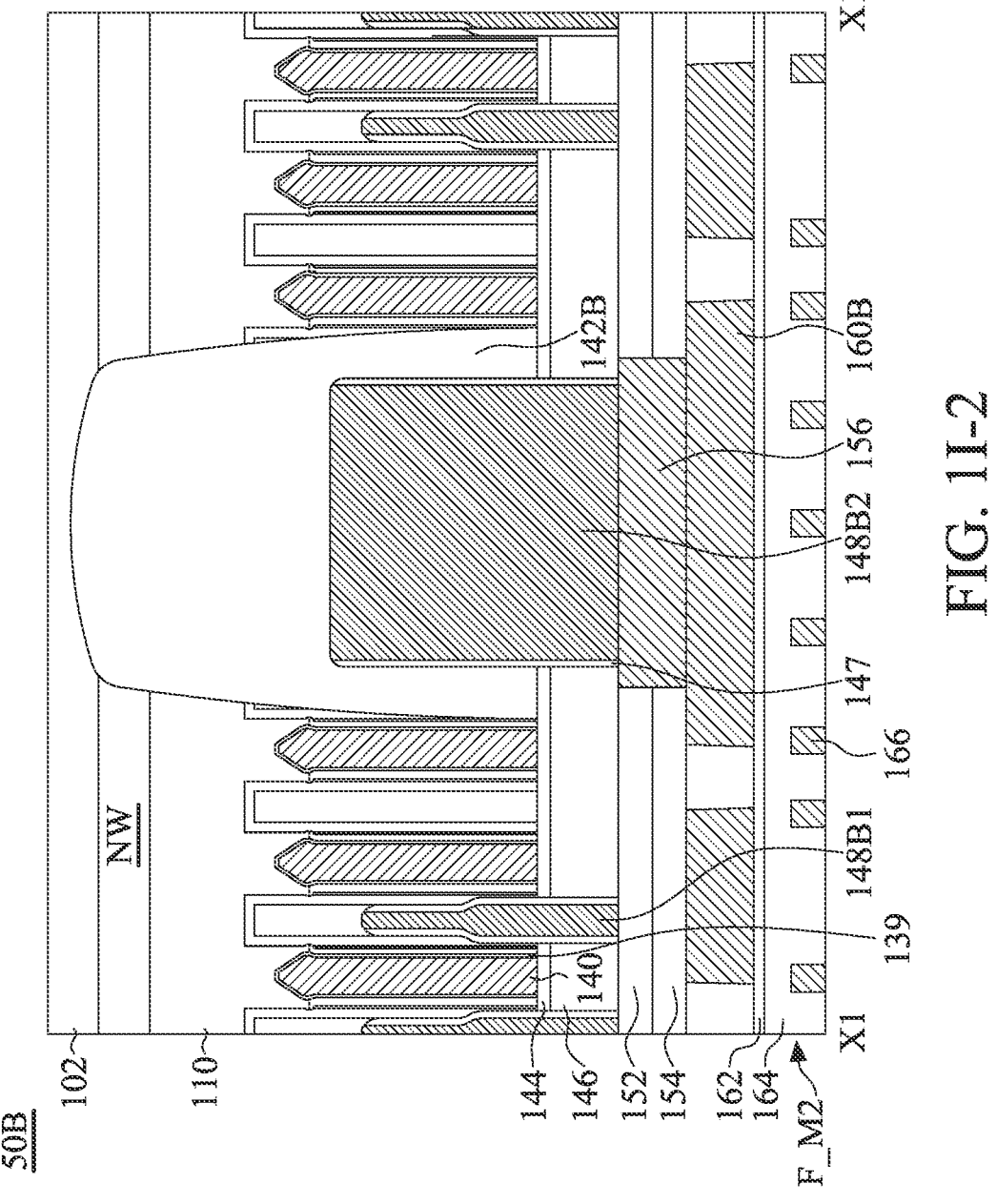
Figures 1, 1I, 2, 3:
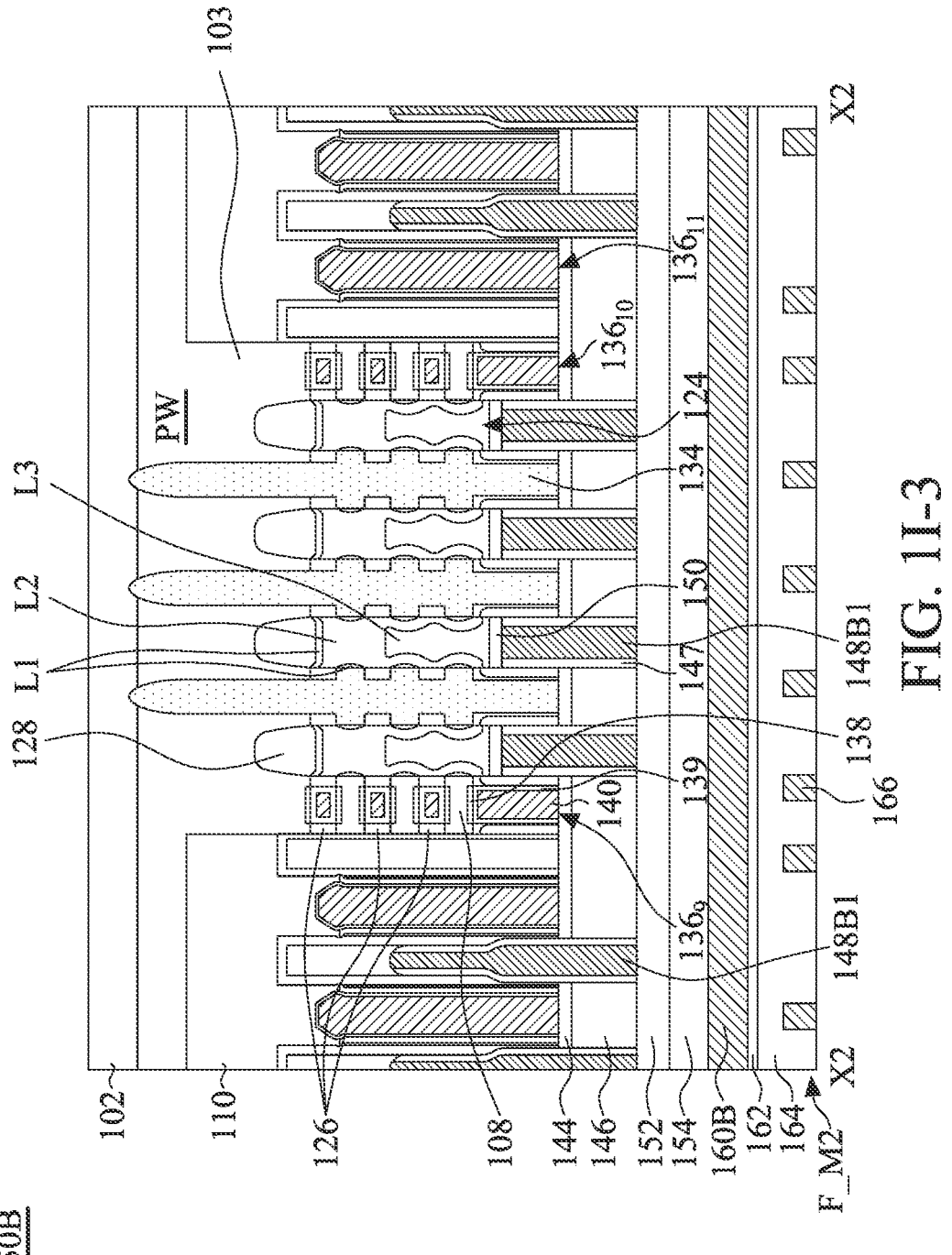
Figures 1, 1I, 2, 3, 4:
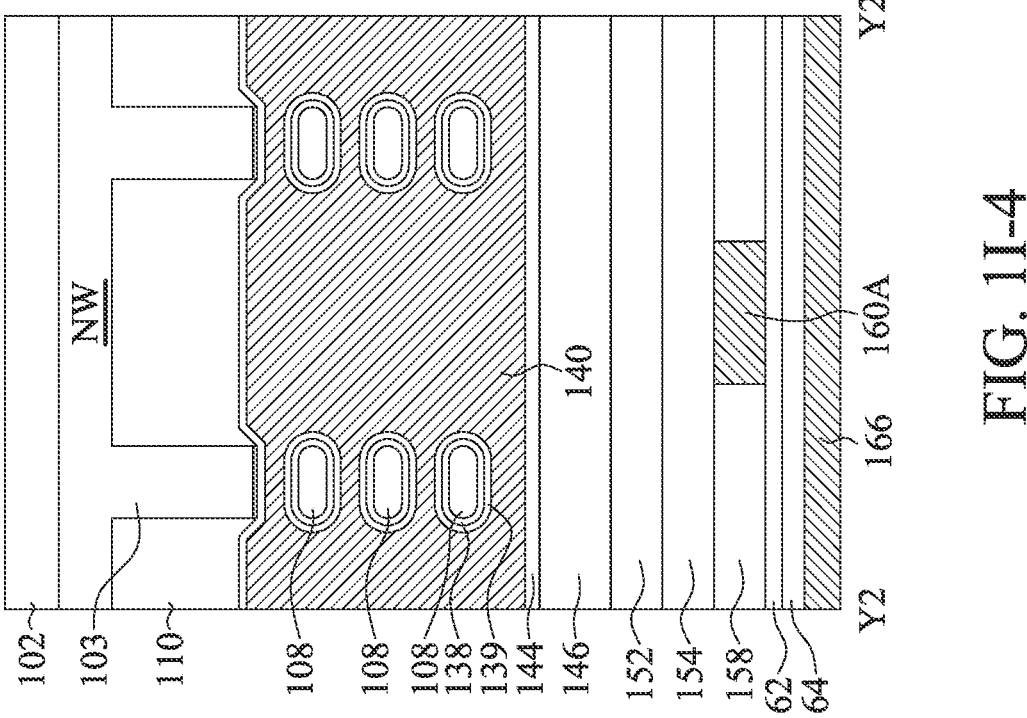
Figures 1, 1J:
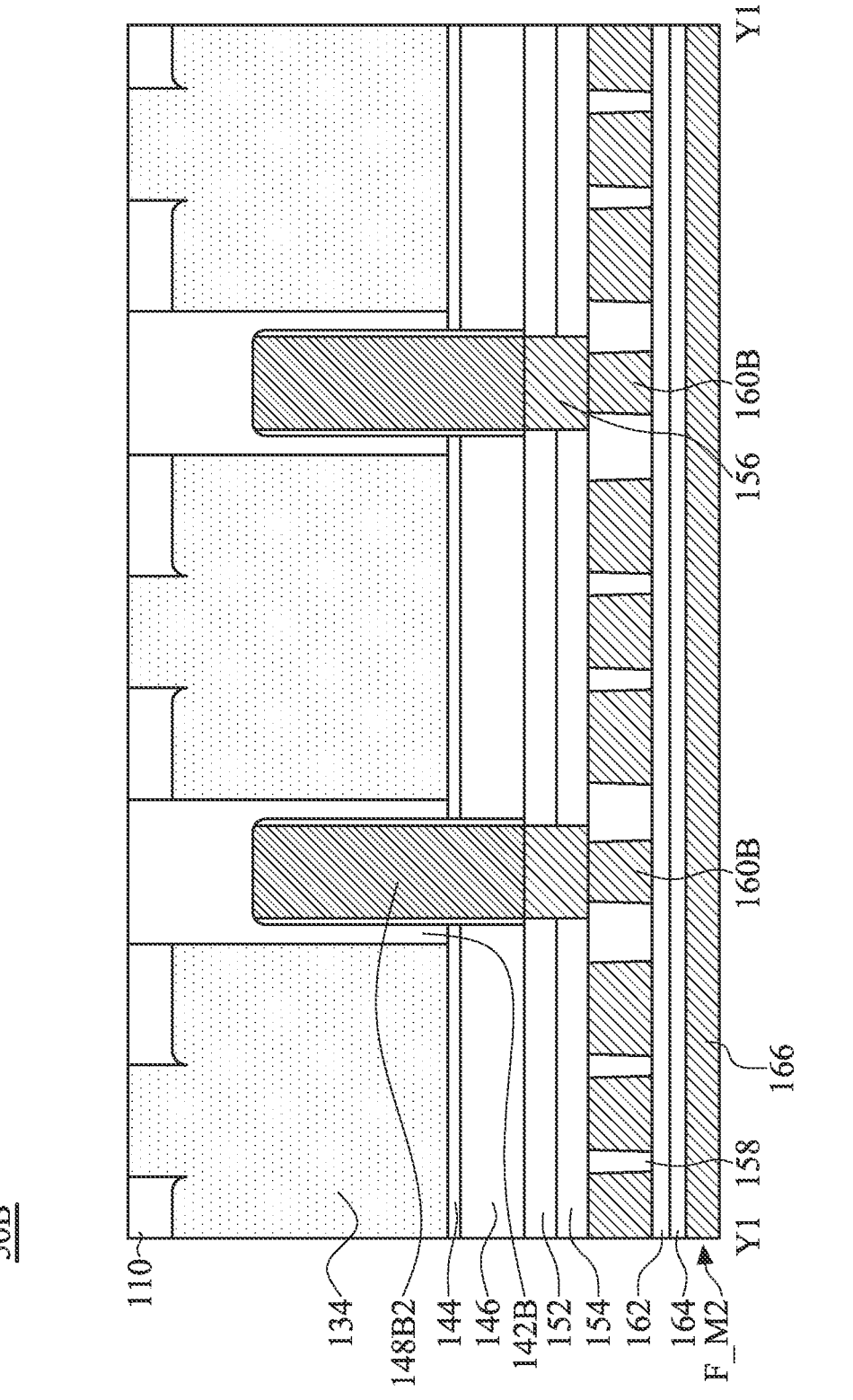
Figures 1, 1J, 2:
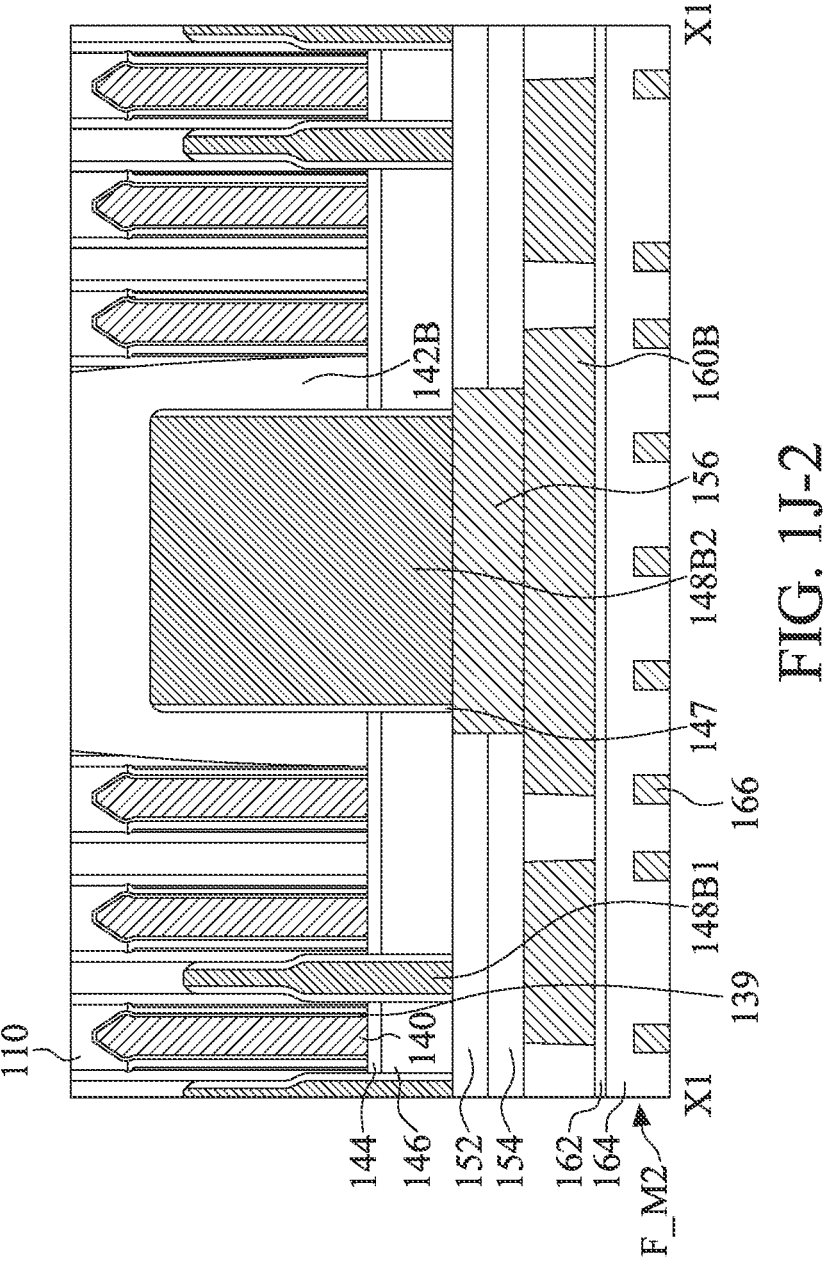
Figures 1, 1J, 2, 3:
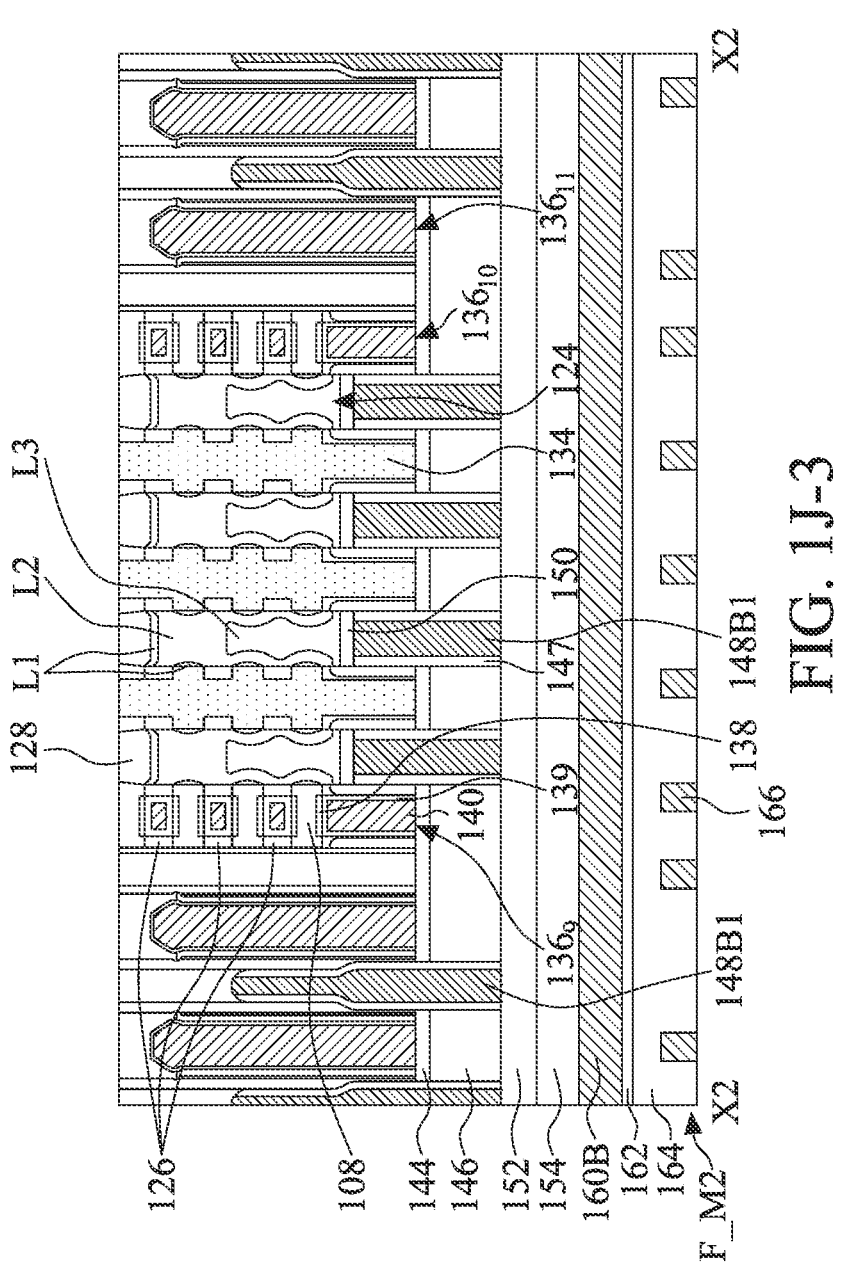
Figures 1, 1J, 2, 3, 4:
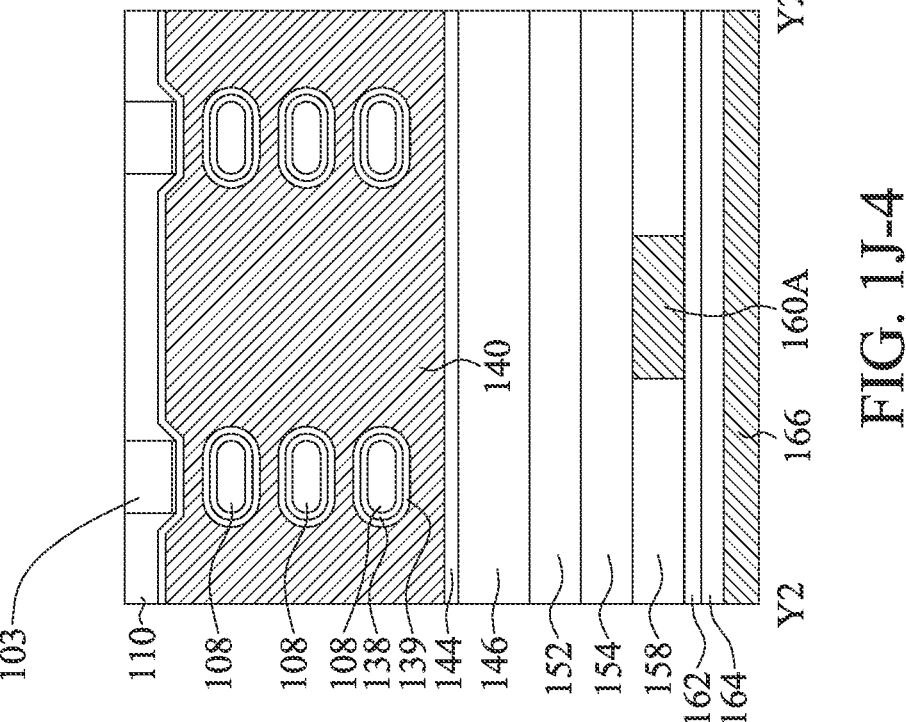
Figure 1K:
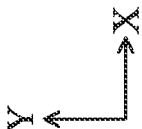
Figures 1, 1K:
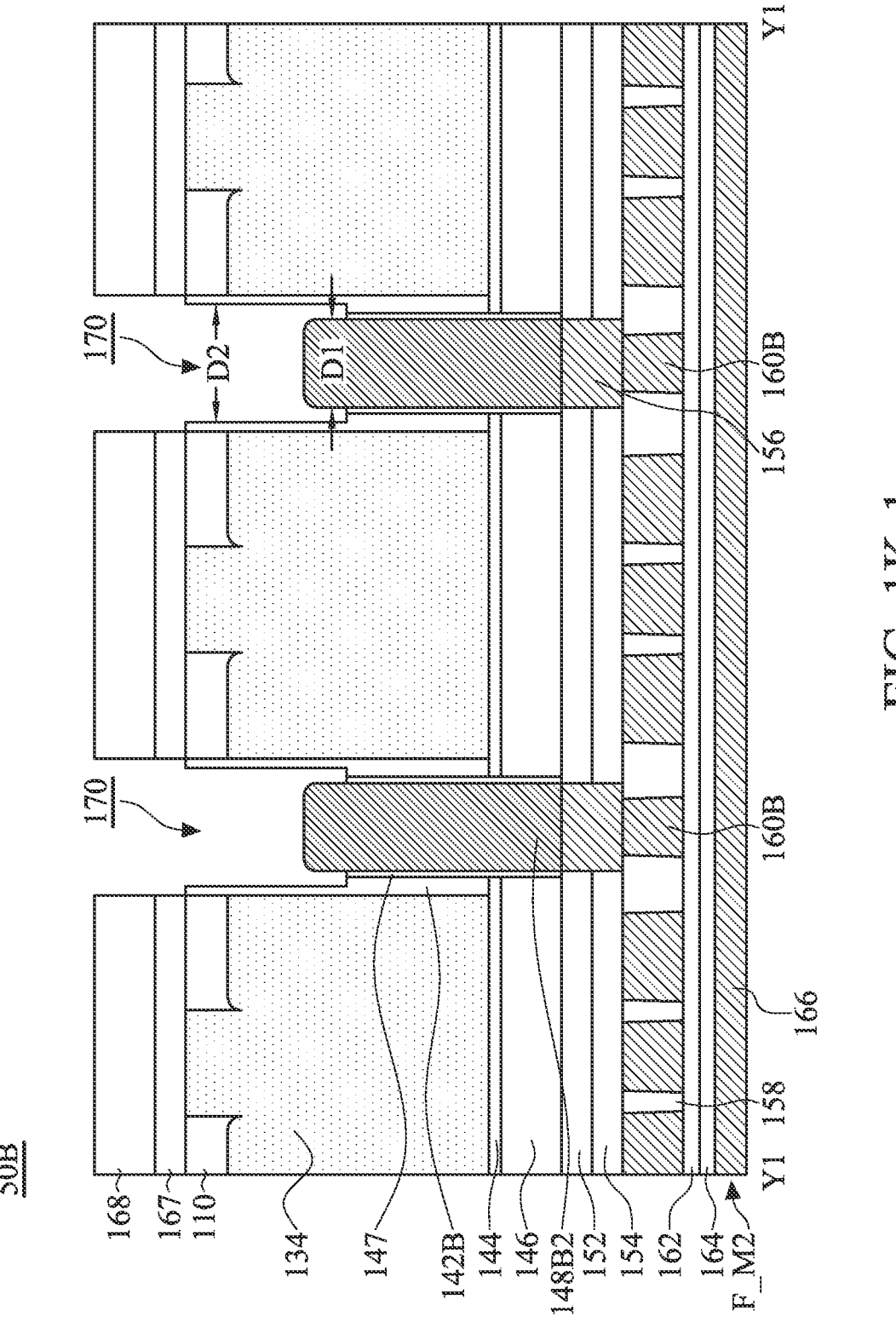
Figures 1, 1K, 2:
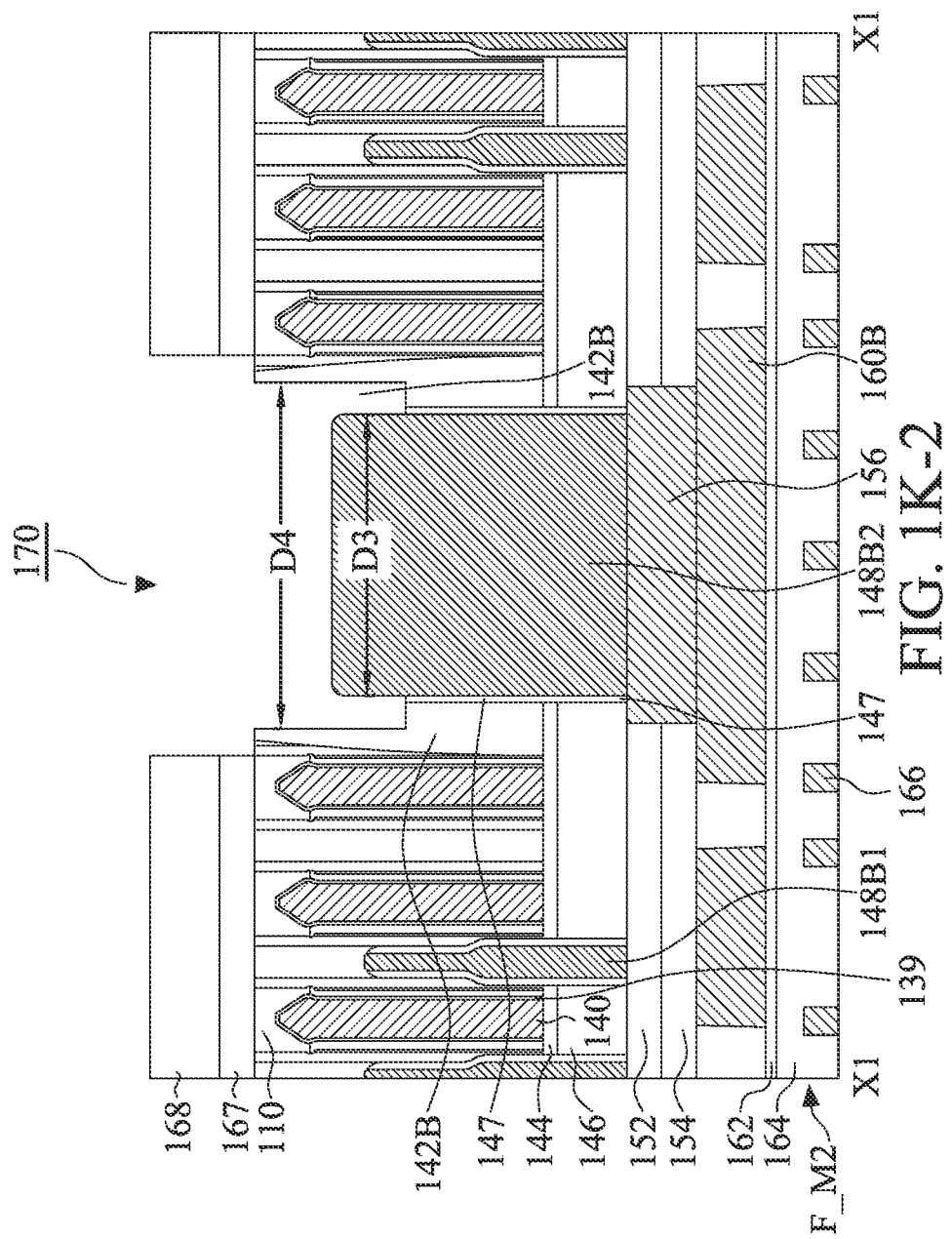
Figure 1L:
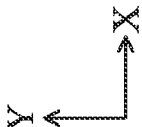
Figures 1, 1L:
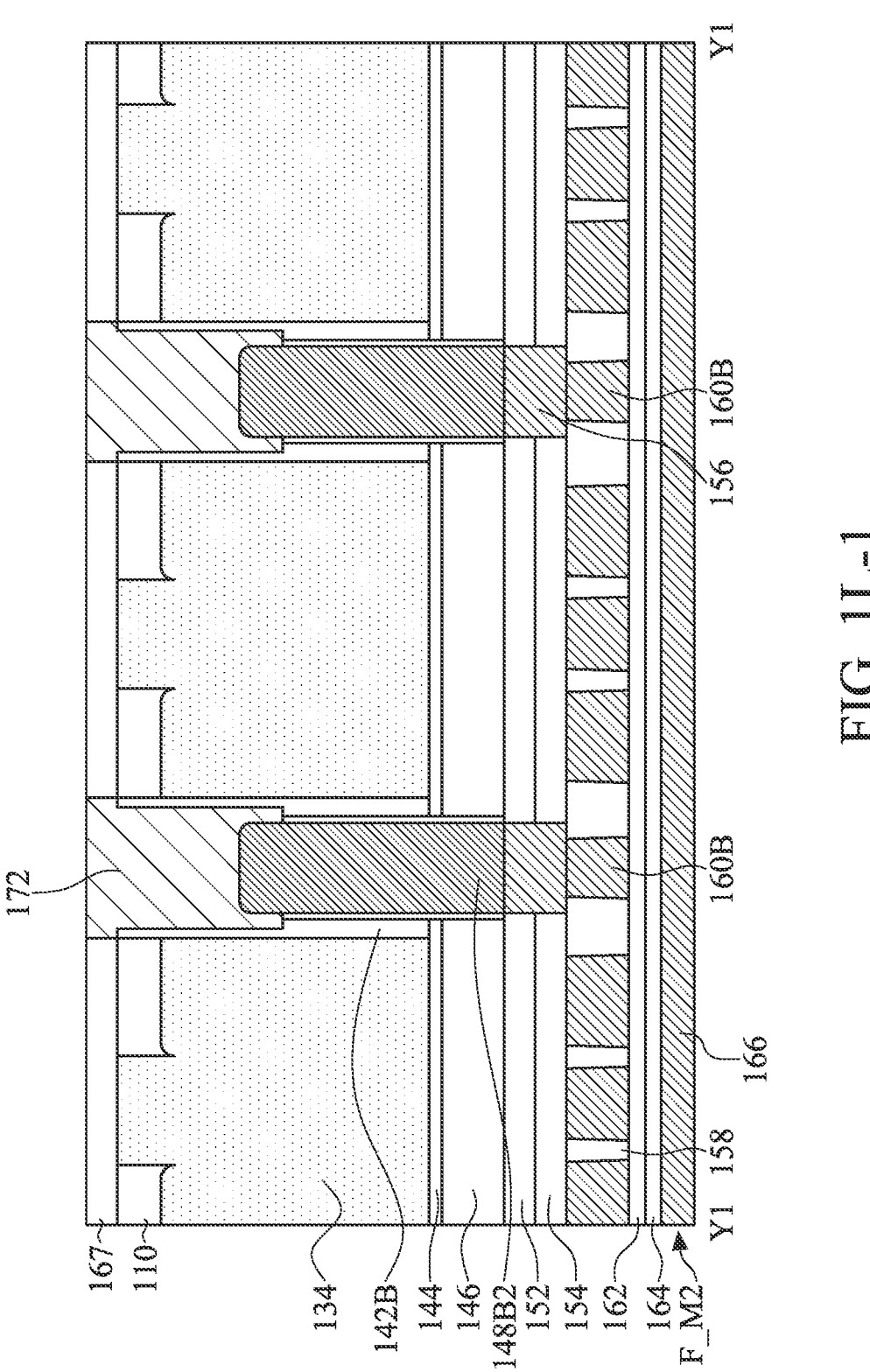
Figures 1, 1L, 2:
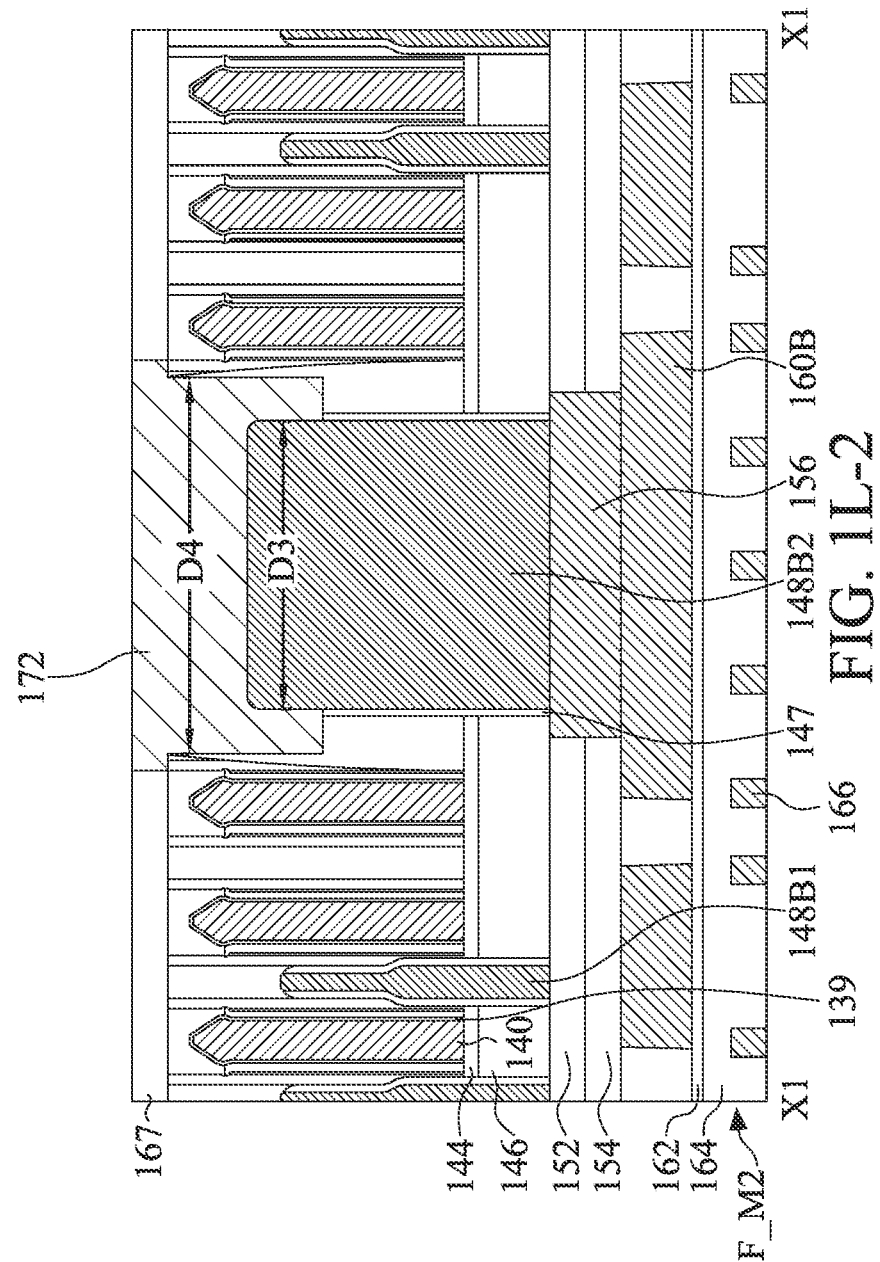
Figures 1, 1L, 2, 3:
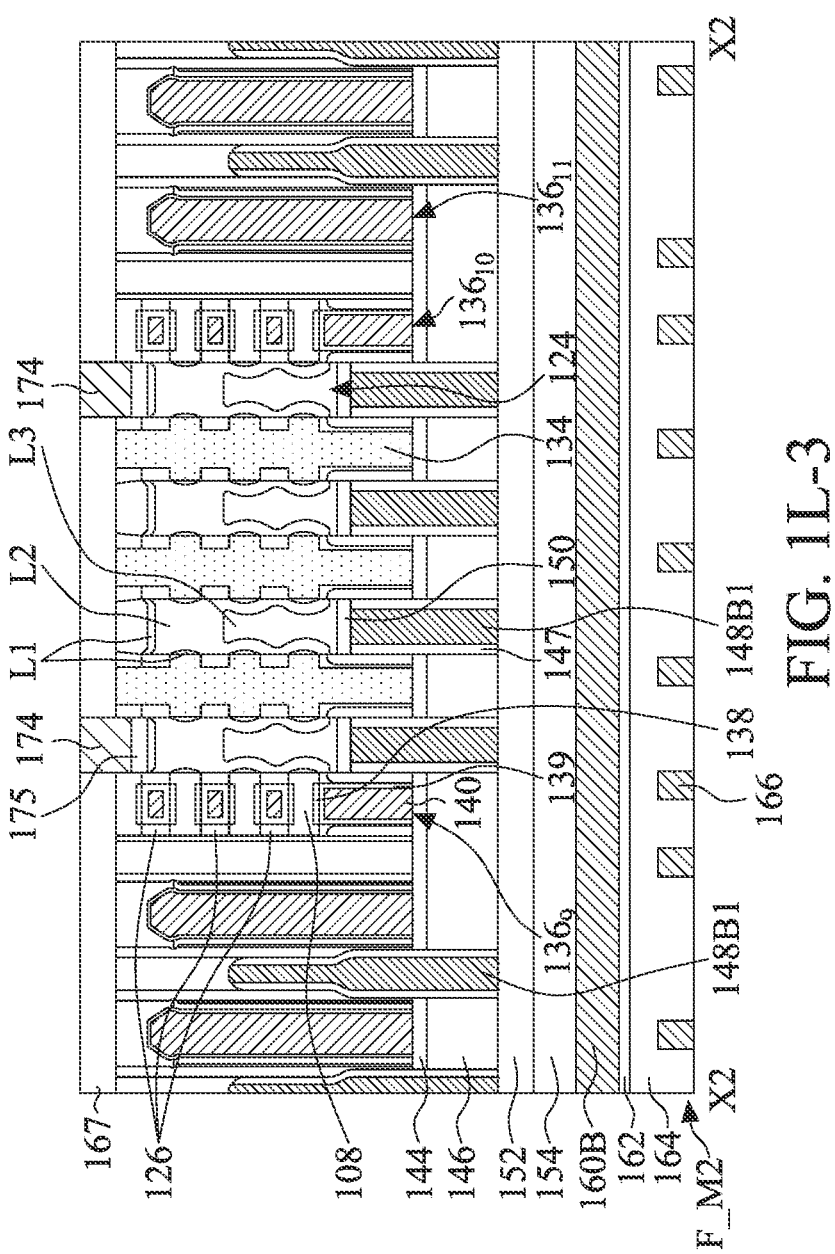
Figures 1, 1L, 2, 3, 4:
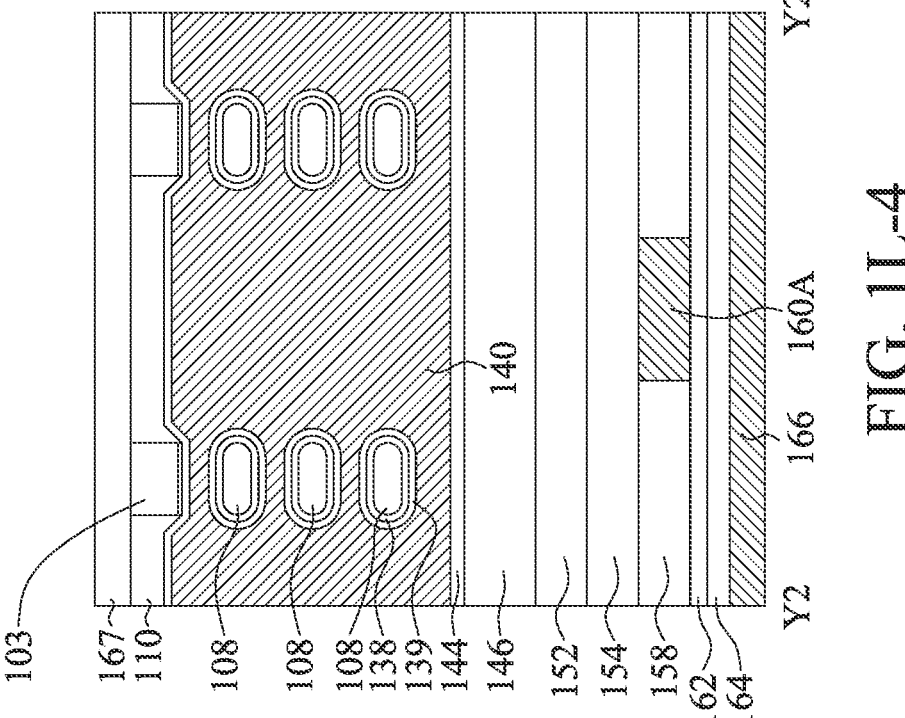

FIG. 1K is a plan view (backside layout) of a semiconductor structure 100 illustrating the formation of a dielectric layer 167 and trenches 170. FIGS. 1K-1 and 1K-2 are cross-sectional views corresponding to line Y1-Y1 and line X1-X1 of FIG. 1K. A dielectric layer 167 and a patterned mask layer 168 is subsequently formed over the backside of the semiconductor structure 100, as shown in FIGS. 1K-1 and 1K-2, in accordance with some embodiments. The dielectric layer 167 is made of one or more dielectric material such as silicon oxide (SiO$_2$), silicon nitride (SIN), silicon carbide (SiC), silicon oxynitride (SiON), silicon carbon nitride (SiCN), silicon oxycarbonitride (SiOCN), oxygen-doped silicon carbonitride (Si(O)CN), and/or a combination thereof. In some embodiments, the dielectric layer 167 is deposited using ALD, CVD (such as PECVD, LPCVD or HARP), another suitable technique, or a combination thereof.

The patterned mask layer 168 has trench patterns which expose the dielectric layer 167 and correspond to (or overlapping) the contact rails 148B2, in accordance with some embodiments. In some embodiments, the patterned mask layer 168 is a patterned photoresist layer. For example, a photoresist may be formed over the backside of the semiconductor structure 100 such as by using spin-on coating, and patterned by exposing the photoresist to light using an appropriate photomask. Exposed or unexposed portions of the photoresist may be removed depending on whether a positive or negative resist is used.

In alternative embodiments, the patterned mask layer 168 is a patterned hard mask layer. The patterned mask layer 168 may be made of metal oxide (e.g., AlO, TiO, LaO, HfO, etc.), a nitrogen-free anti-reflection layer (NFARL), carbon-doped silicon dioxide (e.g., SiO$_2$:C), titanium nitride (TiN), boron nitride (BN), a multilayer thereof, another suitable material, or a combination thereof. For example, a material for the patterned mask layer 168 is deposited, and a patterned photoresist layer may be formed over the material for the patterned mask layer 168 using the photolithography process described above. The material for the patterned mask layer 168 may be etched using the patterned photoresist layer to form the patterned mask layer.

An etching process is performed on the semiconductor structure 100 using the patterned mask layer 168 to form trenches 170 through the dielectric layer 167 and the cutting features 142B, as shown in FIGS. 1K and 1K-2, in accordance with some embodiments. The etching process may include dry etching such as RIE, NBE, ICP etch, CCP etch, another suitable method, or a combination thereof. The trenches 170 expose the backside surfaces (i.e., the top surfaces in the current schematics) and the sidewalls of the contact rails 148B2, in accordance with some embodiments.

In some embodiments, the trenches 170 extend in the X direction. That is, the trenches 170 have longitudinal axes parallel to the X direction, in accordance with some embodiments. The trenches 170 are entirely confined within the area of the cutting features 142B in the plan view, in accordance with some embodiments. In some embodiments, the dimension D1 (or width) of the contact rail 148B2 in the Y direction is less than the dimension D2 (or width) of the trench 170 in the Y direction. In some embodiments, the dimension D3 (or length) of the contact rail 148B2 in the X direction is less than the dimension D4 (or length) of the trench 170 in the X direction.

FIG. 1L is a plan view (backside layout) of a semiconductor structure 100 illustrating the formation of via rails 172 and vias 174. FIGS. 1L-1, 1L-2, 1L-3 and 1L-4 are cross-sectional views corresponding to line Y1-Y1, line X1-X1, line X2-X2 and line Y2-Y2 of FIG. 1L. The via rails 172 are formed in the trenches 170, as shown in FIGS. 1L and 1L-2, in accordance with some embodiments. The via rails 172 land on and are electrically connected to the contact rails 148B2, in accordance with some embodiments. The via rails 172 are in direct contact with the backside surfaces (i.e., the top surfaces in the current schematics) and the sidewalls of the contact rails 148B2, in accordance with some embodiments. In some embodiments, a portion of the contact rail 148B2 is surrounded by the via rail 172.

In some embodiments, power transmission cell regions CB1 and CB2 are formed and arranged in the second area 50B, and include electric connection structures constituted of the via rails 172 and the contact rails 148B2. The power transmission cell regions CB1 and CB2 are configured to transfer the power supplied from the backside metal layers of the semiconductor structure 100 to the frontside metal lines of the semiconductor structure 100, in accordance with some embodiments. The power transmission cell regions CB1 and CB2 do not have functional transistors therein, in accordance with some embodiments. In some embodiments, the via rail 172 serve as a bottom portion of the electrical connection structure of the power transmission cell regions.

In some embodiments, the formation of the via rails 172 includes depositing one or more conductive materials for the via rails 172 to overfill the trenches 170, in accordance with some embodiments. In some embodiments, one or more conductive materials are deposited using CVD, PVD, e-beam evaporation, ALD, ECP, ELD, another suitable method, or a combination thereof to overfill the trenches 170. The one or more conductive materials over the upper surface of the dielectric layer 167 are planarized using, for example, CMP. The patterned mask layer 168 is also removed, in accordance with some embodiments.

The via rails 172 may have a multilayer structure. For example, a barrier/adhesive layer (not shown) may optionally be deposited along the sidewalls and the bottom surfaces of the trenches 170. The barrier/adhesive layer may be made of Ta, TaN, Ti, TIN, CoW, another suitable material, or a combination thereof. A metal bulk layer is then deposited on the barrier/adhesive layer (if formed) to fill the remainder of the trenches 170. In some embodiments, the metal bulk layer is made of one or more conductive materials, such as Co, Ni, W, Ti, Ta, Cu, Rh, Ir, Pt, Al, Ru, Mo, or a combination thereof.

In some embodiments, the via rails 172 extend in the X direction. That is, the via rails 172 have longitudinal axes parallel to the X direction, in accordance with some embodiments. The via rails 172 are entirely confined within the area of the cutting features 142B in the plan view, in accordance with some embodiments. In some embodiments, the dimension D1 (or width) of the contact rail 148B2 in the Y direction is less than the dimension D2 (or width) of the via rail 172 in the Y direction. In some embodiments, the dimension D3 (or length) of the contact rail 148B2 in the X direction is less than the dimension D4 (or length) of the via rail 172 in the X direction.

In some embodiments, the semiconductor structure 100 is used to form high-density devices and has cell regions with small cell height (i.e., dimension in the Y direction). According to the design rule for patterning active regions of high-density devices, one active region 104B may be formed in the p-type well PW on the boundary between the power transmission cell regions CB1 and CB2 in order to maintain the stability of the patterning process forming the active regions 104B. As a result, there is no space forming an isolation feature (e.g., a cutting feature 142B) on the boundary between the power transmission cell regions CB1 and CB2. In the case where the semiconductor structure is used to form high-current devices and has cell regions with large cell height. For example, the ratio of the small cell height (of high-density devices) to the large cell height (of high-current devices) may be in a range from about 0.5 to about 0.95. According to the design rule for patterning active regions of high-current devices, an isolation structure (e.g., isolation structure 110) is located on the boundary between the power transmission cell regions, and thus there is a space to form an isolation feature (e.g., a cutting feature 142B).

In accordance with the embodiments of the present disclosure, the dummy gate structures 11210-12 are replaced with the insulating strips 134 instead of the metal gate stacks 136. In the instance where the dummy gate structures 11210-12 are replaced with the metal gate stacks, the portions of the metal gate stacks between the power transmission cell regions CB1 and CB2 may provide leakage paths. Therefore, the formation of the insulating strips 134 may reduce the risk of leakage between the power transmission cell regions CB1 and CB2. The embodiments of the present disclosure may facilitate the manufacture of high-density devices with power transmission cell regions.

Vias 174 are formed in and/or through the dielectric layer 167 and the lower fin element 103 and land on the backside surfaces (i.e., the top surfaces in the current schematics) of the source/drain features 124, as shown in FIG. 1L-3, in accordance with some embodiments. In some embodiments, the formation of the vias 174 includes patterning the dielectric layer 167 and the sacrificial layers 128 to form via openings (where the vias 174 are to be formed) using photolithography and etching processes. The etching process may include dry etching such as RIE, NBE, ICP etch, CCP etch, another suitable method, or a combination thereof. In some embodiments, the sacrificial layers 128 are substantially entirely removed.

Silicide layers 175 are formed on the exposed backside surfaces of the source/drain features 124, in accordance with some embodiments. In some embodiments, the silicide layers 175 are made of WSi, NiSi, TiSi and/or CoSi. In some embodiments, the formation of the silicide layers 175 may be similar to the formation of the silicide layers 150. Afterward, one or more conductive materials for the contact vias 174 are deposited to overfill the via openings, in accordance with some embodiments. In some embodiments, the conductive materials (e.g., Co, Ni, W, Ti, Ta, Cu, Rh, Ir, Pt, Al, Ru, Mo, or a combination thereof) are deposited using CVD, PVD, e-beam evaporation, ALD, ECP, ELD, another suitable method, or a combination thereof to overfill the contact openings. The one or more conductive materials are planarized using, for example, CMP until the dielectric layer 167 is exposed.

Figure 1M:
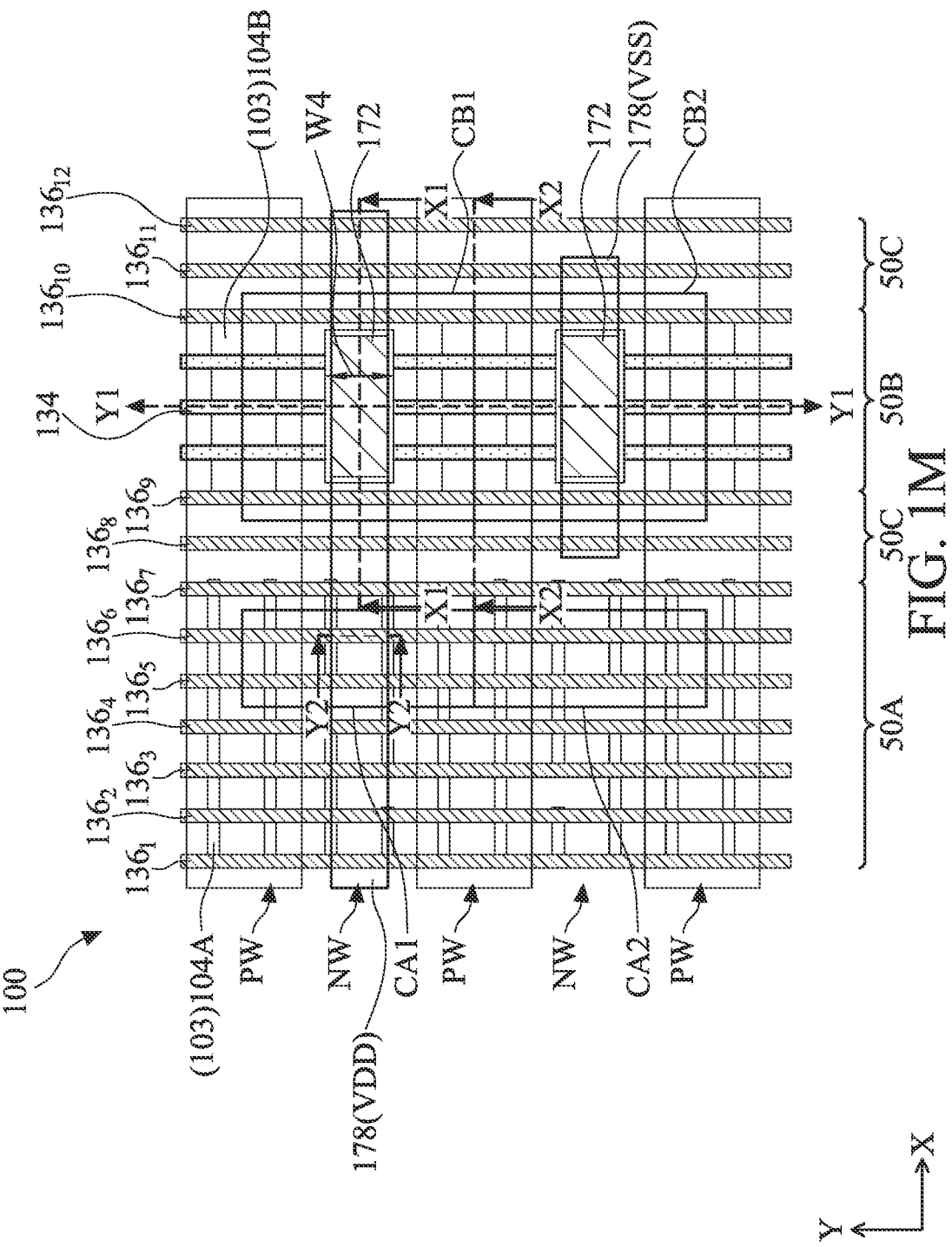
Figures 1, 1M:
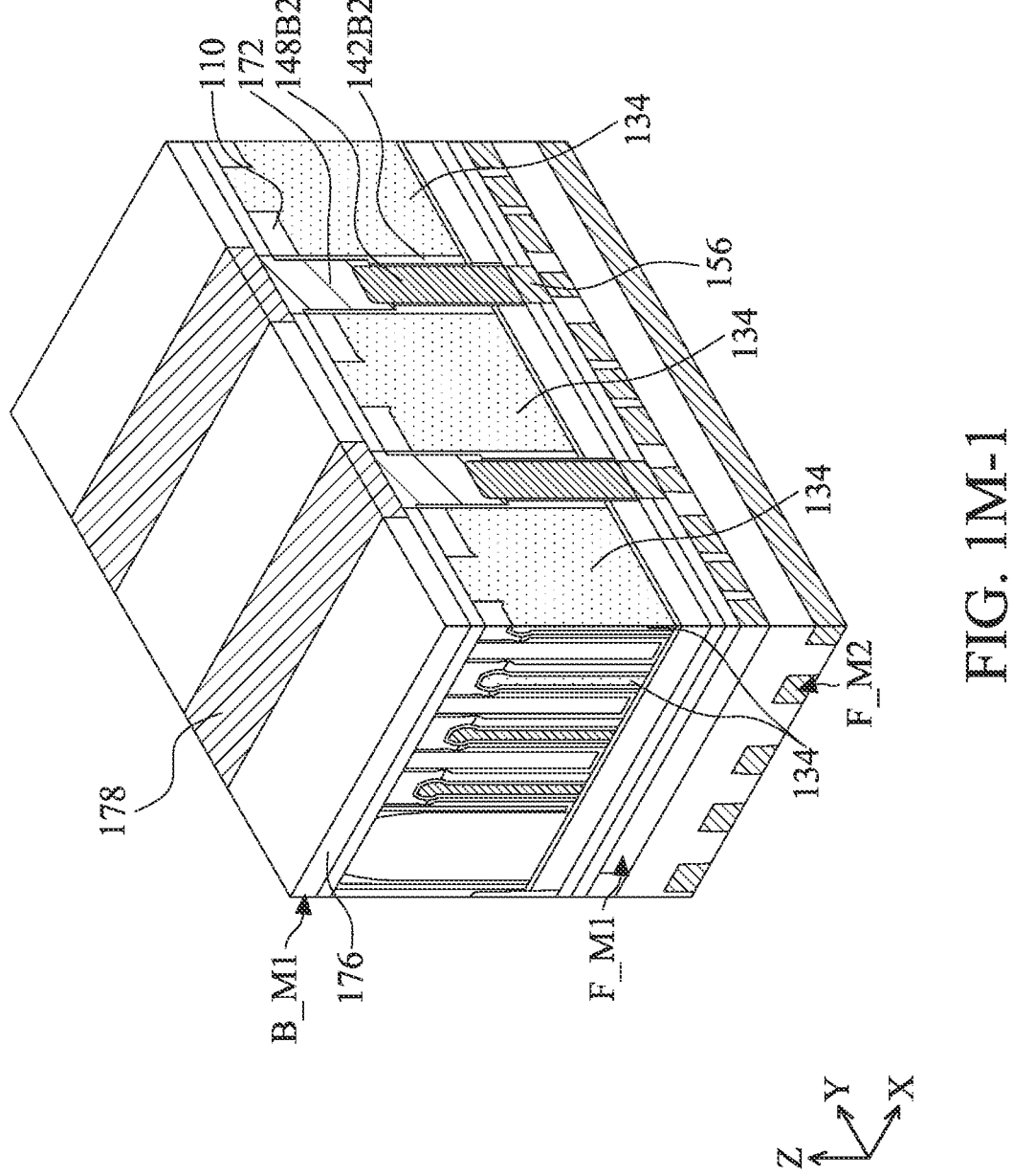
Figures 1, 1M, 2:
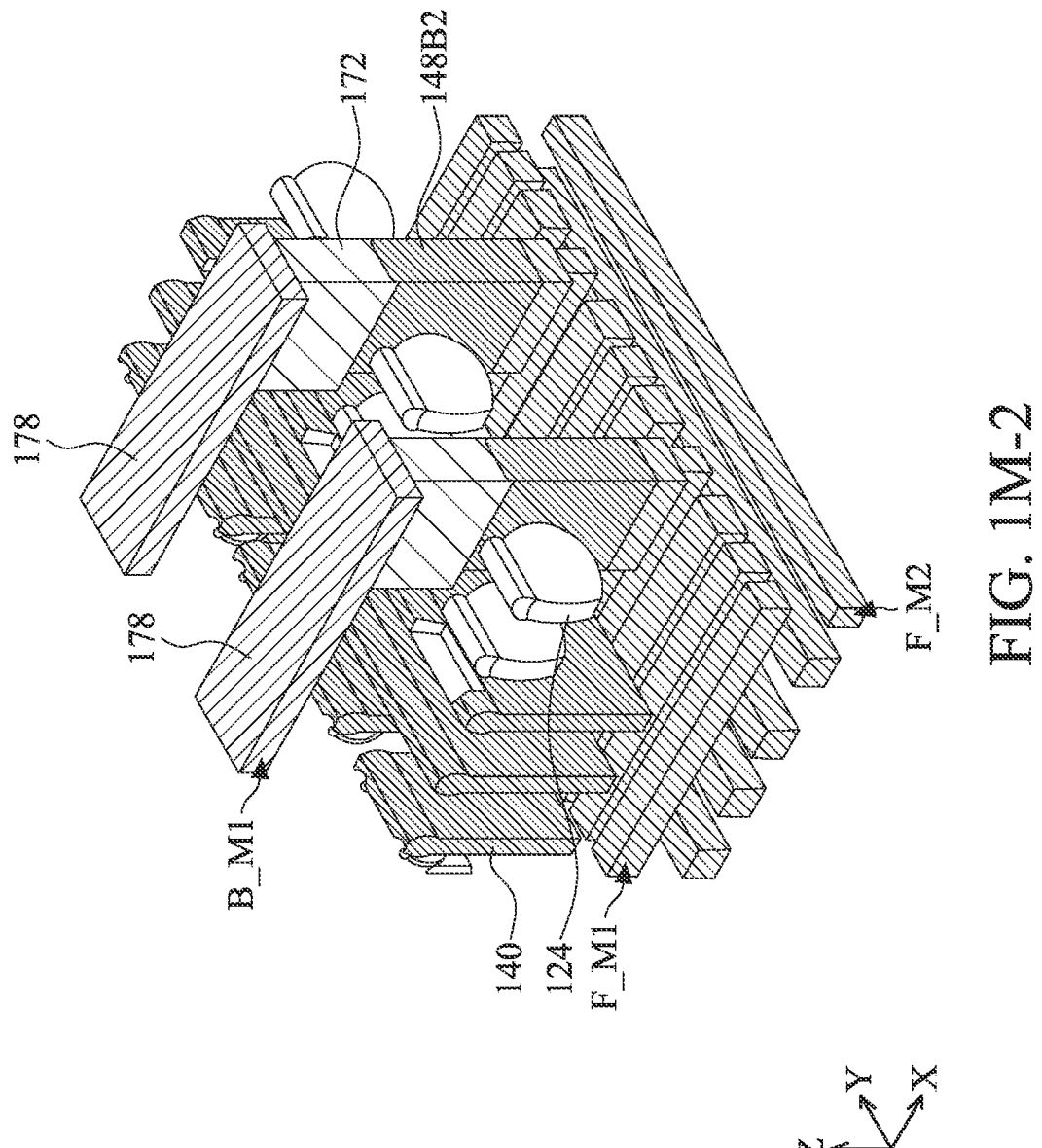
Figures 1, 1M, 2, 3:
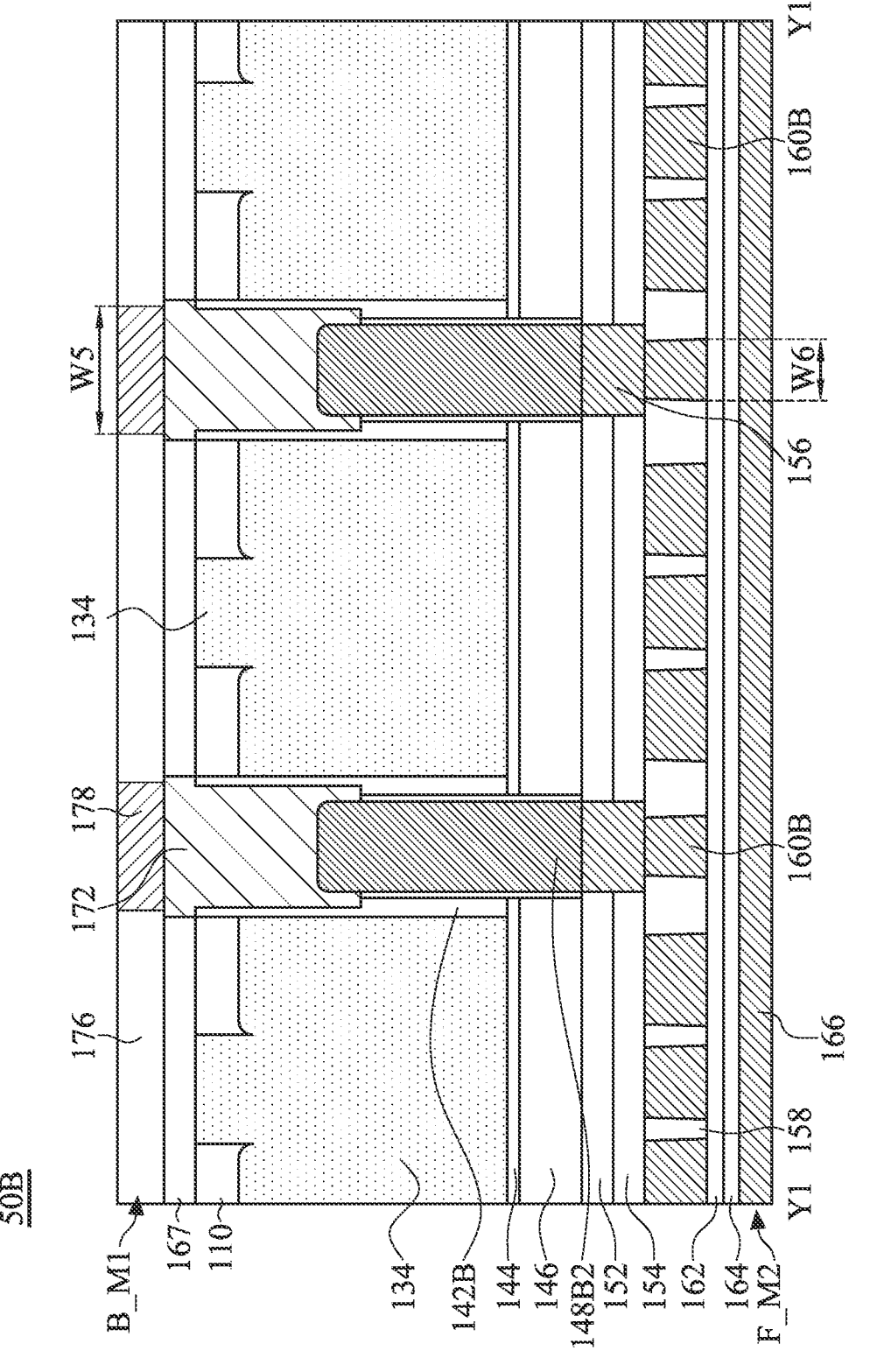
Figures 1, 1M, 2, 3, 4:
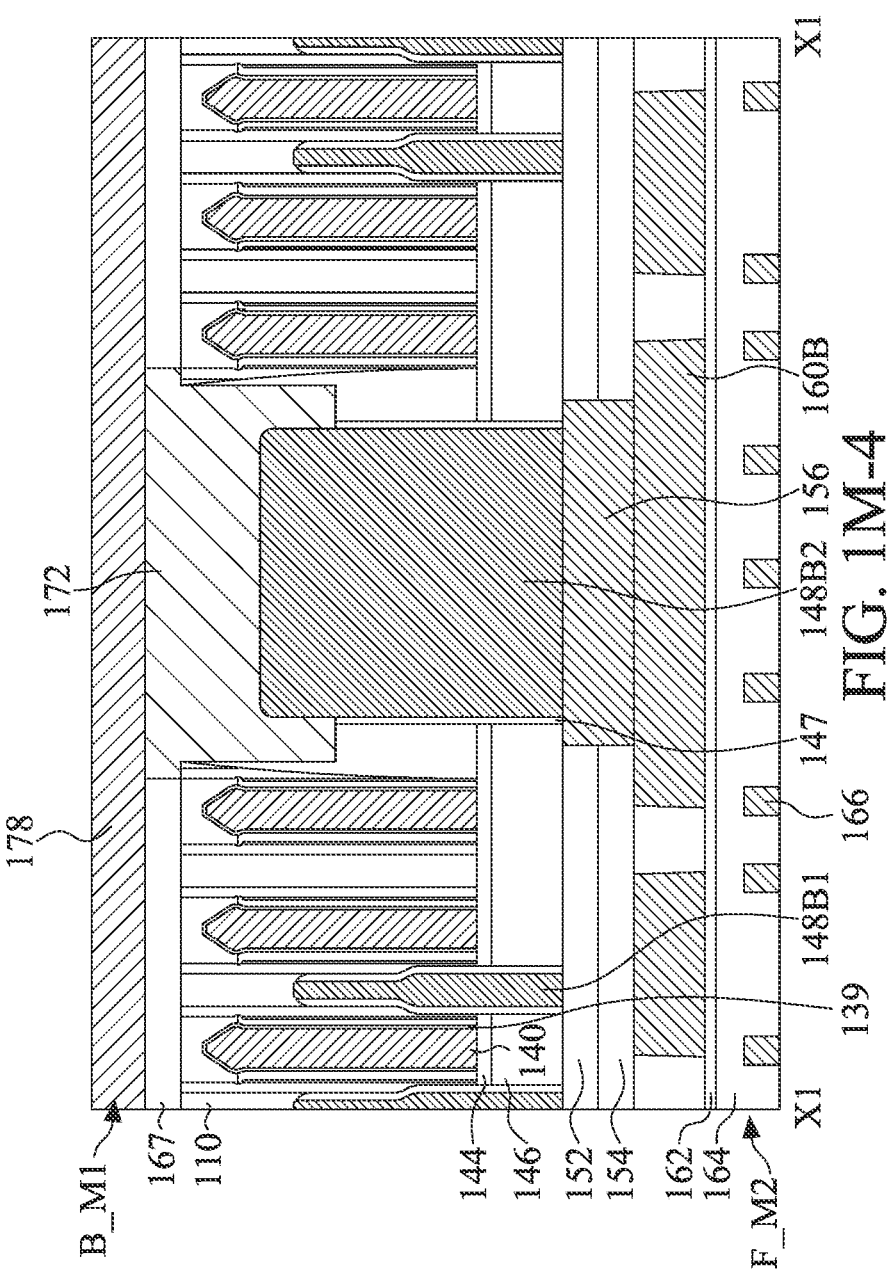
Figures 1, 1M, 2, 3, 4, 5:
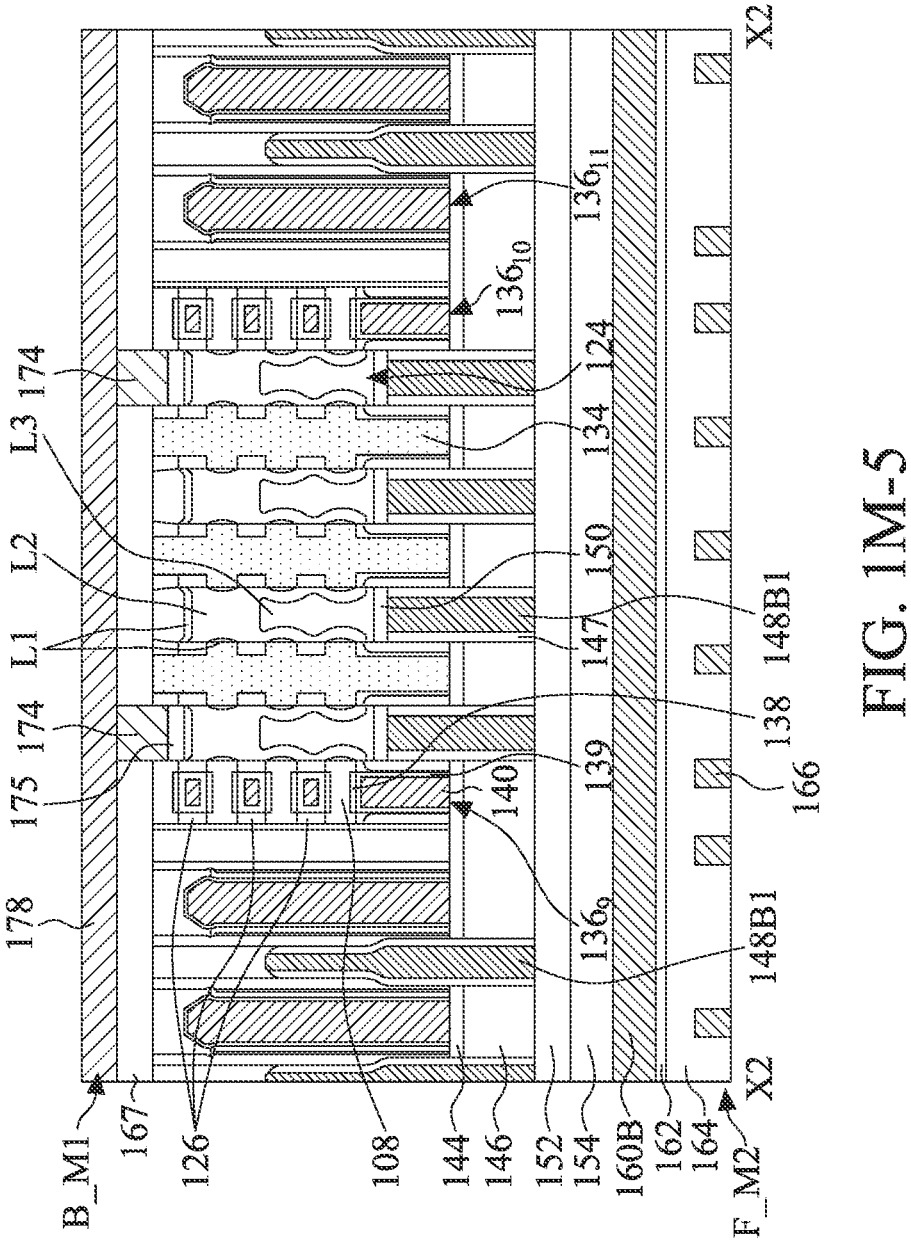

FIG. 1M is a plan view (backside layout) of a semiconductor structure 100 illustrating the formation of a backside first metal layer B_M1. FIGS. 1M-1 and 1M-2 are perspective view illustrating the power transmission cell regions CB1 and CB2. FIG. 1M-2 only shows the conductive components (e.g., the source/drain features 124, contact rails 148B2, the via rails 172, the frontside and backside metal layers, etc.) of the semiconductor structure 100. FIGS. 1M-3, 1M-4, 1M-5 and 1M-6 are cross-sectional views corresponding to line Y1-Y1, line X1-X1, line X2-X2 and line Y2-Y2 of FIG. 1M.

An intermetal dielectric layer 176 is formed over the backside of the semiconductor structure 100, as shown in FIGS. 1M-1, 1M-3 and 1M-6, in accordance with some embodiments. In some embodiments, the material and the formation of the intermetal dielectric layer 176 may be similar to or substantially the same as the intermetal dielectric layer 158.

Figures 1, 1M, 2, 3, 4, 5, 6:
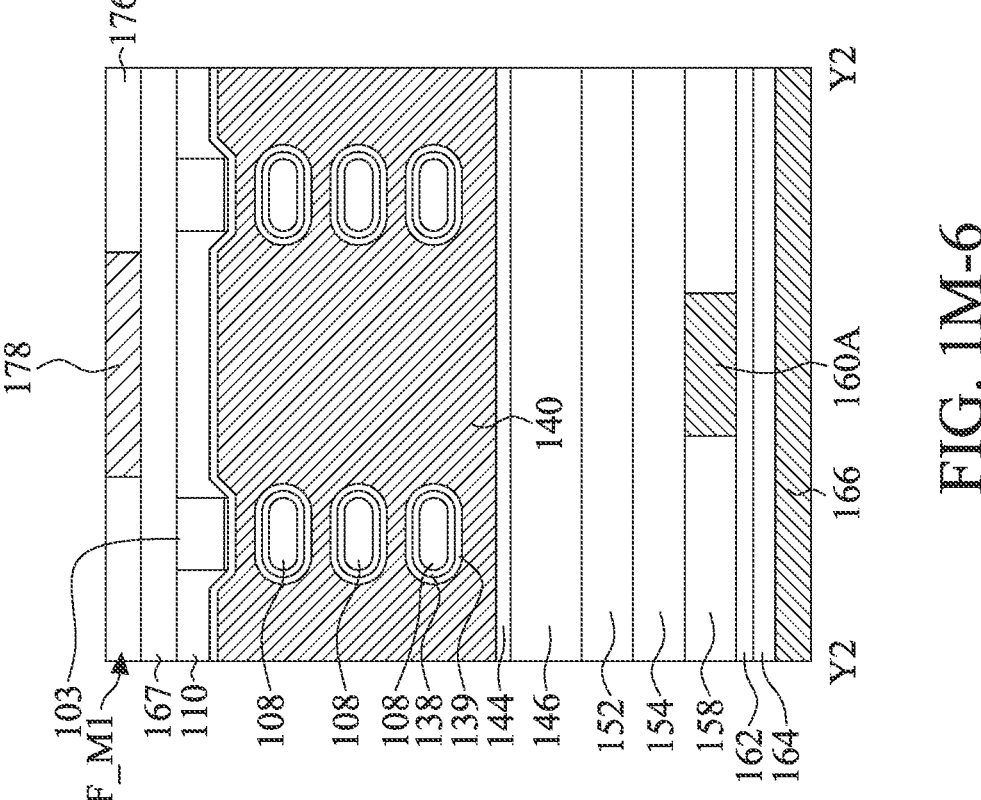
Figure 2:
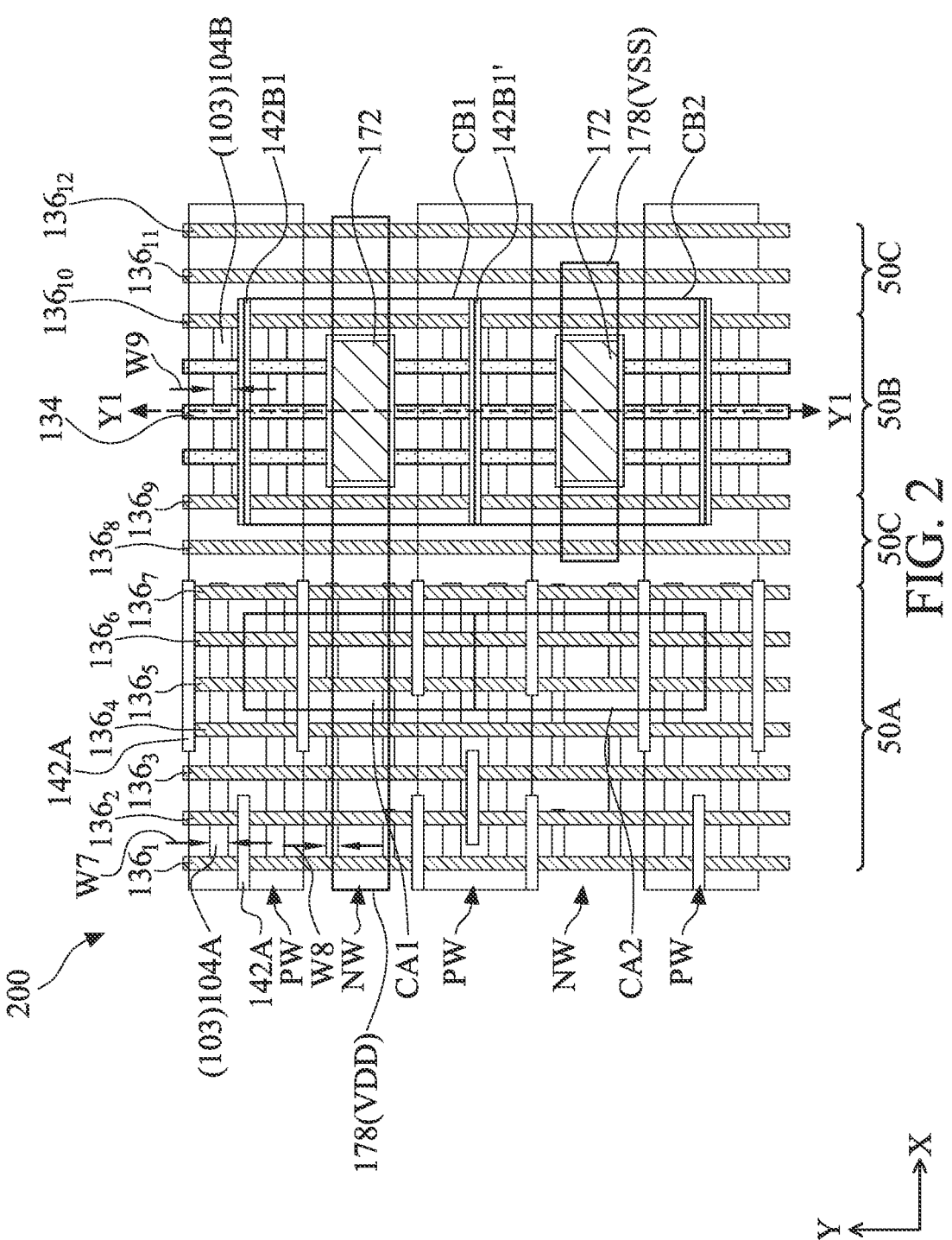
Figures 1, 2:
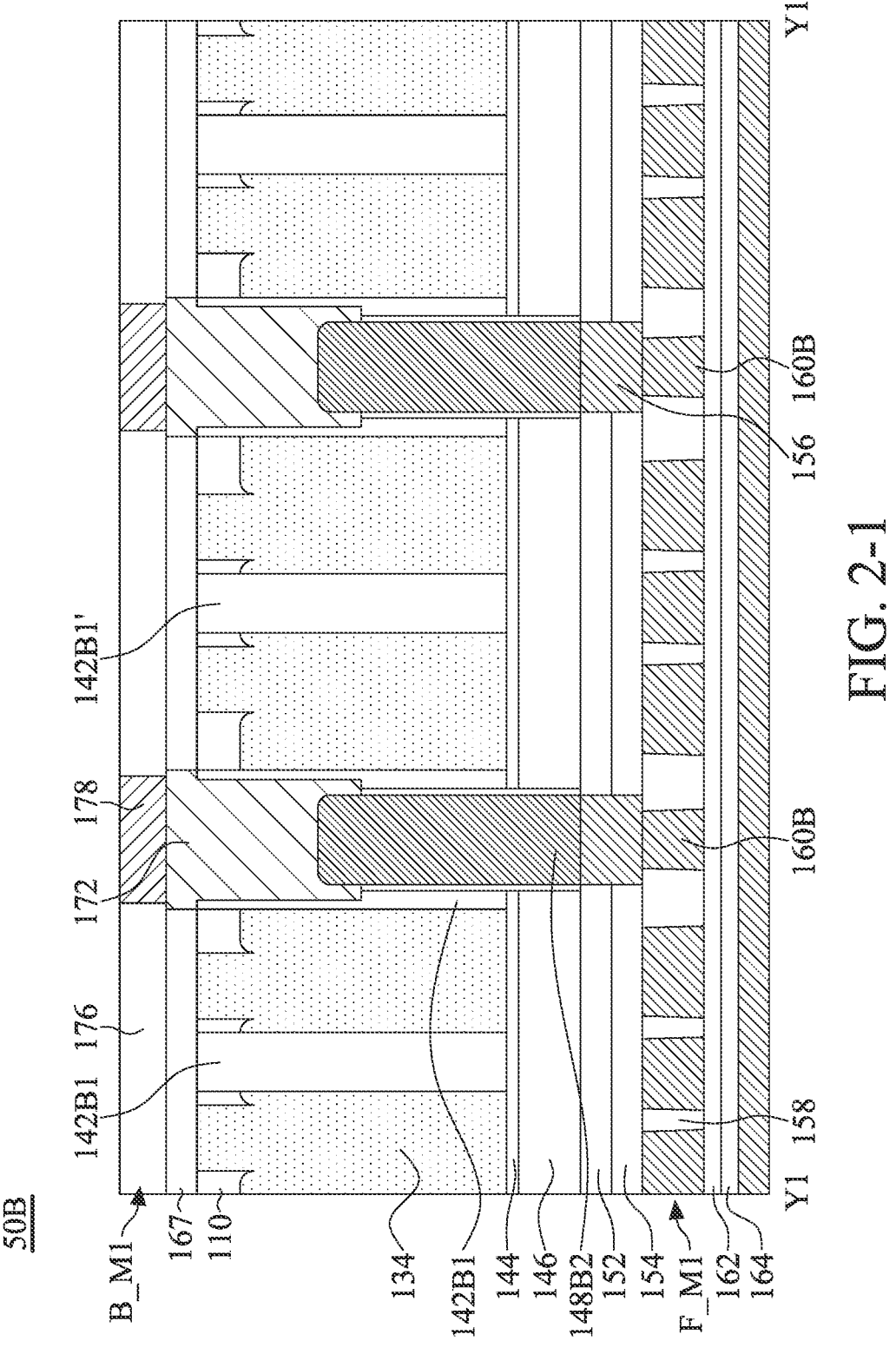
Figure 3:
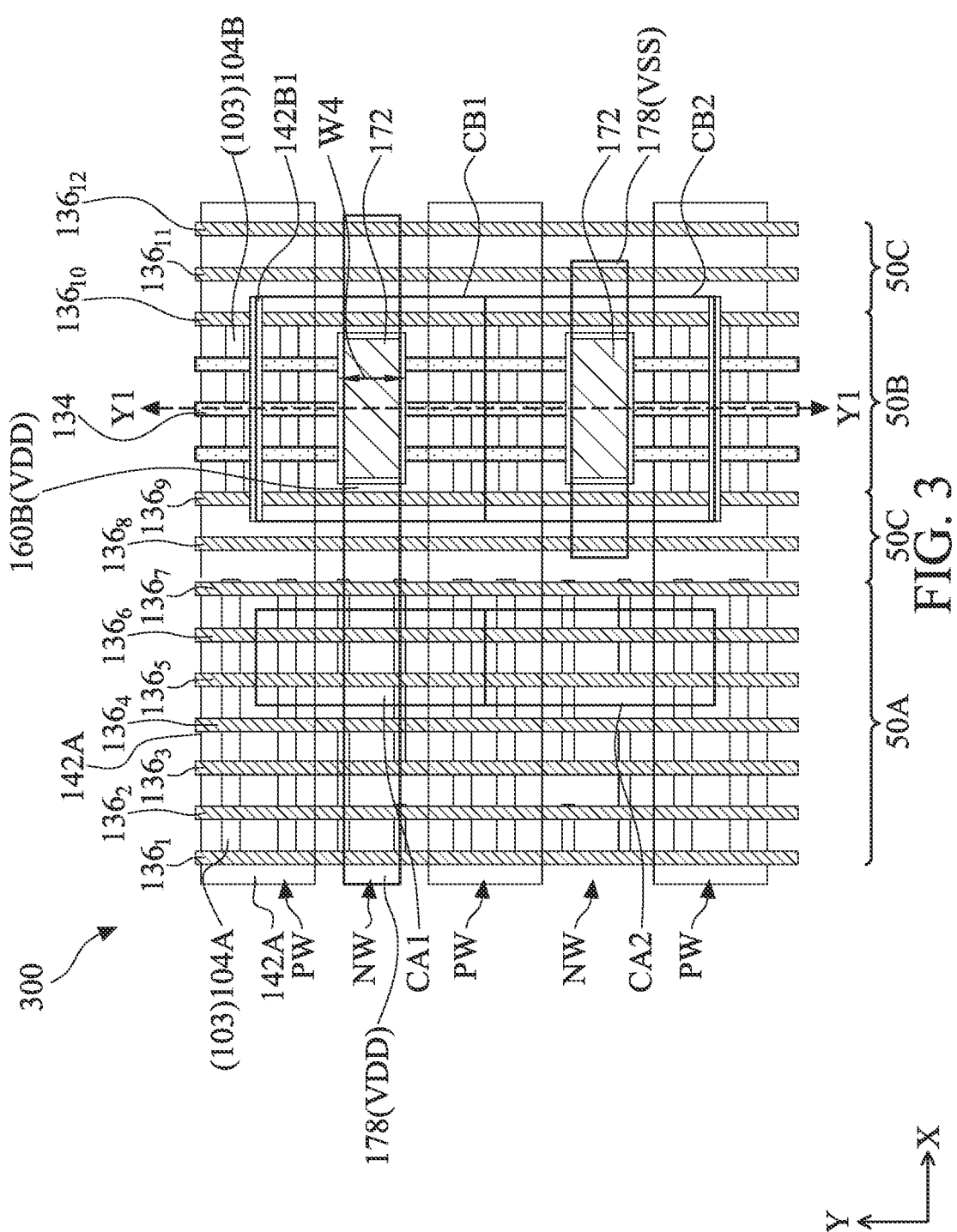
Figures 1, 3:
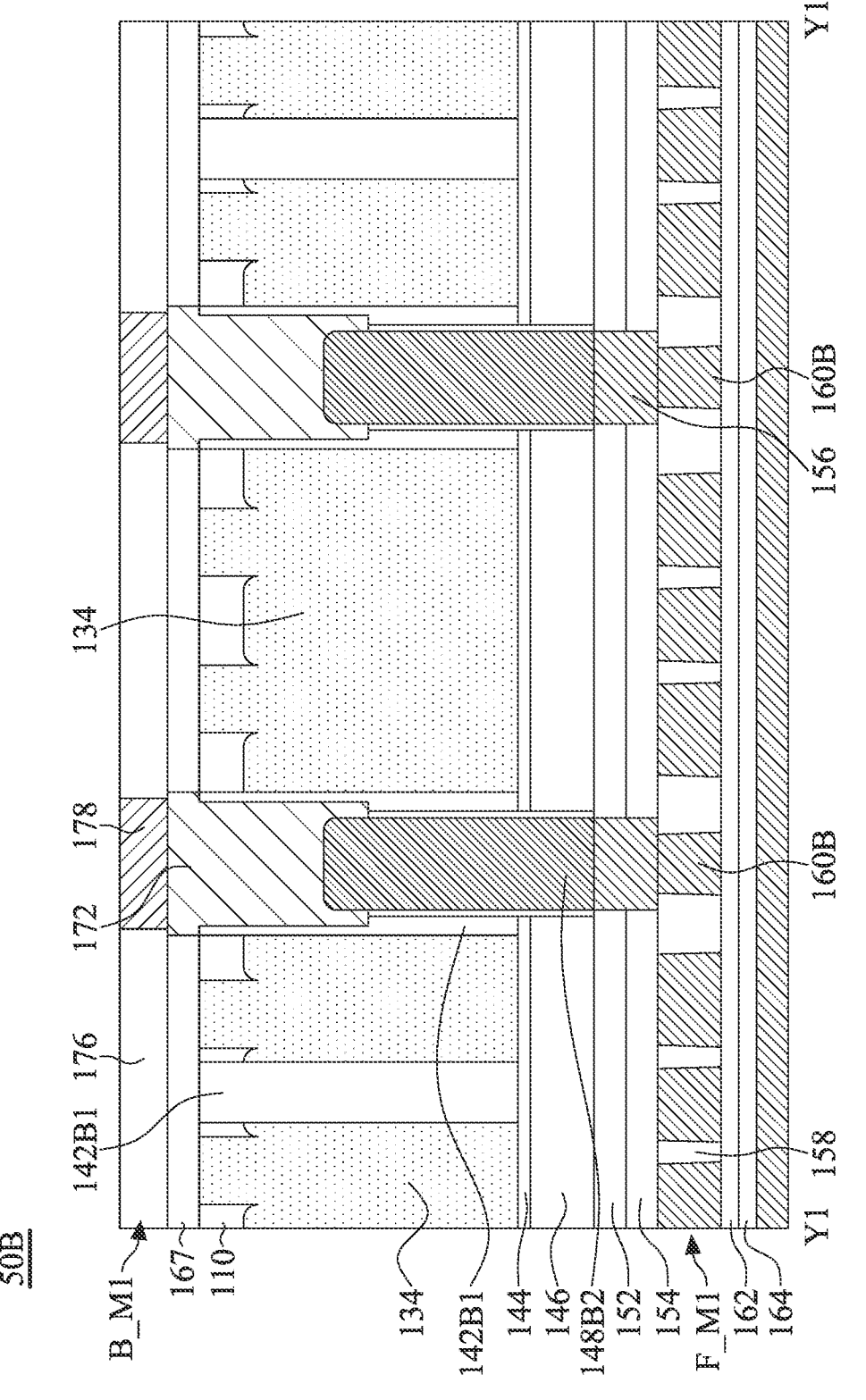
Figure 4:
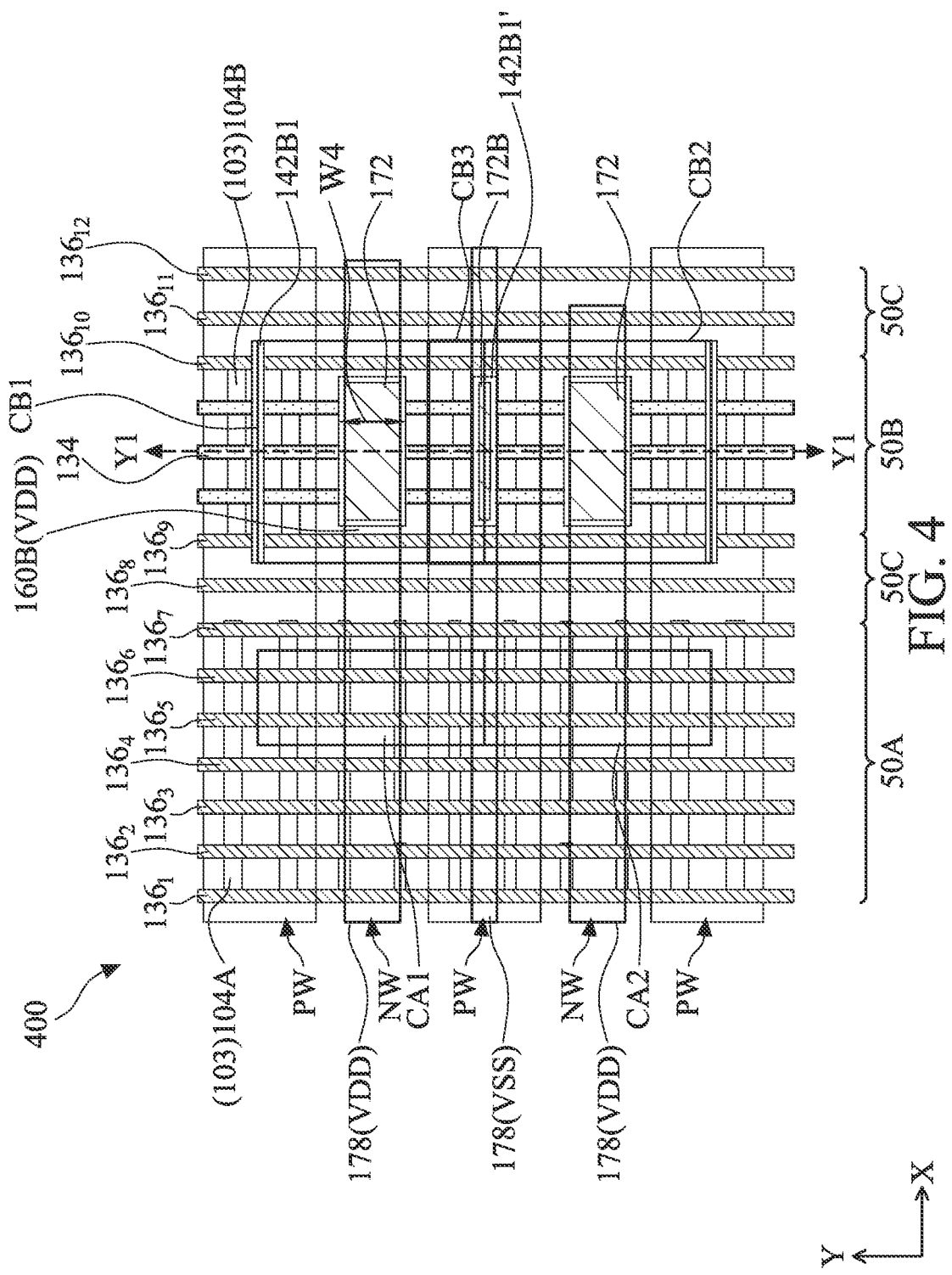
Figures 1, 4:
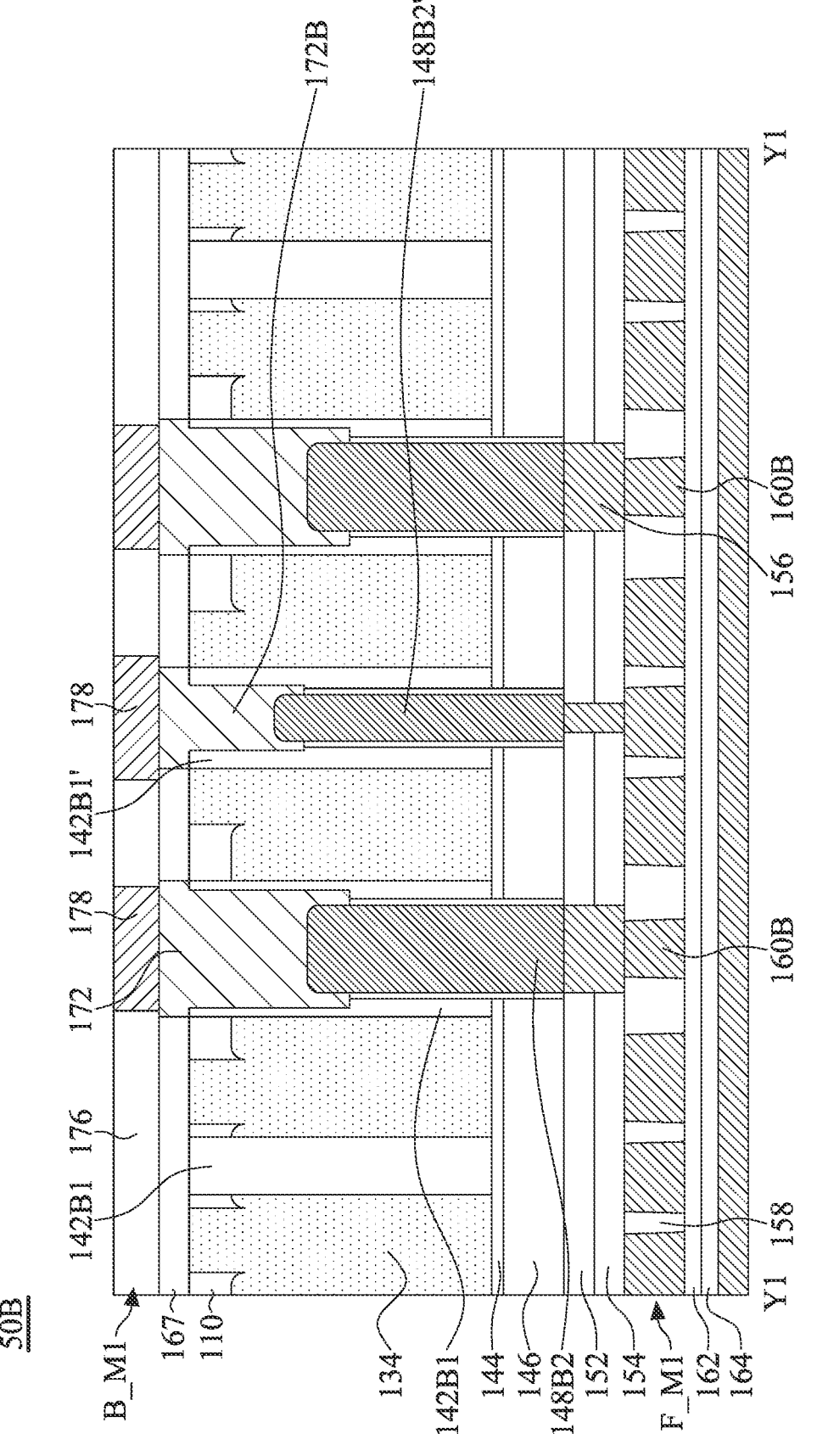
Figure 5:
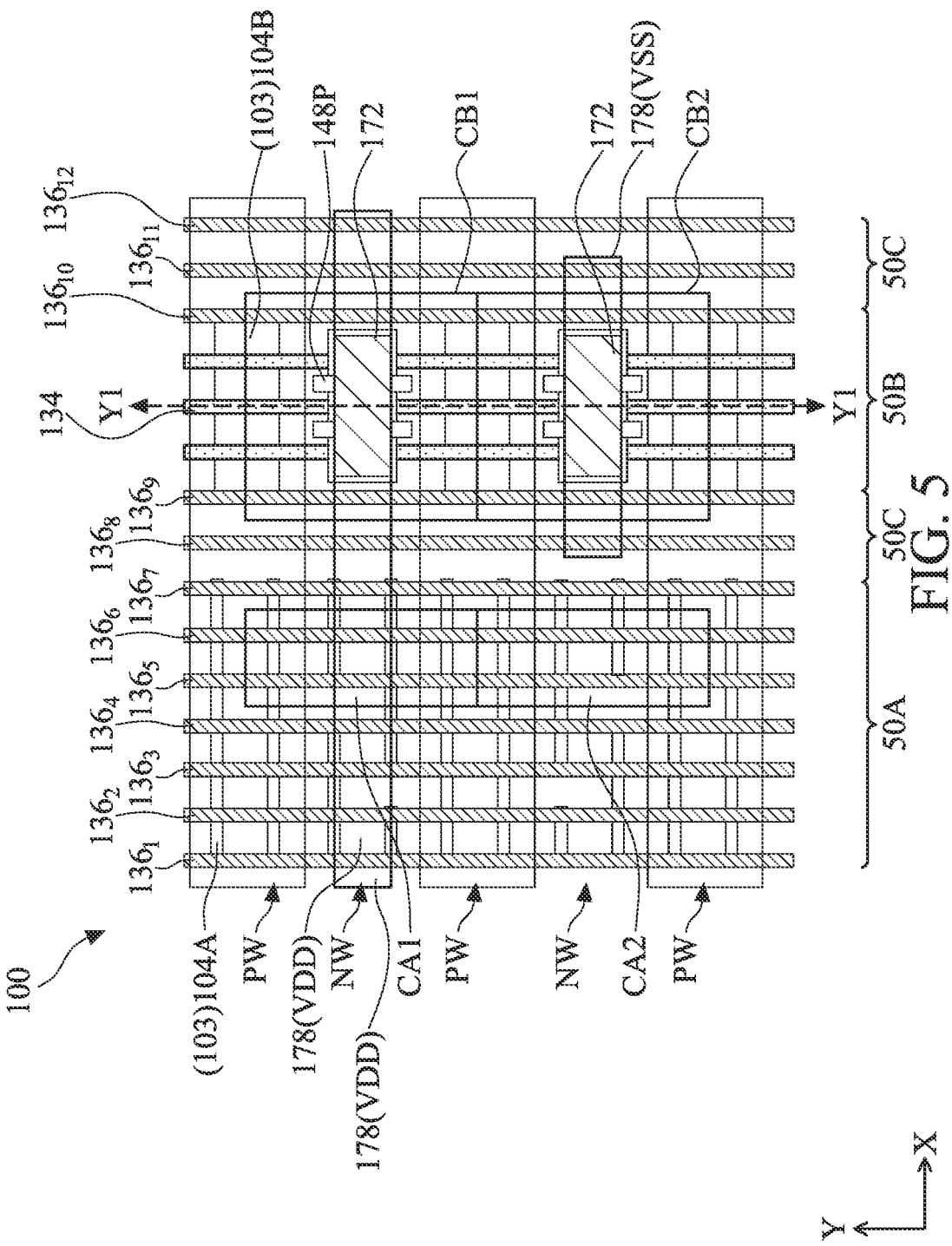
Figure 6:
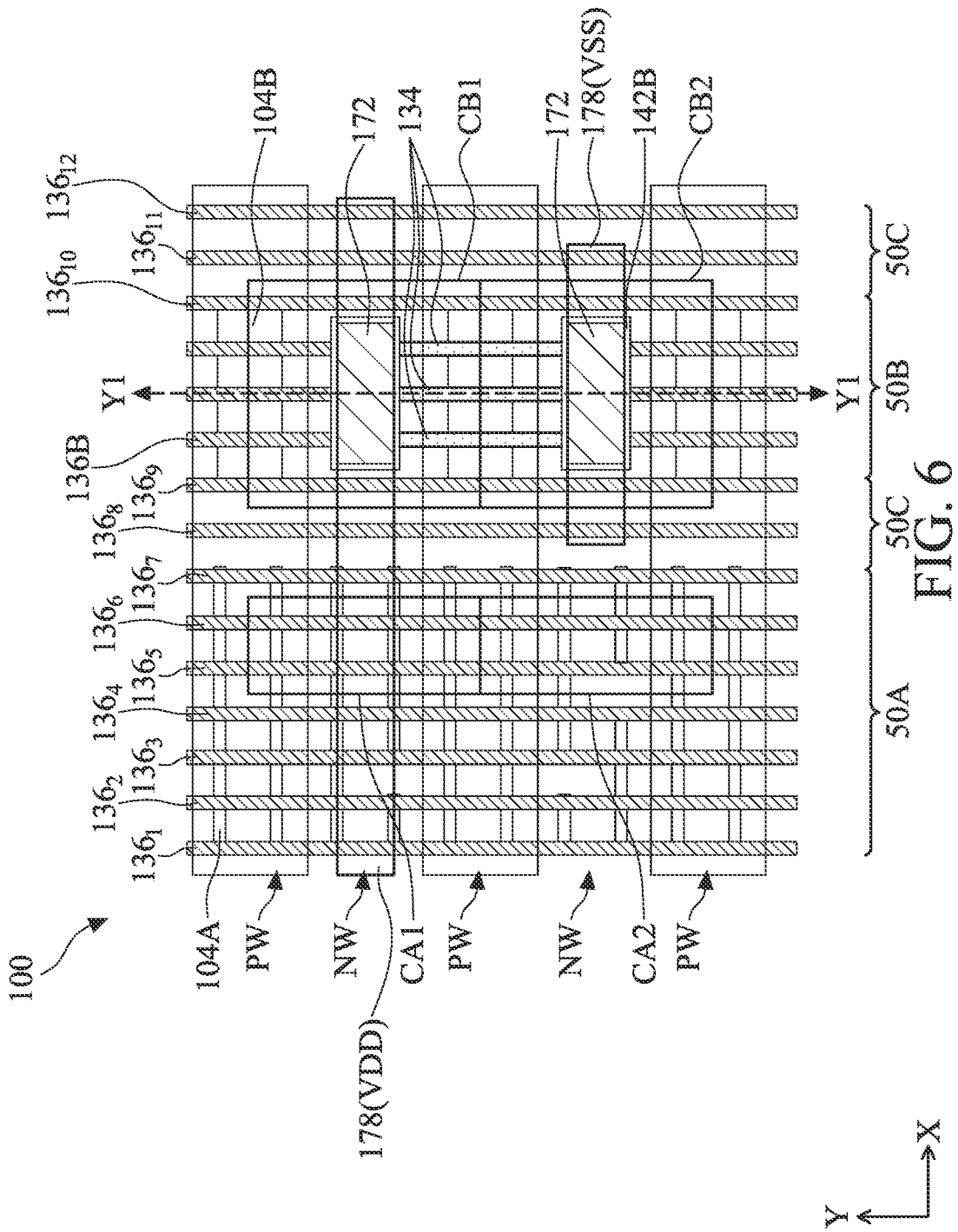
Figures 1, 6:
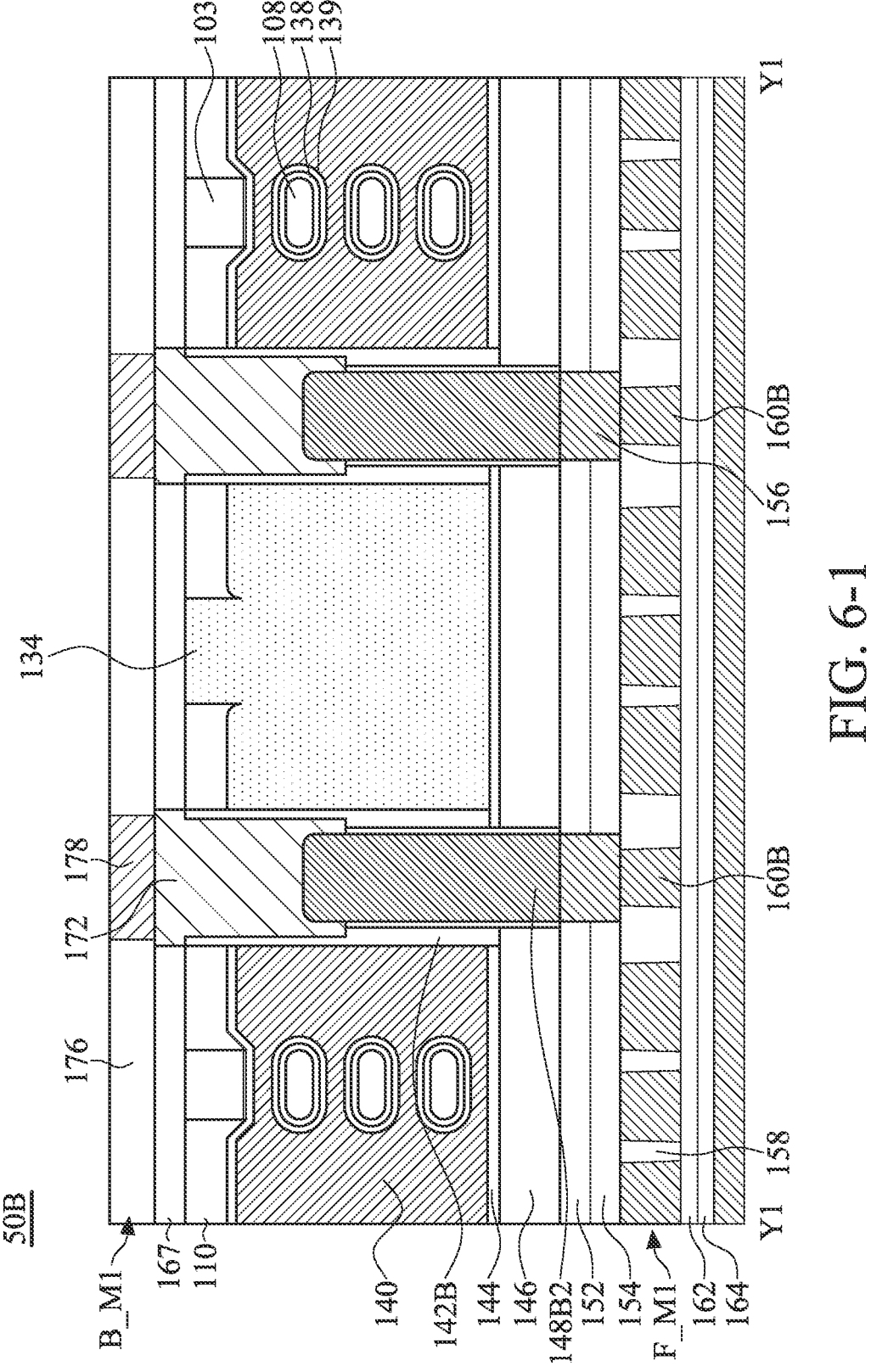

A backside first metal layer B_M1 is formed in and/or through the intermetal dielectric layer 176, as shown in FIGS. 1M to 1M-6, in accordance with some embodiments. The backside first metal layer B_M1 includes several lines (tracks) e.g., power supply lines 178, in accordance with some embodiments. The power supply lines 178 include a Vdd power rail providing positive voltage and a Vss power rail which may be an electrical ground, in accordance with some embodiments. The lines 178 of the backside first metal layer B_M1 extend in the X direction, in accordance with some embodiments. That is, the lines have longitudinal axes parallel to the X direction, in accordance with some embodiments. In some embodiments, the width W5 of the power supply lines 178 of the backside first metal layer B_M1 is greater than the width W6 of the power supply lines 160B of the frontside first metal layer F_M1 in the Y direction.

The backside Vss power rail is located in the second area 50B and overlaps the power transmission cell region CB2, in accordance with some embodiments. The backside Vss power rail is in direct contact with the via rail 172, in accordance with some embodiments. As a result, the backside Vss power rail 178 is electrically connected to the frontside Vss power rails 160B through the via rail 172 and the contact rail 148B2 of the power transmission cell region CB2, in accordance with some embodiments.

The backside Vdd power rail 178 extends through the first area 50A and the second area 50B and overlaps the functional cell region CA1 and the power transmission cell region CB1, in accordance with some embodiments. In some other embodiments, the backside Vdd power rail 178 may only extend in the second area 50B. The backside Vdd power rail is in direct contact with the via rail 172 (in the second area 50B) and the vias 174 (in the first area 50A). As a result, the backside Vdd power rail 178 is electrically connected to the frontside Vdd power rail 160B through the via rail 172 and the contact rail 148B2 of the power transmission cell region CB1, in accordance with some embodiments. In addition, the backside Vdd power rail 178 is electrically connected to the frontside Vdd power rail 160A overlapping the functional cell region CA1 through the Vdd node (e.g., source terminals) of the p-channel nanostructure transistors (in the n-type well NW), in accordance with some embodiments. As a result, the power rails can be disposed on the dual sides of the semiconductor structure 100, which may further reduce the total resistance of the metal layer, in accordance with some embodiments.

The semiconductor structure 100 may undergo further backside BEOL processes to form various interconnection conductive features (not shown) over backside of the semiconductor structure 100, such as backside second metal layer (B_M2) to backside eighth metal layer (B_M8), vias between neighboring two metal layers, passivation layers, bump pads, etc.

FIG. 2 is a plan view (backside layout) of a semiconductor structure 200, in accordance with some embodiments of the disclosure. FIG. 2-1 is a cross-sectional view of the semiconductor structure 200 of FIG. 2, in accordance with some embodiments of the disclosure. The embodiments of FIG. 2 are similar to the embodiments of FIGS. 1A to 1M-6, except that the semiconductor structure 200 is used to form high-current devices.

The semiconductor structure 200 is used to form high-current devices with large cell height, in accordance with some embodiments. In some embodiments, the ratio of the cell height of the functional cell region of the semiconductor structure 100 to the cell height of the functional cell region of the semiconductor structure 200 is in a range from about 0.5 to about 0.95. According to the design rule for patterning active regions, two active regions 104B are defined in one p-type well PW, and an isolation structure 110 is located on the boundary between the power transmission cell region CB1 and the power transmission cell region CB2. In some embodiments, the width W7 of the active region 104A in the p-type wells PW is greater than the width W8 of the active region 104A in the n-type wells NW, and substantially the same as the width W9 of the active region 104B.

The cutting features in the second area 50B includes cutting features 142B1 which are formed between the adjacent two active regions 104B in the p-type wells PW, in accordance with some embodiments. A cutting feature 142B1' is located on the boundary between the power transmission cell region CB1 and the power transmission cell region CB2, in accordance with some embodiments. The cutting feature 142B1' may further reduce the risk of leakage between the power transmission cell regions CB1 and CB2, in accordance with some embodiments.

FIG. 3 is a plan view (backside layout) of a semiconductor structure 300, in accordance with some embodiments of the disclosure. FIG. 3-1 is a cross-sectional view of the semiconductor structure 300 of FIG. 3, in accordance with some embodiments of the disclosure. The embodiments of FIG. 3 are similar to the embodiments of FIGS. 2 and 2-1, except that no cutting feature 142B1' is formed on the boundary between the power transmission cell region CB1 and the power transmission cell region CB2.

FIG. 4 is a plan view (backside layout) of a semiconductor structure 400, in accordance with some embodiments of the disclosure. FIG. 4-1 is a cross-sectional view of the semiconductor structure 400 of FIG. 4, in accordance with some embodiments of the disclosure. The embodiments of FIG. 4 are similar to the embodiments of FIGS. 2 and 2-1, except that additional power transmission cell region CB3 is formed between the power transmission cell region CB1 and the power transmission cell region CB2.

A contact rail 148B2' and a via rail 172B are formed in the cutting feature 142B1', in accordance with some embodiments. In some embodiments, a power transmission cell region CB3 is arranged between the power transmission cell regions CB1 and CB2 in the second area 50B, and include electric connection structures constituted of the via rail 172B and the contact rails 148B2'. Similarly, the power transmission cell region CB3 is configured to transfer the power from the backside metal layers to the frontside metal lines, and does not have functional transistors therein, in accordance with some embodiments.

The backside Vdd power rails 178 extend through the first area 50A and the second area 50B and overlap the functional cell regions CA1 and CA2 and the power transmission cell regions CB1 and CB2, in accordance with some embodiments. The backside Vdd power rails are electrically connected to frontside Vdd power rails through the Vdd node (e.g., source terminals) of the p-channel nanostructure transistors (in the n-type wells NW).

The backside Vss power rail 178 extends through the first area 50A and the second area 50B and overlaps the power transmission cell region CB3 and the boundary between functional cell regions CA1 and CA2, in accordance with some embodiments. The backside Vss power rail is electrically connected to the frontside Vss power rail through the Vss node (e.g., source terminals) of the n-channel nanostructure transistors (in the p-type well PW). In some embodiments, the backside Vss power rail 178 is thinner than the backside Vdd power rail 178 in the Y direction. Adding additional power rail on the backside of the semiconductor structure may further reduce the overall resistance of the BEOL metal layers.

FIG. 5 is a plan view of a semiconductor structure 500, in accordance with some embodiments of the disclosure. The embodiments of FIG. 5 are similar to the embodiments of FIGS. 1A to 1M-6, except that the contact rails 148B2 may include portions extending in the Y direction. The contact rails 148B2 include protruding portions 148P which extend between the insulating strips 134 in the Y direction, in accordance with some embodiments. The protruding portions 148P extend beyond the edges of the cutting features 142B, in accordance with some embodiments. As a result, the contact rails 148B2 have greater larger cross-sectional areas, which may further reduce the overall resistance of the BEOL metal layers.

FIG. 6 is a plan view of a semiconductor structure 600, in accordance with some embodiments of the disclosure. FIG. 6-1 is a cross-sectional view of the semiconductor structure 600 of FIG. 6, in accordance with some embodiments of the disclosure. The embodiments of FIG. 6 are similar to the embodiments of FIGS. 1A and 1M-6, except that portions of the dummy gate structures 11210, 11211 and 11212 between and overlying the via rails 172 of the power transmission cell regions CB1 and CB2 are replaced with the insulating strips 134. The other portions of the dummy gate structures 11210, 11211 and 11212 are replaced with final gate stacks 136 (e.g., 136B), in accordance with some embodiments.

Figure 7:
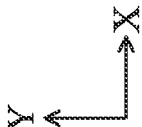
FIG. 7 is a plan view (layout) of a semiconductor structure, in accordance with some embodiments of the disclosure.
Figures 1, 7:
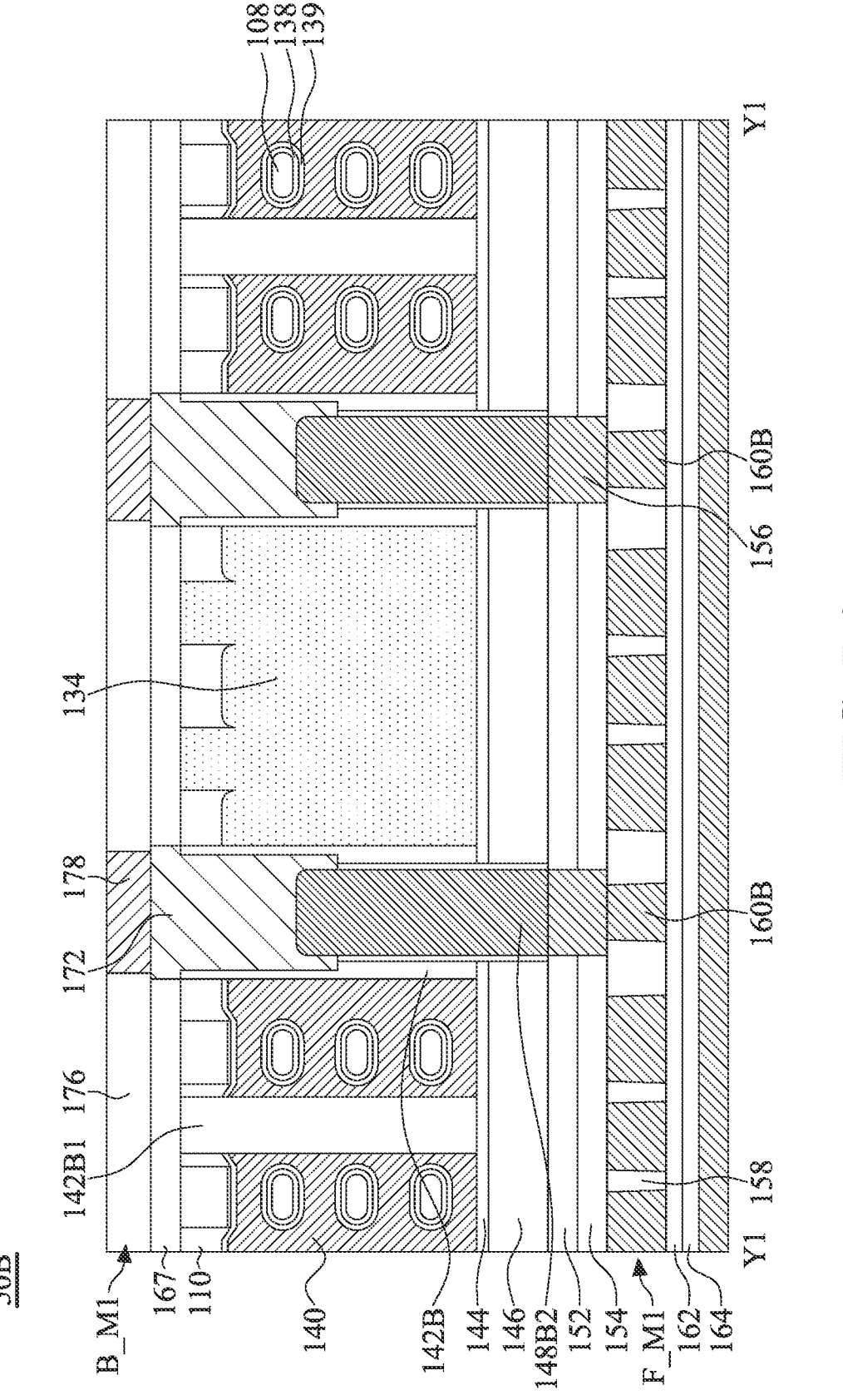

FIG. 7 is a plan view of a semiconductor structure 700, in accordance with some embodiments of the disclosure. FIG. 7-1 is a cross-sectional view of the semiconductor structure 700 of FIG. 7, in accordance with some embodiments of the disclosure. The embodiments of FIG. 7 are similar to the embodiments of FIGS. 2 and 2-1, except that portions of the dummy gate structures 11210, 11211 and 11212 between and overlying the via rails 172 of the power transmission cell regions CB1 and CB2 are replaced with the insulating strips 134. The other portions of the dummy gate structures 11210, 11211 and 11212 are replaced with final gate stacks 136 (e.g., 136B), in accordance with some embodiments.

As described above, the aspect of the present disclosure is directed to a semiconductor structure with a backside power rail architecture. The semiconductor structure 100 includes power transmission cell regions CB1 and CB2. Each of the power transmission cell regions CB1 and CB2 includes a contact rail 148B2 electrically connected to a frontside power rail and a via rail 172 electrically connected to a backside power rail, thereby transferring the power from the backside of the semiconductor structure 100 to the frontside of the semiconductor structure 100. The semiconductor structure 100 includes insulating strips 134 between the power transmission cell regions CB1 and CB2. Because dummy gate structures 112 are replaced with the insulating strips 134, there is no leakage path between the power transmission cell regions CB1 and CB2. Therefore, the reliability and the manufacturing yield of the resulting semiconductor device may improve.

Embodiments of a semiconductor structure and a method for forming the semiconductor structure with power transmission cells are provided. The method may include replacing the dummy gate structure with an insulating strip, forming cutting features through the insulating strip and the isolation structure, and forming electrical connection structures in the cutting features to form the power transmission cells. As a result, the risk of leakage between the power transmission cell regions may reduce. Therefore, the reliability and the manufacturing yield of the resulting semiconductor device may improve.

In some embodiments, a method for forming a semiconductor structure is provided. The method includes forming an isolation structure surrounding a first active region, forming a first dummy gate structure across the first active region and the isolation structure, replacing at least a portion of the first dummy gate structure with an insulating strip, forming a first cutting feature through the insulating strip and the isolation structure, forming a first contact rail in the first cutting feature, forming a first via rail in the first cutting feature and overlapping the first contact rail, and forming a first metal line overlapping the first via rail.

In some embodiments, a method for forming a semiconductor structure is provided. The method includes forming a plurality of active regions over a substrate, and forming a plurality of insulating strips across the plurality of active regions. The plurality of insulating strips vertically extends through the active regions and into the substrate. The method also includes forming a first contact rail between a first active region and a second active region in the plurality of active regions and forming a second contact rail between the second active region and a third active region in the plurality of active regions. The method also includes forming a first via rail and a second via rail on the first contact rail and the second contact rail, respectively.

In some embodiments, a semiconductor structure is provided. The semiconductor structure includes a functional cell region including an n-type functional transistor and a p-type functional transistor. The semiconductor structure also includes a first power transmission cell region including a first cutting feature and a first contact rail in the first cutting feature. The semiconductor structure also includes a first power rail electrically connected to a source terminal of the p-type functional transistor and the first contact rail of the first power transmission cell region. The semiconductor structure also includes a second power transmission cell region adjacent to the first power transmission cell and including a second cutting feature and second contact rail in the second cutting feature. The semiconductor structure also includes an insulating strip extending from the first cutting feature to the second cutting feature in a first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming an isolation structure surrounding a first active region;

forming a first dummy gate structure across the first active region and the isolation structure;

replacing at least a portion of the first dummy gate structure with an insulating strip;

forming a first cutting feature through the insulating strip and the isolation structure;

forming a first contact rail in the first cutting feature;

forming a first via rail in the first cutting feature and overlapping the first contact rail; and forming a first metal line overlapping the first via rail.

2. The method for forming the semiconductor structure as claimed in claim 1, further comprising:

forming a second cutting feature through the insulating strip and the isolation structure, wherein the first active region is located between the first cutting feature and the second cutting feature, and the insulating strip continuously extends from the first cutting feature to the second cutting feature.

3. The method for forming the semiconductor structure as claimed in claim 2, further comprising:

forming a second contact rail in the second cutting feature;

forming a second via rail in the second cutting feature and overlapping the second contact rail; and forming a second metal line overlapping the second via rail.

4. The method for forming the semiconductor structure as claimed in claim 1, further comprising, after forming the first contact rail in the first cutting feature and before forming the first via rail in the first cutting feature and overlapping the first contact rail:

polishing the first active region and the isolation structure to expose a surface of the first cutting feature from backside.

5. The method for forming the semiconductor structure as claimed in claim 1, further comprising:

forming a second metal line over the first contact rail and electrically connected to the first metal line, wherein the first contact rail and the first via rail are vertically sandwiched between the first metal line and the second metal line.

6. The method for forming the semiconductor structure as claimed in claim 1, wherein replacing at least the portion of the first dummy gate structure with the insulating strip comprises:

etching the first dummy gate structure, the first active region and the isolation structure to form a trench; and forming a dielectric material in the trench.

7. The method for forming the semiconductor structure as claimed in claim 1, wherein forming the first via rail in the first cutting feature and overlapping the first contact rail comprises:

etching the first cutting feature to form a trench exposing a surface of the first contact rail; and filling the trench with a conductive material.

8. The method for forming the semiconductor structure as claimed in claim 1, further comprising:

forming a second dummy gate structure across the first active region and the isolation structure; and replacing the second dummy gate structure with a gate stack, wherein the gate stack includes a gate dielectric layer over the first active region and a metal gate electrode layer over the gate dielectric layer.

9. The method for forming the semiconductor structure as claimed in claim 1, further comprising:

forming the isolation structure surrounding a second active region;

forming a source/drain feature over the second active region, wherein the first metal line is electrically connected to the source/drain feature; and forming a gate stack across the second active region and the isolation structure.

10. The method for forming the semiconductor structure as claimed in claim 9, wherein the second active region is narrower than the first active region.

11. A method for forming a semiconductor structure, comprising:

forming a plurality of active regions over a substrate;

forming a plurality of insulating strips across the plurality of active regions, wherein the plurality of insulating strips vertically extend through the active regions and into the substrate;

forming a first contact rail between a first active region and a second active region in the plurality of active regions and forming a second contact rail between the second active region and a third active region in the plurality of active regions; and

forming a first via rail and a second via rail on the first contact rail and the second contact rail, respectively.

12. The method for forming the semiconductor structure as claimed in claim 11, further comprising:

forming a cutting feature between the second active region and a fourth active region in the plurality of active regions, wherein the first active region is formed in a first p-type well, and the second active region and the fourth active region are formed in a second p-type well, and the third active region is formed in a third p-type well between the first p-type well and the second p-type well.

13. The method for forming the semiconductor structure as claimed in claim 12, further comprising:

forming a third via rail in the cutting feature;

forming a first Vdd power rail on the first via rail;

forming a second Vdd power rail on the second via rail; and forming a Vss power rail on the third via rail.

14. The method for forming the semiconductor structure as claimed in claim 11, further comprising:

forming a stack of alternating first semiconductor layers and second semiconductor layers over the substrate;

patterning the stack and a portion of the substrate to form the plurality of active regions;

removing the first semiconductor layers to form a plurality of nanostructures from the second semiconductor layers; and forming a gate stack surrounding the plurality of nanostructures.

15. A method for forming a semiconductor structure, comprising:

forming an isolation structure surrounding each of a first active region and a second active region and isolating the second active region from the first active region, the second active region being narrower than the first active region;

forming a first dummy gate structure across the first active region and the isolation structure;

etching the first dummy gate structure, the first active region and the isolation structure to form a trench; and forming a dielectric material in the trench to form an insulating strip;

forming a first cutting feature through the insulating strip and the isolation structure;

forming a first contact rail in the first cutting feature;

forming a first via rail in the first cutting feature and overlapping the first contact rail; and forming a first metal line overlapping the first via rail.

16. The method for forming the semiconductor structure as claimed in claim 15, further comprising:

forming a second dummy gate structure across the first active region and the isolation structure;

replacing the second dummy gate structure with a gate stack, wherein the gate stack includes a gate dielectric layer over the first active region and a metal gate electrode layer over the gate dielectric layer; and forming a second cutting feature through the insulating strip and the isolation structure, wherein the first active region is located between the first cutting feature and the second cutting feature, and the insulating strip continuously extends from the first cutting feature to the second cutting feature.

17. The method for forming the semiconductor structure as claimed in claim 16, further comprising:

forming a second contact rail in the second cutting feature;

forming a second via rail in the second cutting feature and overlapping the second contact rail; and forming a second metal line overlapping the second via rail.

18. The method for forming the semiconductor structure as claimed in claim 15, further comprising, after forming the first contact rail in the first cutting feature and before forming the first via rail in the first cutting feature and overlapping the first contact rail:

polishing the first active region and the isolation structure to expose a surface of the first cutting feature from backside.

19. The method for forming the semiconductor structure as claimed in claim 15, further comprising:

forming a second metal line over the first contact rail and electrically connected to the first metal line, wherein the first contact rail and the first via rail are vertically sandwiched between the first metal line and the second metal line.

20. The method for forming the semiconductor structure as claimed in claim 15, wherein forming the first via rail in the first cutting feature and overlapping the first contact rail comprises:

etching the first cutting feature to form a trench exposing a surface of the first contact rail; and filling the trench with a conductive material.

\* \* \* \* \*